(12) United States Patent
Yamazaki et al.

(10) Patent No.: US 11,849,584 B2
(45) Date of Patent: Dec. 19, 2023

(54) SEMICONDUCTOR DEVICE, MANUFACTURING METHOD OF SEMICONDUCTOR DEVICE, AND OPERATION METHOD OF SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Tatsuya Onuki, Kanagawa (JP); Takanori Matsuzaki, Kanagawa (JP); Kiyoshi Kato, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 124 days.

(21) Appl. No.: 17/422,883

(22) PCT Filed: Nov. 20, 2019

(86) PCT No.: PCT/IB2019/059962
§ 371 (c)(1),
(2) Date: Jul. 14, 2021

(87) PCT Pub. No.: WO2020/152523
PCT Pub. Date: Jul. 30, 2020

(65) Prior Publication Data
US 2022/0068967 A1 Mar. 3, 2022

(30) Foreign Application Priority Data

Jan. 25, 2019 (JP) ................................ 2019-011605
Jan. 29, 2019 (JP) ................................ 2019-013347

(51) Int. Cl.
*G11C 16/10* (2006.01)
*H10B 43/27* (2023.01)
(Continued)

(52) U.S. Cl.
CPC ......... *H10B 43/27* (2023.02); *G11C 16/0483* (2013.01); *G11C 16/10* (2013.01);
(Continued)

(58) Field of Classification Search
CPC ............................... H10B 43/27; G11C 16/10
See application file for complete search history.

(56) References Cited

U.S. PATENT DOCUMENTS 7,187,587 B2 * 3/2007 Forbes .................... G11C 8/10
257/17
8,737,109 B2 5/2014 Yamazaki et al.
(Continued)

FOREIGN PATENT DOCUMENTS

CN 103081092 A 5/2013
JP 2012-069932 A 4/2012
(Continued)

OTHER PUBLICATIONS

International Search Report (Application No. PCT/IB2019/059962) dated Mar. 3, 2020.
(Continued)

*Primary Examiner* — Jason Lappas
(74) *Attorney, Agent, or Firm* — NIXON PEABODY LLP; Jeffrey L. Costellia

(57) ABSTRACT

A semiconductor device having a large storage capacity per unit area is provided. The semiconductor device includes a stack, and the stack includes a first insulator, a first conductor over the first insulator, and a second insulator over the first conductor. The stack includes a first opening provided in the first insulator, the first conductor, and the second insulator and an oxide on the inner side of the first opening. Furthermore, in the first opening, a third insulator is positioned on the outer side of the oxide, a second conductor is positioned on the inner side of the oxide, and a fourth
(Continued)

insulator is positioned between the oxide and the second conductor. The third insulator includes a gate insulating layer positioned at a side surface of the first opening, a tunnel insulating layer positioned on the outer side of the oxide, and a charge accumulation layer positioned between the gate insulating layer and the tunnel insulating layer.

26 Claims, 42 Drawing Sheets

(51) Int. Cl.
   *G11C 16/04*        (2006.01)
   *G11C 16/14*        (2006.01)
   *G11C 16/26*        (2006.01)
   *H01L 21/02*        (2006.01)
   *H01L 29/24*        (2006.01)
   *H10B 43/40*        (2023.01)

(52) U.S. Cl.
   CPC .............. *G11C 16/14* (2013.01); *G11C 16/26* (2013.01); *H01L 21/02565* (2013.01); *H01L 29/24* (2013.01); *H10B 43/40* (2023.02)

(56) References Cited

U.S. PATENT DOCUMENTS

| | | | |
|---|---|---|---|
| 8,901,557 | B2 | 12/2014 | Yamazaki |
| 9,177,872 | B2 | 11/2015 | Sandhu |
| 9,449,706 | B2 | 9/2016 | Yamazaki et al. |
| 9,490,369 | B2 | 11/2016 | Yamazaki |
| 9,634,097 | B2 | 4/2017 | Rabkin et al. |
| 9,847,430 | B2 | 12/2017 | Yamazaki |
| 9,887,010 | B2 | 2/2018 | Asami |
| 10,297,322 | B2 | 5/2019 | Yamazaki et al. |
| 10,483,406 | B2 | 11/2019 | Yamazaki |
| 10,593,693 | B2 | 3/2020 | Yamazaki et al. |
| 10,665,604 | B2 | 5/2020 | Kimura et al. |
| 11,011,542 | B2 | 5/2021 | Yamazaki et al. |
| 2011/0065270 | A1 | 3/2011 | Shim et al. |
| 2012/0051118 | A1 | 3/2012 | Yamazaki et al. |
| 2013/0334523 | A1 | 12/2013 | Yamazaki |
| 2016/0351576 | A1 | 12/2016 | Yamazaki et al. |
| 2017/0213598 | A1 | 7/2017 | Asami |
| 2019/0006386 | A1 | 1/2019 | Yamazaki et al. |

FOREIGN PATENT DOCUMENTS

| | | |
|---|---|---|
| JP | 2014-017477 A | 1/2014 |
| JP | 2016-225614 A | 12/2016 |
| JP | 2017-134879 A | 8/2017 |
| JP | 2019-012822 A | 1/2019 |
| KR | 2013-0107285 A | 10/2013 |
| KR | 2013-0141379 A | 12/2013 |
| TW | 201234532 | 8/2012 |
| WO | WO-2012/026503 | 3/2012 |

OTHER PUBLICATIONS

Written Opinion (Application No. PCT/IB2019/059962) dated Mar. 3, 2020.

Kunitake.H et al., "High thermal tolerance of 25-nm c-axis aligned crystalline In—Ga—Zn oxide FET", IEDM 18: Technical Digest of International Electron Devices Meeting, Dec. 1, 2018, pp. 312-315.

* cited by examiner

FIG. 7A
| Amorphous | Crystalline | Crystal |
|---|---|---|
| completely amorphous | •CAAC<br>•nc<br>•CAC | •single crystal<br>•poly crystal |
FIG. 7B
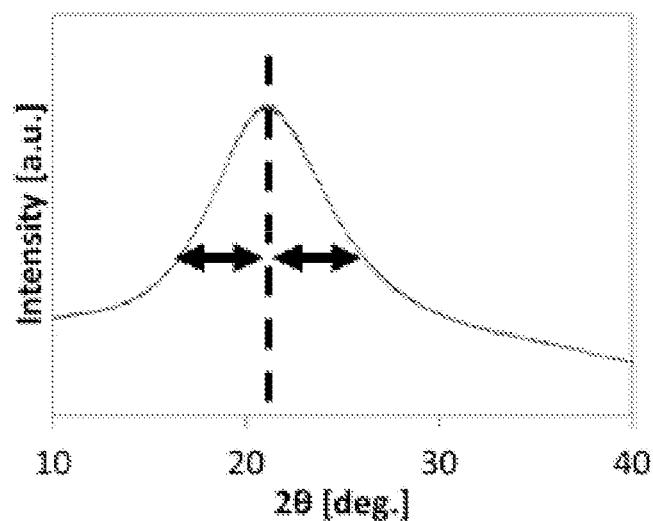
FIG. 7C
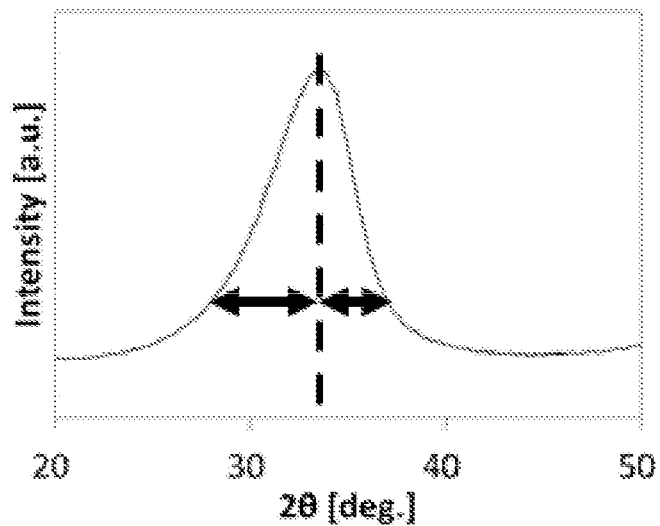

SEMICONDUCTOR DEVICE, MANUFACTURING METHOD OF SEMICONDUCTOR DEVICE, AND OPERATION METHOD OF SEMICONDUCTOR DEVICE

TECHNICAL FIELD

The present invention relates to a semiconductor device, for example. Alternatively, the present invention relates to, for example, a manufacturing method of a semiconductor device. Alternatively, the present invention relates to, for example, a memory transistor included in a semiconductor device and a manufacturing method of the memory transistor. Alternatively, the present invention relates to, for example, an operation method of a semiconductor device. Alternatively, the present invention relates to, for example, a memory device, a processor, and an electronic device. Alternatively, the present invention relates to manufacturing methods of the memory device, the processor, and the electronic device. Alternatively, the present invention relates to operation methods of the memory device, the processor, and the electronic device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a memory device, a semiconductor circuit, and an electronic device include a semiconductor device in some cases.

BACKGROUND ART

In recent years, with the increase in the amount of data manipulated, a semiconductor device having a larger storage capacity has been required. To increase storage capacity per unit area, stacking memory cells is effective (see Patent Document 1, Patent Document 2, and Patent Document 3). Stacking memory cells can increase storage capacity per unit area in accordance with the number of stacked memory cells.

REFERENCE

Patent Documents

[Patent Document 1] United States Patent Application Publication No. 2011/0065270
[Patent Document 2] U.S. Pat. No. 9,634,097
[Patent Document 3] U.S. Pat. No. 9,177,872

SUMMARY OF THE INVENTION

Problems to be Solved by the Invention

In Patent Document 1 and Patent Document 2, a plurality of memory elements (also referred to as memory cells) are stacked and these memory elements are connected in series, so that a three-dimensional memory cell array (also referred to as a memory string) is formed. In such a three-dimensional memory cell array, as the number of stacked memory elements increases, the series resistance between the memory cells is increased, and the resistance of the memory cell array is increased. There has been a problem in that the high resistance of the memory cell array causes loss of current flowing through the memory cell array and heat generation in the memory cell array.

Furthermore, in Patent Document 1, a semiconductor pattern provided in a columnar form is in contact with an insulator including a charge accumulation layer. In Patent Document 2, a semiconductor pattern provided in a columnar form is in contact with an insulator functioning as a tunnel dielectric. When the semiconductor is in contact with the insulator, trap centers might be formed at the interface between them. The trap centers formed at the interface between the semiconductor and the insulator trap electrons and change the threshold voltage of the transistor in the positive direction and thus might adversely affect the current driving power in the on state of the transistor, that is, the on-state current, the field-effect mobility, and the reliability.

In view of the above problems, an object of one embodiment of the present invention is to provide a semiconductor device which has favorable electrical characteristics and in which the formation of trap centers is inhibited.

An object of one embodiment of the present invention is to provide a semiconductor device having a large storage capacity per unit area. Another object of one embodiment of the present invention is to provide a semiconductor device having a novel structure where memory cells are stacked. Another object of one embodiment of the present invention is to provide a semiconductor device with high productivity.

Another object of one embodiment of the present invention is to provide a module including the semiconductor device. Another object of one embodiment of the present invention is to provide an electronic device including the above semiconductor device or the module. Another object of one embodiment of the present invention is to provide a novel semiconductor device. Another object of one embodiment of the present invention is to provide a novel module. Another object of one embodiment of the present invention is to provide a novel electronic device.

Another object of one embodiment of the present invention is to provide a semiconductor device with reduced power consumption in a circuit operation. Another object of one embodiment of the present invention is to provide a module including the semiconductor device with reduced power consumption in a circuit operation. Another object of one embodiment of the present invention is to provide an electronic device including the above semiconductor device or the module.

Another object of one embodiment of the present invention is to provide a manufacturing method of a semiconductor device having a novel structure. Another object of one embodiment of the present invention is to provide a novel operation method of a semiconductor device.

Note that the description of these objects does not preclude the existence of other objects. One embodiment of the present invention does not have to achieve all these objects. Other objects are apparent from the description of the specification, the drawings, the claims, and the like, and other objects can be derived from the description of the specification, the drawings, the claims, and the like.

Means for Solving the Problems (1)

One embodiment of the present invention is a semiconductor device including a stack. The stack includes a first insulator; a first conductor over the first insulator; a second insulator over the first conductor; an oxide positioned on the inner side of a first opening provided in the first insulator, the first conductor, and the second insulator; a third insulator positioned on the outer side of the oxide in the first opening; a second conductor positioned on the inner side of the oxide in the first opening; and a fourth insulator positioned between the oxide and the second conductor in the first opening. The third insulator includes a gate insulating layer positioned at a side surface of the first opening; a tunnel insulating layer positioned on the outer side of the oxide; and a charge accumulation layer positioned between the gate insulating layer and the tunnel insulating layer.

(2)

Another embodiment of the present invention is the semiconductor device with the above structure (1), in which the stack includes a third conductor positioned above the first insulator; a fifth insulator over the third conductor; the oxide positioned on the inner side of a second opening provided in the third conductor and the fifth insulator; the gate insulating film positioned between a side surface of the second opening and the oxide; the second conductor positioned on the inner side of the oxide in the second opening; and the fourth insulator positioned between the oxide and the second conductor in the first opening. The second opening is positioned in a region overlapping with the first opening.

(3)

Another embodiment of the present invention is the semiconductor device with the above structure (1) or (2), in which the oxide includes a first layer; a second layer provided in contact with the inner side of the first layer; and a third layer provided in contact with the inner side of the second layer. An energy gap of the second layer is narrower than an energy gap of the first layer, and the energy gap of the second layer is narrower than an energy gap of the third layer.

(4)

Another embodiment of the present invention is the semiconductor device with the above structure (3), in which the oxide contains at least indium.

(5)

Another embodiment of the present invention is the semiconductor device with the above structure (3), in which the oxide contains In, an element M (M is Al, Ga, Y, or Sn), and Zn.

(6)

Another embodiment of the present invention is the semiconductor device with the above structure (5), in which the element M is Ga, and an atomic ratio of In to Ga and Zn contained in the second layer is In:Ga:Zn=5:1:3 or a composition in a neighborhood thereof.

(7)

Another embodiment of the present invention is the semiconductor device with the above structure (5), in which the element M is Ga, and an atomic ratio of In to Ga and Zn contained in the second layer is In:Ga:Zn=10:1:3 or a composition in a neighborhood thereof (8)

Another embodiment of the present invention is the semiconductor device with any one of the above structures (1) to (7), including a control circuit, which is positioned below the stack.

(9)

Another embodiment of the present invention is a manufacturing method of a semiconductor device including the steps of forming a first insulator; forming a first conductor over the first insulator; forming a second insulator over the first conductor; processing the second insulator, the first conductor, and the first insulator to form a first stack including a first opening; forming a third insulator in contact with the first insulator, the first conductor, and the second insulator in the first opening; forming an oxide in contact with the third insulator; forming a fourth insulator in contact with the oxide; and forming a second conductor in contact with the fourth insulator.

(10)

Another embodiment of the present invention is the manufacturing method (9) of a semiconductor device, including the steps of forming a third conductor above the first insulator; forming a fifth insulator over the third conductor; processing the third conductor and the fifth insulator to form a second stack in which a second opening is positioned in a region overlapping with the first opening; forming the third insulator in contact with the third conductor and the fifth insulator in the second opening; forming the oxide in contact with the third insulator; forming the fourth insulator in contact with the oxide; and forming the second conductor in contact with the fourth insulator.

(11)

Another embodiment of the present invention is the manufacturing method (9) or (10) of a semiconductor device, in which the formation of the oxide includes the steps of forming a first layer in contact with the third insulator; forming a second layer in contact with the inner side of the first layer; and forming a third layer in contact with the inner side of the second layer. An energy gap of the second layer is narrower than an energy gap of the first layer, and the energy gap of the second layer is narrower than an energy gap of the third layer.

(12)

Another embodiment of the present invention is the manufacturing method (11) of a semiconductor device, in which the oxide contains at least indium.

(13)

Another embodiment of the present invention is the manufacturing method (11) of a semiconductor device, in which the oxide contains In, an element M (M is Al, Ga, Y, or Sn), and Zn.

(14)

Another embodiment of the present invention is the manufacturing method of a semiconductor device with the above (13), in which the element M is Ga, and an atomic ratio of In to Ga and Zn contained in the second layer is In:Ga:Zn=5:1:3 or a composition in a neighborhood thereof.

(15)

Another embodiment of the present invention is the manufacturing method of a semiconductor device with the above (13), in which the element M is Ga, and an atomic ratio of In to Ga and Zn contained in the second layer is In:Ga:Zn=10:1:3 or a composition in a neighborhood thereof.

(16)

Another embodiment of the present invention is an operation method of a semiconductor device including a first transistor including a back gate; a second transistor including a back gate and a charge accumulation layer; and a third transistor including a back gate. A channel formation region of each of the first to third transistors contains a metal oxide, one of a source and a drain of the first transistor is electrically connected to one of a source and a drain of the second transistor, the other of the source and the drain of the second transistor is electrically connected to one of a source and a drain of the third transistor. The operation method includes a writing operation and a reading operation. The writing operation includes an operation of applying a first potential to the back gate of each of the first to third transistors; an operation of applying a high-level potential at which the first transistor is in an on state to a gate of the first transistor; and an operation of applying a third potential to a gate of the second transistor and an operation of applying a fourth potential to the other of the source and the drain of the first transistor for injecting an electron into the charge accumulation layer. The reading operation includes an operation of applying the first potential to the back gate of each of the first to third transistors; an operation of applying a high level at which the first transistor is in an on state to the gate of the first transistor; an operation of applying a high level at which the third transistor is in an on state to a gate of the third transistor; an operation of applying a fifth potential to the gate of the second transistor; an operation of applying a sixth potential to the other of the source and the drain of the first transistor; and an operation of applying a seventh potential to the other of the source and the drain of the third transistor. The first potential is a negative potential.

(17)

Another embodiment of the present invention is the operation method (16) of a semiconductor device, which includes an erasing operation. The erasing operation includes an operation of applying the first potential to the back gate of each of the first to third transistors; an operation of applying a high-level potential at which the third transistor is in an on state to the gate of the third transistor; and an operation of applying an eighth potential with which an electron is drawn from the charge accumulation layer of the second transistor to the other of the source and the drain of the third transistor.

(18)

Another embodiment of the present invention is the operation method (16) or (17) of a semiconductor device, in which the metal oxide contains at least In.

(19)

Another embodiment of the present invention is the operation method (16) or (17) of a semiconductor device, in which the metal oxide contains In and Zn.

(20)

Another embodiment of the present invention is the operation method (19) of a semiconductor device, in which the metal oxide contains In at a higher proportion than Zn.

(21)

Another embodiment of the present invention is a manufacturing method (19) of a semiconductor device, in which an atomic ratio of In to Zn contained in the metal oxide is In:Zn=2:1 or a composition in a neighborhood thereof.

(22)

Another embodiment of the present invention is a manufacturing method (19) of a semiconductor device, in which an atomic ratio of In to Zn contained in the metal oxide is In:Zn=5:1 or a composition in a neighborhood thereof.

(23)

Another embodiment of the present invention is a manufacturing method (19) of a semiconductor device, in which an atomic ratio of In to Zn contained in the metal oxide is In:Zn=10:1 or a composition in a neighborhood thereof.

(24)

Another embodiment of the present invention is the operation method of a semiconductor device with the above structure (16) or (17), in which the metal oxide contains In, an element M (M is Al, Ga, Y, or Sn), and Zn.

(25)

Another embodiment of the present invention is the operation method of a semiconductor device with the above structure (24), in which the element M is Ga, and an atomic ratio of In to Ga and Zn contained in the metal oxide is In:Ga:Zn=5:1:3 or a composition in a neighborhood thereof.

(26)

Another embodiment of the present invention is the operation method of a semiconductor device with the above structure (24), in which the element M is Ga, and an atomic ratio of In to Ga and Zn contained in the metal oxide is In:Ga:Zn=10:1:3 or a composition in a neighborhood thereof.

Effect of the Invention

According to one embodiment of the present invention, a semiconductor device having favorable electrical characteristics and in which the formation of trap centers is inhibited can be provided.

According to one embodiment of the present invention, a semiconductor device having a large storage capacity per unit area can be provided. According to another embodiment of the present invention, a semiconductor device having a novel structure in which memory cells (also referred to as memory transistors or cell transistors) are stacked can be provided. According to another embodiment of the present invention, a semiconductor device with high productivity can be provided.

According to another embodiment of the present invention, a module including the semiconductor device can be provided. According to another embodiment of the present invention, an electronic device including the above semiconductor device or the module can be provided. According to another embodiment of the present invention, a novel semiconductor device can be provided. According to another embodiment of the present invention, a novel module can be provided. Alternatively, a novel electronic device can be provided.

According to another embodiment of the present invention, in a circuit operation, a semiconductor device with reduced power consumption can be provided. According to another embodiment of the present invention, in a circuit operation, a module including the semiconductor device with reduced power consumption can be provided. According to another embodiment of the present invention, an electronic device including the above semiconductor device or the module can be provided.

According to another embodiment of the present invention, a novel manufacturing method of a semiconductor device can be provided. According to another embodiment of the present invention, a novel operation method of a semiconductor device can be provided.

Note that the description of the effects does not preclude the existence of other effects. One embodiment of the present invention does not have to have all these effects. Note that effects other than these are apparent from the description of the specification, the drawings, the claims, and the like and effects other than these can be derived from the description of the specification, the drawings, the claims, and the like.

BRIEF DESCRIPTION OF THE DRAWINGS

FIG. 7A is a table showing crystal structures of IGZO, FIG. 7B is a view showing an XRD spectrum of quartz glass, and FIG. 7C is a view showing an XRD spectrum of crystalline IGZO.

MODE FOR CARRYING OUT THE INVENTION

Figure 1:
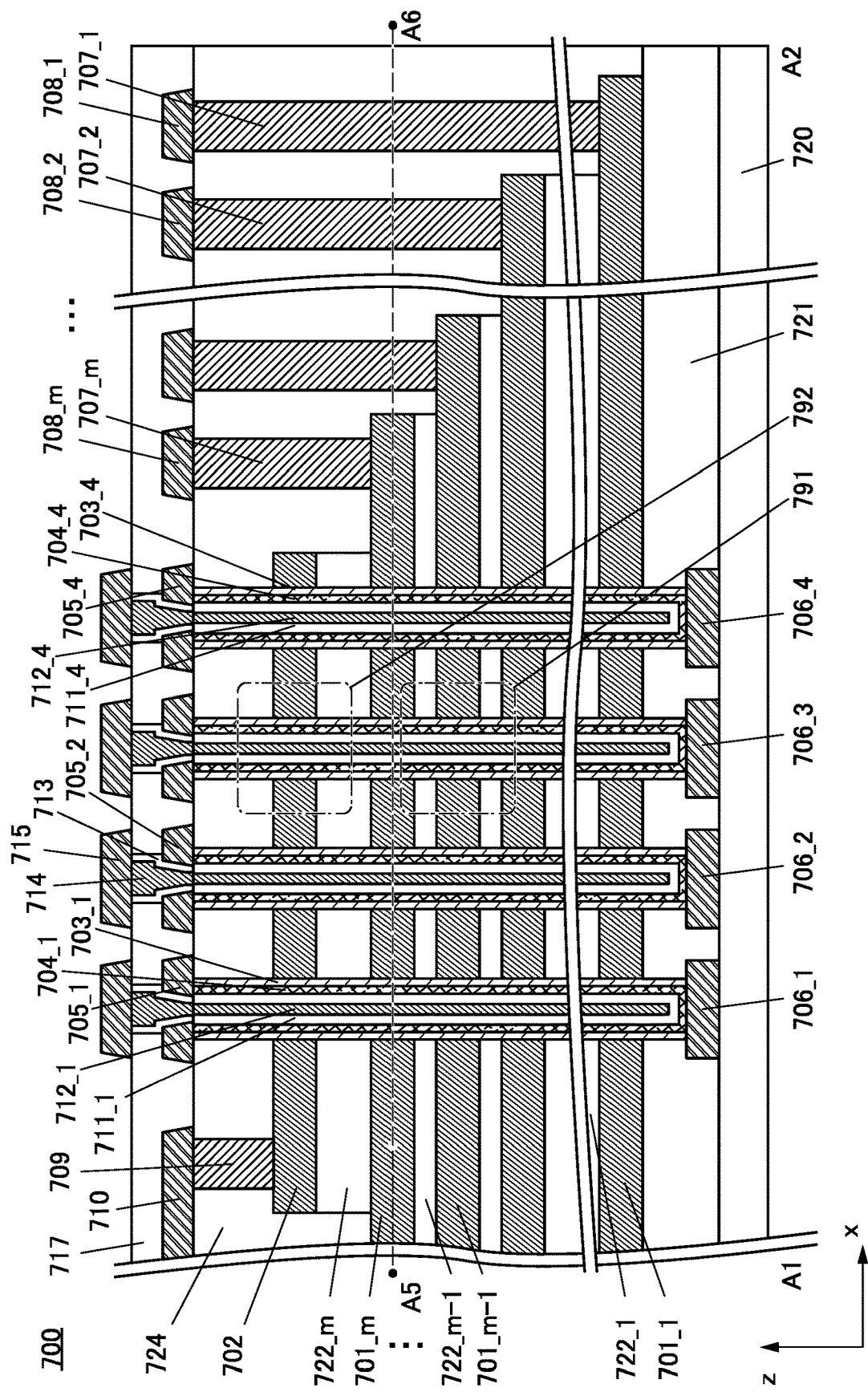
FIG. 1 is a cross-sectional view illustrating an example of a semiconductor device.

Hereinafter, embodiments are described with reference to the drawings. Note that the embodiments can be implemented with many different modes, and it is readily appreciated by those skilled in the art that modes and details can be changed in various ways without departing from the spirit and scope of the present invention. Thus, the present invention should not be construed as being limited to the following description of the embodiments.

In the drawings, the size, the layer thickness, or the region is exaggerated for clarity in some cases. Therefore, the size, the layer thickness, or the region is not necessarily limited to the illustrated scale. The drawings are schematic views showing ideal examples, and embodiments of the present invention are not limited to shapes or values shown in the drawings. In the drawings, the same portions or portions having similar functions are denoted by the same reference numerals in different drawings, and explanation thereof is not repeated. Furthermore, the same hatch pattern is used for the portions having similar functions, and the portions are not especially denoted by reference numerals in some cases.

Note that the ordinal numbers such as "first," "second," and the like in this specification and the like are used for convenience and do not denote the order of steps or the stacking order of layers. Therefore, for example, description can be made even when "first" is replaced with "second", "third", or the like as appropriate. In addition, the ordinal numbers in this specification and the like do not sometimes correspond to the ordinal numbers that are used to specify one embodiment of the present invention.

In this specification, terms for describing arrangement, such as "over" and "under", are used for convenience in describing a positional relationship between components with reference to drawings. The positional relation between components is changed as appropriate in accordance with a direction in which the components are described. Thus, terms for the description are not limited to those used in this specification, and the description can be rephrased appropriately depending on the situation.

In this specification and the like, "electrically connected" includes the case where connection is made through an "object having any electric function". Here, there is no particular limitation on the "object having any electric function" as long as electric signals can be transmitted and received between components that are connected through the object. Examples of the "object having any electric action" include a switching element such as a transistor, a resistor, an inductor, a capacitor, and other elements with a variety of functions as well as an electrode and a wiring.

Note that in this specification and the like, a nitride oxide refers to a compound that contains more nitrogen than oxygen. An oxynitride refers to a compound that contains more oxygen than nitrogen. The content of each element can be measured by Rutherford backscattering spectrometry (RBS), for example.

Moreover, in this specification and the like, the term "film" and the term "layer" can be interchanged with each other. For example, the term "conductive layer" can be changed into the term "conductive film" in some cases. As another example, the term "insulating film" can be changed into the term "insulating layer" in some cases.

In this specification and the like, "parallel" indicates a state where two straight lines are placed at an angle of greater than or equal to −10° and less than or equal to 10°. Thus, the case where the angle is greater than or equal to −5° and less than or equal to 5° is also included. In addition, "substantially parallel" indicates a state where two straight lines are placed at an angle greater than or equal to −30° and less than or equal to 30°. Moreover, "perpendicular" indicates a state where two straight lines are placed at an angle of greater than or equal to 80° and less than or equal to 100°. Thus, the case where the angle is greater than or equal to 85° and less than or equal to 95° is also included. Furthermore, "substantially perpendicular" indicates a state where two straight lines are placed at an angle greater than or equal to 60° and less than or equal to 120°.

Furthermore, in this specification, in the case where a crystal is a trigonal crystal or a rhombohedral crystal, the crystal is regarded as a hexagonal crystal system.

Note that in this specification, a barrier film refers to a film having a function of inhibiting transmission of oxygen and impurities such as hydrogen; in the case where the barrier film has conductivity, the film is referred to as a conductive barrier film in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases.

Note that in this specification and the like, In:Ga:Zn=4:2:3 or a neighborhood thereof refers to an atomic ratio where, when In is 4 with respect to the total number of atoms, Ga is greater than or equal to 1 and less than or equal to 3 ($1 \leq Ga \leq 3$) and Zn is greater than or equal to 2 and less than or equal to 4.1 ($2 \leq Zn \leq 4.1$). In:Ga:Zn=5:1:6 or a neighborhood thereof refers to an atomic ratio where, when In is 5 with respect to the total number of atoms, Ga is greater than 0.1 and less than or equal to 2 ($0.1 \leq Ga \leq 2$) and Zn is greater than or equal to 5 and less than or equal to 7 ($5 \leq Zn \leq 7$). In:Ga:Zn=1:1:1 or a neighborhood thereof refers to an atomic ratio where, when In is 1 with respect to the total number of atoms, Ga is greater than 0.1 and less than or equal to 2 ($0.1 \leq Ga \leq 2$) and Zn is greater than 0.1 and less than or equal to 2 ($0.1 \leq Zn \leq 2$). In:Ga:Zn=5:1:3 or a neighborhood thereof refers to an atomic ratio where, when In is 5 with respect to the total number of atoms, Ga is greater than or equal to 0.5 and less than or equal to 1.5 ($0.5 \leq Ga \leq 1.5$) and Zn is greater than or equal to 2 and less than or equal to 4.1 ($2 \leq Zn \leq 4.1$). In:Ga:Zn=10:1:3 or a neighborhood thereof refers to an atomic ratio where, when In is 10 with respect to the total number of atoms, Ga is greater than or equal to 0.5 and less than or equal to 1.5 ($0.5 \leq Ga \leq 1.5$) and Zn is greater than or equal to 2 and less than or equal to 4.1 ($2 \leq Zn \leq 4.1$). In:Zn=2:1 or a neighborhood thereof refers to an atomic ratio where, when Zn is 1 with respect to the total number of atoms, In is greater than 1 and less than or equal to 3 ($1 \leq In \leq 3$). In:Zn=5:1 or a neighborhood thereof refers to an atomic ratio where, when Zn is 1 with respect to the total number of atoms, In is greater than 3 and less than or equal to 7 ($3 \leq In \leq 7$). In:Zn=10:1 or a neighborhood thereof refers to an atomic ratio where, when Zn is 1 with respect to the total number of atoms, In is greater than 7 and less than or equal to 13 ($7 \leq In \leq 13$).

Embodiment 1

In this embodiment, a structure example, an example of a manufacturing method, a circuit configuration example, and an operation example of a memory device that is a semiconductor device according to one embodiment of the disclosed invention are described with reference to FIG. 1 to FIG. 35.

<Memory Transistor MT and Memory Cell Array 700>

Figure 2A:
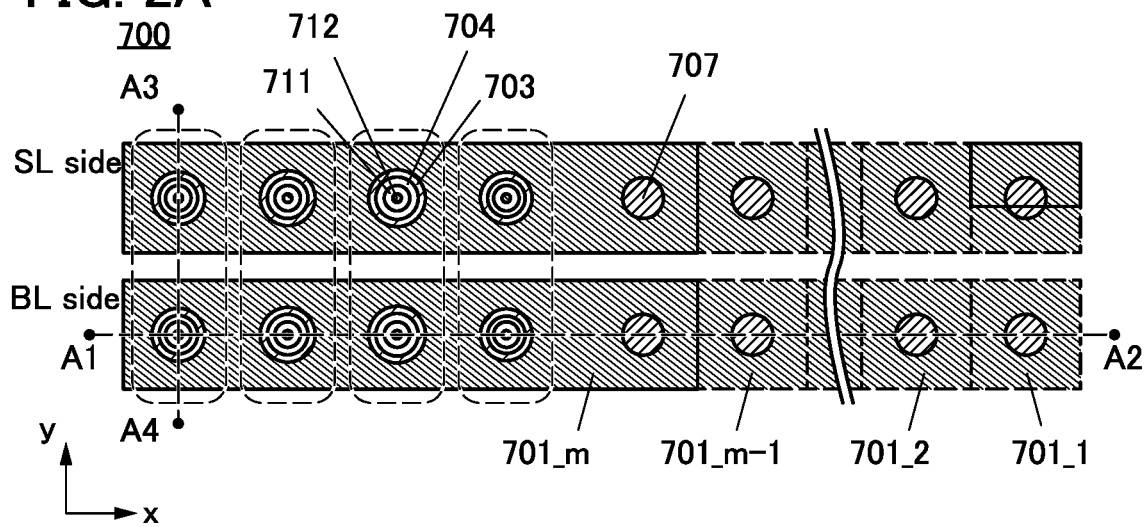
FIG. 2A is a top view illustrating an example of a semiconductor device.
Figure 2B:
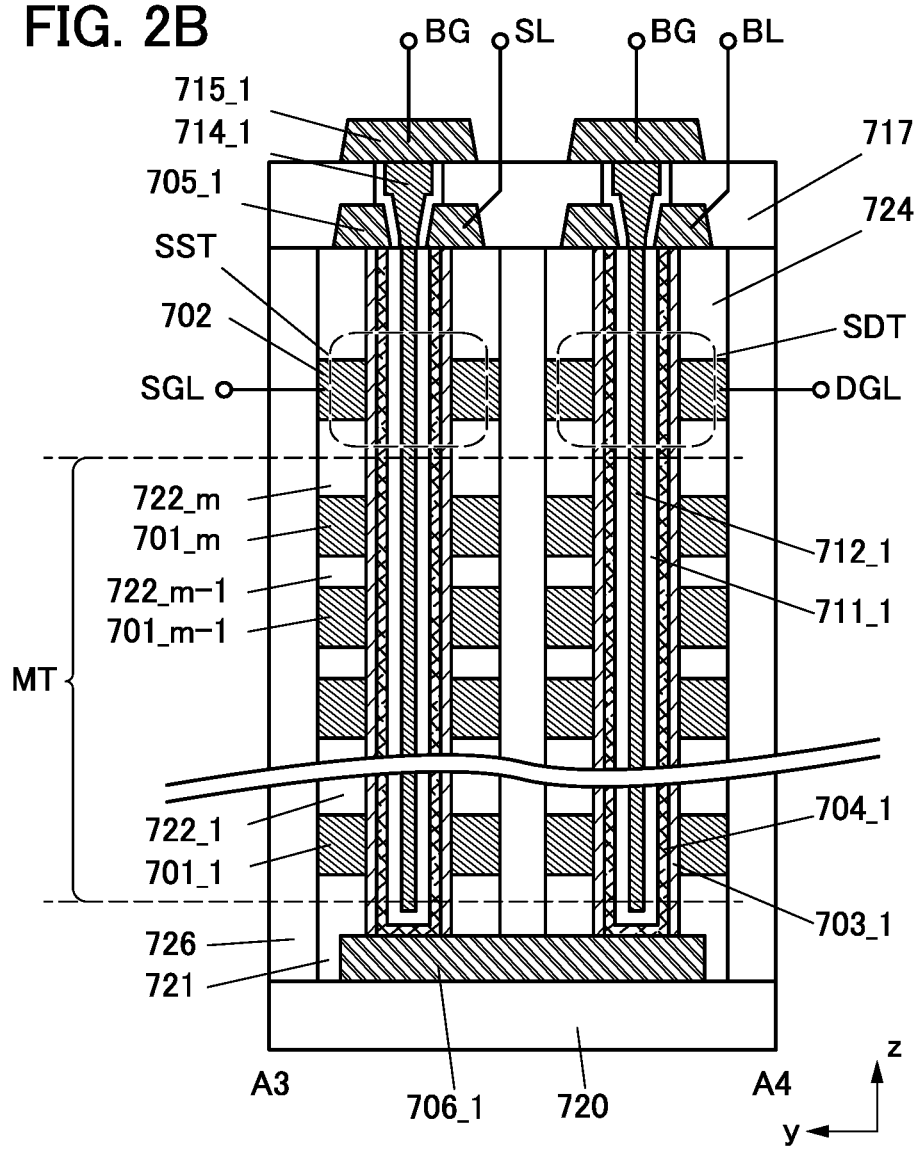
FIG. 2B is a cross-sectional view illustrating an example of a semiconductor device.
Figure 3A:
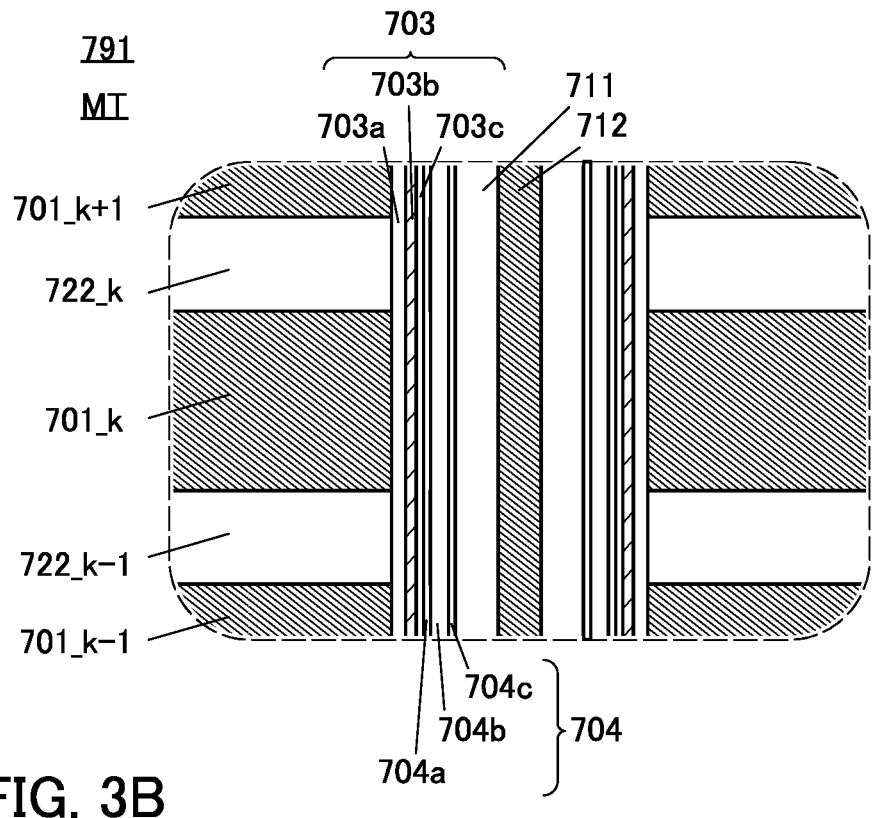
FIG. 3A and FIG. 3B are cross-sectional views illustrating examples of a semiconductor device.
Figure 3B:
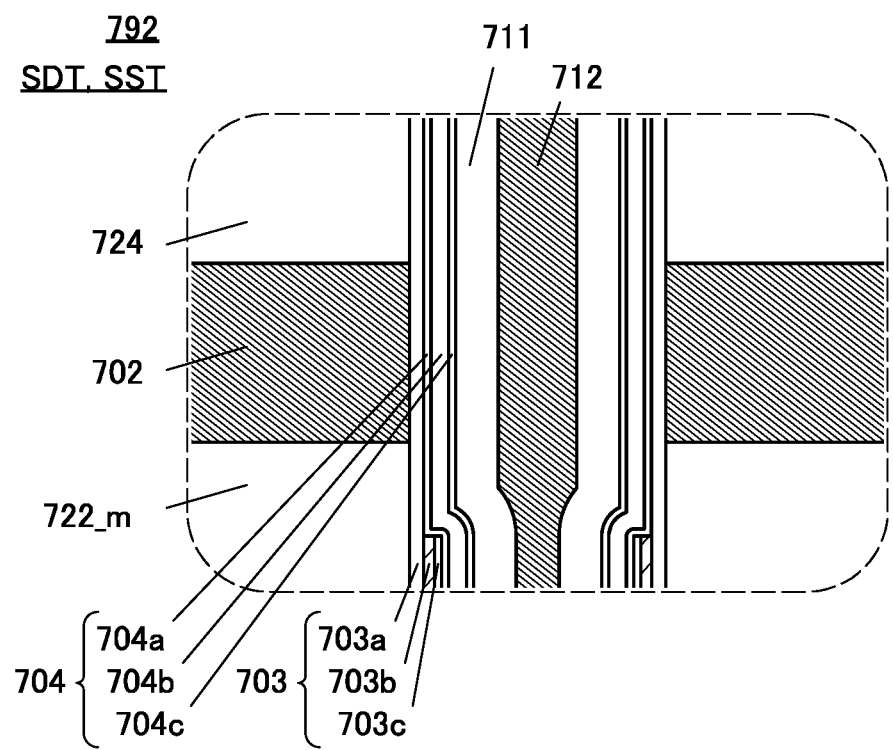

First, the structures of a memory transistor MT of a semiconductor device and a memory cell array are described with reference to FIG. 1, FIG. 2A, FIG. 2B, FIG. 3A, and FIG. 3B. FIG. 1 is a cross-sectional view of a memory cell array 700. FIG. 2A is a top view of the memory cell array 700. Note that FIG. 2A is a top view of a plane indicated by a dashed-dotted line A5-A6 in FIG. 1 and some components are not illustrated. FIG. 1 is a cross-sectional view of a portion indicated by a dashed-dotted line A1-A2 in FIG. 2A. FIG. 2B is a cross-sectional view of a portion indicated by a dashed-dotted line A3-A4 in FIG. 2A and is a cross-sectional view illustrating an example of a memory string. FIG. 3A is an enlarged cross-sectional view of a portion surrounded by a dashed-dotted line 791 in FIG. 1 and is a view illustrating an example of the memory transistor MT functioning as a memory cell. FIG. 3B is an enlarged cross-sectional view of a portion surrounded by a dashed-dotted line 792 in FIG. 1 and is a view illustrating an example of a transistor functioning as a selection transistor. Note that in the following description, a rectangular coordinate system using an x-axis, a y-axis, and a z-axis is set as illustrated in FIG. 1 and the like for the sake of convenience. Here, the x-axis and the y-axis are parallel to the top surface of a base 720 provided with the memory cell array 700 and the z-axis is perpendicular to the top surface of the base 720.

The memory cell array 700 includes an insulator 721 over the base 720; a stack in which conductors 701 (a conductor 701_1 to a conductor 701_m: m is a natural number of greater than or equal to 2) and insulators 722 (an insulator 722_1 to an insulator 722_m) are alternately stacked over the insulator 721; a conductor 702 over the stack; an insulator 724 over the conductor 702 and the stack; insulators 703 (an insulator 703_1 to an insulator 703_4) on the inner sides of opening portions formed to penetrate the insulator 724, the conductor 702, the stack, and the insulator 721; oxides 704 (an oxide 704_1 to an oxide 704_4) on the inner sides of the insulators 703; insulators 711 (an insulator 711_1 to an insulator 711_4) on the inner sides of the oxides 704; conductors 712 (a conductor 712_1 to a conductor 712_4) on the inner sides of the insulators 711; conductors 705 (a conductor 705_1 to a conductor 705_4) electrically connected to upper end portions of the oxide 704_1 to the oxide 704_4, respectively; conductors 706 (a conductor 706_1 to a conductor 706_4) electrically connected to lower end portions of the oxide 704_1 to the oxide 704_4, respectively; conductors 707 (a conductor 707_1 to a conductor 707_m) electrically connected to the conductor 701_1 to the conductor 701_m, respectively; conductors 708 (a conductor 708_1 to a conductor 708_m) electrically connected to the conductor 707_1 to the conductor 707_m, respectively; a conductor 709 electrically connected to the conductor 702; a conductor 710 electrically connected to the conductor 709; an insulator 717 and an insulator 713 over the insulator 724, the conductors 705, the conductors 708, and the conductor 710; and a conductor 714 (denoted by a conductor 714_1 in FIG. 2B) and a conductor 715 (denoted by a conductor 715_1 in FIG. 2B) electrically connected to the conductor 712_1 to the conductor 712_4. Note that in FIG. 1, FIG. 2A, and FIG. 2B, four or more stages of the conductors 701 are illustrated to show a plurality of conductors 701; however, this embodiment is not limited to FIG. 1 and at least two stages of the conductors 701 are provided.

As illustrated in FIG. 1 and FIG. 2A, the conductor 701 is provided to extend in the x-axis direction. Furthermore, as illustrated in FIG. 1 and FIG. 2B, the insulator 703 and the oxide 704 are provided to extend in the z-axis direction. That is, it is preferable that the conductors 701 be provided to perpendicularly intersect with the insulator 703 and the oxide 704. Furthermore, as illustrated in FIG. 1, the conductor 707 is provided to extend in the z-axis direction. The conductor 708 may be provided to extend in the y-axis direction. In addition, a conductor functioning as a wiring BL connected to the conductor 705 may be provided to extend in the y-axis direction. Part of the conductor 705 may function as the wiring BL and the conductor may be provided to extend in the y-axis direction.

In addition, the conductor 712 is formed in a columnar shape and provided to extend in the z-axis direction. In addition, the insulator 711 is provided to surround the conductor 712 and the oxide 704 is provided to surround the insulator 711, each of which extends in the z-axis direction. In other words, the conductor 712 is provided as a core on the inner side of the columnar oxide 704 that extends in the z-axis direction, and the insulator 711 is provided between the oxide 704 and the conductor 712. Furthermore, the insulator 703 are provided to surround a periphery of the side of the columnar oxide 704. The conductor 707 is formed in a columnar shape and provided to extend in the z-axis direction.

The columnar oxide 704 is, in the z-axis direction, electrically connected to the conductor 706 at the lower end and electrically connected to the conductor 705 at the upper end. As illustrated in FIG. 2B, the conductor 706 is electrically connected to the lower ends of two adjacent columnar oxides 704, and the upper ends of the two columnar oxides 704 are electrically connected to the electrically separated conductors 705. In this embodiment, the U-shaped memory string in which the two columnar oxides 704 are electrically connected to each other through the conductor 706 is described; however, the present invention is not limited thereto. For example, the conductor 706 may serve as one of a bit line BL and a source line SL and the conductor 705 may serve as the other of the bit line BL and the source line SL. In this case, the conductor 706 may be electrically connected to a plurality of columnar oxides 704 or one columnar oxide 704. Furthermore, the conductor 705 may be electrically connected to a plurality of columnar oxides 704 or one columnar oxide 704.

In the case where the lower end of the columnar oxide 704 is electrically connected to one of the bit line BL and the source line SL and the upper end thereof is electrically connected to the other, a selection transistor is preferably provided at around the lower end and upper end of the columnar oxide 704. For example, in the case where the conductor 706 serves as part of the bit line BL and the conductor 705 serves as part of the source line SL, a selection transistor SST is provided between the conductor 706 and the memory transistor MT and a selection transistor SDT is provided between the conductor 705 and the memory transistor MT.

Here, a region where the conductor 701 crosses the insulator 703 and the oxide 704 and the vicinity of the region function as the memory transistor MT. A region where the conductor 702 crosses the insulator 703 and the oxide 704 and the vicinity of the region function as the selection transistor. The channel length directions of the memory transistor MT and the selection transistor are parallel to the z-axis direction. The memory transistor MT and the selection transistor are electrically connected in series to form the memory string.

FIG. 3A is an enlarged cross-sectional view of a portion surrounded by the dashed-dotted line 791 in FIG. 1 and is a view illustrating a cross section of the memory transistor MT in a k-th stage (k is an integer greater than or equal to 2 and less than or equal to m−1) as an example. The memory transistor MT includes the conductor 701_k, the insulator 703 (the insulator 703a, the insulator 703b, and the insulator 703c), and the oxide 704 (the oxide 704a, the oxide 704b, and the oxide 704c). In addition, the memory transistor MT may include the conductor 712 and the insulator 711.

The conductor 701_k functions as a gate of the memory transistor MT, the insulator 703a functions as a gate insulating layer, the insulator 703b functions as a charge accumulation layer, and the insulator 703c functions as a tunnel insulating layer.

Although the details are described later, the oxide 704 includes the oxide 704a, the oxide 704b, and the oxide 704c, and the oxide 704a has an energy gap relatively wider than that of the oxide 704b, and the oxide 704c has an energy gap relatively wider than that of the oxide 704b. In other words, the oxide 704b has an energy gap relatively narrower than those of the oxide 704a and the oxide 704c.

The oxide 704 included in the memory transistor MT in the k-th stage functions as a channel formation region. Furthermore, the oxide 704 that is between the memory transistor MT in the k-th stage and the memory transistor MT in the k−1-th stage and the oxide 704 that is between the memory transistor MT in the k-th stage and the memory transistor MT in the k+1-th stage preferably function as low-resistance regions. When the oxide 704 has a structure in which channel formation regions and low-resistance regions are alternately formed, in the memory string where the memory cells are stacked or in the memory cell array, the series resistance between the memory cells can be reduced.

In the case where the conductor 712 is provided, the conductor 701_k serves as a first gate and the conductor 712 serves as a second gate. Note that the first gate is referred to as simply a gate or a control gate, and the second gate is referred to as a back gate in some cases. The insulator 711 is provided between the oxide 704 and the conductor 712 and serves as a second gate insulating layer. At this time, the insulator 703a functions as a first gate insulating layer. In the circuit operation of the memory transistor MT, the potential of the conductor 712 that serves as the second gate is controlled, whereby power consumption of the memory transistor MT can be reduced.

FIG. 3B is an enlarged cross-sectional view of a portion surrounded by the dashed-dotted line 792 in FIG. 1 and is a view illustrating a cross section of the selection transistor (the transistor on the bit line side: SDT and the transistor on the source line side: SST). The selection transistor includes the conductor 702, the insulator 703, and the oxide 704 (the oxide 704a, the oxide 704b, and the oxide 704c). In addition, the conductor 712 and the insulator 711 may be included.

The conductor 702 serves as a gate of the selection transistor and the insulator 703a serves as a gate insulating layer. As the gate insulating layer, at least the insulator 703a is provided, and the insulator 703b and the insulator 703c are not necessarily provided. Alternatively, after the insulator 703a, the insulator 703b, and the insulator 703c are provided, the insulator 703b and the insulator 703c may be partly removed.

The oxide 704 includes the oxide 704a, the oxide 704b, and the oxide 704c, and the oxide 704a has an energy gap relatively wider than that of the oxide 704b, and the oxide 704c has an energy gap relatively wider than that of the oxide 704b. In other words, the oxide 704b has an energy gap relatively narrower than those of the oxide 704a and the oxide 704c.

In the case where the conductor 712 is provided, the conductor 702 serves as a first gate and the conductor 712 serves as a second gate. Note that the first gate is referred to as simply a gate or a top gate, and the second gate is referred to as a back gate in some cases. The insulator 711 is provided between the oxide 704 and the conductor 712 and serves as a second gate insulating layer. At this time, the insulator 703a functions as the first gate insulating layer. With the conductor 712 that serves as the second gate, the threshold voltage of the selection transistor can be controlled.

Note that the structure of the semiconductor device in this embodiment is an example, and the present invention is not limited to the number, the position, and the like of the circuit element, the wiring, and the like illustrated in the drawings and the like according to this embodiment. The number, the position, and the like of the circuit element, the wiring, and the like included in the semiconductor device in this embodiment can be set as appropriate in accordance with the circuit configuration and the driving method.

The base 720 provided with the memory cell array 700 preferably has an insulating surface. As a substrate having an insulating surface, a semiconductor substrate provided with an insulator on its surface, an insulator substrate, a conductor substrate provided with an insulator on its surface, or the like is used. For the semiconductor substrate, a semiconductor substrate of silicon, germanium, or the like or a semiconductor substrate of silicon carbide, silicon germanium, gallium arsenide, indium phosphide, zinc oxide, gallium oxide, or the like may be used, for example. As the insulator substrate, a glass substrate, a quartz substrate, a sapphire substrate, a stabilized zirconia substrate (e.g., an yttria-stabilized zirconia substrate), or a resin substrate may be used, for example. In addition, a semiconductor substrate in which an insulator region is included in the above semiconductor substrate, for example, an SOI (Silicon On Insulator) substrate or the like may be used. As the conductor substrate, a graphite substrate, a metal substrate, an alloy substrate, a conductive resin substrate, or the like may be used.

The conductor 701 functions as the gate of the memory transistor MT and is electrically connected to a word line. That is, the conductor 701, the conductor 707, and the conductor 708 also function as part of the word line. Here, as illustrated in FIG. 1, the conductor 701 is preferably provided in a step-like shape where the conductor 701 in the lower layer extends to be closer to the A2 side than the conductor 701 in the upper layer does. The conductor 701 is provided in this manner, so that the conductor 701 in the upper layer does not overlap with a region of part of the top surface of the conductor 701 in the lower layer; thus, the regions in the conductors 701 can be connected to the respective conductors 707.

For the conductor 701, a conductive material such as silicon to which impurities are added or metal can be used. When silicon is used for the conductor 701, amorphous silicon, microcrystalline silicon, polycrystalline silicon, single crystal silicon, or the like can be used. Furthermore, a p-type impurity or an n-type impurity may be added to give a conducting property to silicon. As a conductive material containing silicon, silicide containing titanium, cobalt, or nickel can be used for the conductor 701. When a metal material is used for the conductor 701, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used.

The conductor 702 is provided over the conductor 701. The conductor 702 functions as the gate of the selection transistor (the selection transistor on the bit line side: SDT and the selection transistor on the source line side: SST) and is electrically connected to a wiring DGL or a wiring SGL. That is, the conductor 702, the conductor 709, and the conductor 710 also serve as part of the wiring DGL or the wiring SGL. For the conductor 702, a material similar to that of the conductor 701 can be used. As the conductor 702, a material that is the same as or different from that of the conductor 701 may be used. The conductor 701 and the conductor 702 are determined depending on the usage in consideration of their work functions and the like.

As an insulating film provided in the upper layer and the lower layer of the conductor 701 and the conductor 702, an oxide, a nitride, an oxynitride, a nitride oxide, a metal oxide, a metal oxynitride, a metal nitride oxide, or the like which has an insulating property can be used. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin has a low relative permittivity and thus is preferably used for the insulating film.

Although aluminum oxide, gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be used for the insulating film, these materials have a high relative permittivity; thus, parasitic capacitance may be generated between the conductors 701 or between the conductor 701 and the conductor 702. The material used for the insulating film can be determined depending on the design or the usage of the device.

The insulator 703 includes the insulator 703a, the insulator 703b, and the insulator 703c. The insulator 703a is provided on the conductor 701 side, the insulator 703c is provided on the oxide 704 side, and the insulator 703b is provided between the insulator 703a and the insulator 703c. The insulator 703a functions as a gate insulating layer, the insulator 703b functions as a charge accumulation layer, and the insulator 703c functions as a tunnel insulating layer.

Note that the selection transistor may have the same structure as the memory transistor MT. In contrast, the charge accumulation layer or the tunnel insulating layer is not necessarily provided in the selection transistor as illustrated in FIG. 3B. The transistor on the bit line side SDT and the transistor on the source line side SST may have a structure in which the insulator 703b and the insulator 703c are removed and only the insulator 703a is provided as the insulator 703. Alternatively, the transistor on the bit line side SDT and the transistor on the source line side SST may have a structure in which the insulator 703b and the insulator 703c are not provided and only the insulator 703a is provided as the insulator 703. In FIG. 3B, the conductor 712 may be provided as the second gate electrode. In this case, the conductor 702 serves as a first gate electrode, the insulator 703a serves as a first gate insulating film, and the insulator 711 serves as a second gate insulating film. With the conductor 712, the threshold voltage of the selection transistor can be controlled.

For the insulator 703a, silicon oxide, silicon oxynitride, or the like is preferably used. Furthermore, aluminum oxide, hafnium oxide, zirconium oxide, or an oxide containing two or more selected from aluminum, hafnium, and zirconium may be used. Alternatively, a stack of these materials may be used for the insulator 703a.

For the insulator 703b, a material functioning as a charge accumulation layer is preferably used, and silicon nitride or silicon nitride oxide is preferably used. Furthermore, aluminum oxide, hafnium oxide, zirconium oxide, or an oxide containing two or more selected from aluminum, hafnium, and zirconium may be included.

For the insulator 703c, silicon oxide or silicon oxynitride is preferably used. Furthermore, aluminum oxide, hafnium oxide, zirconium oxide, or an oxide containing two or more selected from aluminum, hafnium, and zirconium may be used. Alternatively, a stack of these materials may be used for the insulator 703c.

In particular, for example, a single layer or stacked layers of an insulator containing what is called a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST), may be used as at least one of the insulator 703a, the insulator 703b, and the insulator 703c. When any one of the insulator 703a, the insulator 703b, and the insulator 703c has a stacked-layer structure, for example, a three-layer structure in which zirconium oxide, aluminum oxide, and zirconium oxide are formed in this order, a four-layer structure in which zirconium oxide, aluminum oxide, zirconium oxide, and aluminum oxide are formed in this order, or the like can be employed. Furthermore, a compound containing hafnium and zirconium, or the like may be used for at least one of the insulator 703a, the insulator 703b, and the insulator 703c.

Although details are described later, the insulator 703c functions as the tunnel insulating layer, and thus, charge is transferred between the oxide 704 and the insulator 702b through the insulator 703c in the writing operation or the erasing operation of data to/from the memory transistor MT. To make the insulator 703c function as a tunnel insulating layer in such a manner, the thickness of the insulator 703c is preferably smaller than that of the insulator 703a.

Note that in the case where the insulator 703 is formed in the opening provided in the stack including the conductor 701, the conductor 702, and the insulating films, the insulator 703 formed on the bottom portion of the opening needs to be removed by anisotropic etching using dry etching or the like. In anisotropic etching, the side surface of the insulator 703c is also exposed to plasma, a radical, a gas, a chemical solution, or the like. When they damage the side surface of the insulator 703c, trap centers might be generated in the insulator 703c and might affect electrical characteristics of the transistor. To inhibit the generation of the trap centers, the side surface of the insulator 703c is required to be highly resistant to damage from etching. In this case, for the insulator 703c, aluminum oxide, a stack of silicon oxide and aluminum oxide, or a stack of silicon oxynitride and aluminum oxide is preferably used.

The insulator 703a, the insulator 703b, and the insulator 703c can be formed by an ALD method or a CVD method. To prevent contamination of the interfaces between the insulator 703a, the insulator 703b, and the insulator 703c, these insulators are preferably deposited in succession without exposure to an air atmosphere in the same chamber or with a multi-chamber deposition apparatus including a plurality of chambers.

As the oxide 704, a metal oxide functioning as an oxide semiconductor (hereinafter also referred to as an oxide semiconductor) is preferably used.

For example, a metal oxide such as an In-M-Zn oxide (an element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) can be used as the oxide 704. Furthermore, as the oxide 704, an In—Ga oxide, an In—Zn oxide, an In oxide, or the like may be used.

The oxide 704 preferably includes the oxide 704a provided on the insulator 703c side, the oxide 704b provided on the inner side of the oxide 704a, and the oxide 704c provided on the inner side of the oxide 704b. At this time, as the oxide 704a, an oxide having an energy gap relatively wider than that of the oxide 704b is preferably used. Furthermore, as the oxide 704c, an oxide having an energy gap relatively wider than that of the oxide 704b is preferably used. Here, in some cases, an oxide having a wide energy gap is referred to as an oxide that is a wide gap, and an oxide having a narrow energy gap is referred to as an oxide that is a narrow gap. In FIG. 3A and FIG. 3B, the oxide 704 has a three-layer structure of the oxide 704a, the oxide 704b, and the oxide 704c; however, the present invention is not limited thereto. The oxide 704 may have a two-layer structure of the oxide 704a and the oxide 704b or a stacked-layer structure of four or more layers.

In the case where the oxide 704a and the oxide 704c are wide gaps and the oxide 704b is a narrow gap, an energy of the conduction band minimum of each of the oxide 704a and the oxide 704c is preferably higher than an energy of the conduction band minimum of the oxide 704b. In other words, the electron affinity of each of the oxide 704a and the oxide 704c is preferably smaller than the electron affinity of the oxide 704b.

The oxide 704a, the oxide 704b, and the oxide 704c are preferably combined to have different atomic ratios of metal atoms. Specifically, the atomic ratio of the element M to the constituent elements in the metal oxide used for each of the oxide 704a and the oxide 704c is preferably greater than the atomic ratio of the element M to the constituent elements in the metal oxide used for the oxide 704b. The atomic ratio of the element M to In in the metal oxide used as each of the oxide 704a and the oxide 704c is preferably greater than the atomic ratio of the element M to In in the metal oxide used as the oxide 704b. The atomic ratio of In to the element M in the metal oxide used as the oxide 704b is preferably greater than the atomic ratio of In to the element M in the metal oxide used as each of the oxide 704a and the oxide 704c.

As the oxide 704a and the oxide 704c, for example, a metal oxide having a composition of In:Ga:Zn=1:3:4, a composition of In:Ga:Zn=1:3:2, a composition of In:Ga:Zn=1:1:1, or a composition that is in the neighborhood of any one of them can be used. As the oxide 704b, for example, a metal oxide having a composition of In:Ga:Zn=4:2:3 to 4:2:4.1, a composition of In:Ga:Zn=1:1:1, a composition of In:Ga:Zn=5:1:6, or a composition that is in the neighborhood of any one of them can be used. Furthermore, as a composition other than the above, as the oxide 704b, for example, a metal oxide having a composition of In:Ga:Zn=5:1:3, a composition of In:Ga:Zn=10:1:3, a composition of In:Zn=2:1, a composition of In:Zn=5:1, a composition of In:Zn=10:1, or a composition that is in the neighborhood of any one of them can be used. The oxide 704a and the oxide 704b are preferably combined to satisfy the above relation of the atomic ratios. For example, it is preferable that the oxide 704a and the oxide 704c be a metal oxide having a composition of In:Ga:Zn=1:3:4 or a composition that is in the neighborhood thereof and the oxide 704b be a metal oxide having a composition of In:Ga:Zn=4:2:3 to 4:2:4.1 or a composition that is in the neighborhood thereof. Note that the above composition represents the atomic ratio of an oxide formed over a base or the atomic ratio of a sputtering target. Furthermore, it is preferable that the ratio of In be increased in the composition of the oxide 704b to increase the on-state current, the field-effect mobility, or the like of the transistor. When the ratio of In in the oxide 704b is increased, normally-on transistor characteristics are obtained in many cases. However, one embodiment of the present invention can provide an operation method of a semiconductor device which is excellent even with normally-on transistor characteristics. Note that the details of the operation method of a semiconductor device of one embodiment of the present invention are described later.

Note that in this specification and the like, "normally on" means a state where a channel exists without application of a voltage to a gate and a current flows through the transistor. Moreover, "normally off" means that a current per micrometer of channel width flowing through a transistor when a potential is not applied to a gate or a ground potential is supplied to the gate is lower than or equal to $1\times10^{-20}$ A at room temperature, lower than or equal to $1\times10^{-18}$ A at 85° C., or lower than or equal to $1\times10^{-16}$ A at 125° C.

It is also preferable that a CAAC-OS described later be used as the oxide 704a and the oxide 704c and a CAC-OS be used as the oxide 704b. In the case where the CAAC-OS is used as the oxide 704a and the oxide 704c, the c-axes are preferably aligned parallel to the x-y plane shown in FIG. 1, FIG. 2, and the like, that is, perpendicular to the z-axis, and preferably aligned from the side surface of the opening to the central portion.

Here, in a junction portion of the oxide 704a and the oxide 704b and a junction portion of the oxide 704c and the oxide 704b, the conduction band minimum is gradually varied. In other words, the conduction band minimum in the junction portion of the oxide 704a and the oxide 704b and the junction portion of the oxide 704c and the oxide 704b is continuously varied or continuously connected. To obtain this, the density of defect states in a mixed layer formed at the interface between the oxide 704a and the oxide 704b and the interface between the oxide 704c and the oxide 704b is preferably made low.

Specifically, when the oxide 704a, the oxide 704b, and the oxide 704c contain the same element (as a main component) in addition to oxygen, a mixed layer with a low density of defect states can be formed. For example, in the case where the oxide 704b is an In—Ga—Zn oxide, an In—Ga—Zn oxide, a Ga—Zn oxide, gallium oxide, or the like is preferably used for the oxide 704a and the oxide 704c. Accordingly, the density of defect states at an interface between the oxide 704a and the oxide 704b and an interface between the oxide 704c and the oxide 704b can be made low. Thus, the influence of interface scattering on carrier conduction is small, and the memory transistor MT can have a high on-state current.

Note that the details of the metal oxide that can be used as the oxide 704 are described later.

FIG. 3A is an enlarged view of the memory transistor MT surrounded by the dashed-dotted line 791 in FIG. 1. As illustrated in FIG. 3A, the oxide 704b is provided to be sandwiched between the oxide 704a and the oxide 704c. In such a structure, carriers mainly flow in the component having a narrow gap when the carriers flow in the oxide 704 from the conductor 705 toward the conductor 706 or from the conductor 706 toward the conductor 705. Thus, with the above structure, the oxide 704b that is a narrow gap is sandwiched between the oxide 704a and the oxide 704c that are wide gaps, whereby carriers flowing through the oxide 704 can be confined in the oxide 704b. This enables high current drive capability in the on state of the transistor, i.e., high on-state current and high field-effect mobility.

The oxide 704a is provided between the oxide 704b and the insulator 703c, whereby the oxide 704b serving as a carrier path and the insulator 703c are not in direct contact with each other, so that the formation of trap centers can be inhibited. The trap centers formed at the interface between the semiconductor (oxide semiconductor) and the insulator trap electrons and cause the threshold voltage of the transistor to shift in the positive direction, which might adversely affect the reliability and the on-off characteristics of the transistor. Thus, electrical characteristics of a transistor using the oxide are not affected by the trap centers, so that higher current drive capability in the on state, i.e., higher on-state current and higher field-effect mobility can be obtained. Furthermore, the transistor and a semiconductor device using the transistor can have high reliability.

Furthermore, in the case where a metal film, an oxide film containing a metal element, or a nitride film containing a metal element has a property of absorbing hydrogen and the oxide 704 is in contact with the film, hydrogen in the oxide 704 is absorbed by the film. Thus, hydrogen, which is an impurity in the oxide 704, can be reduced. In a later step, the metal film, the oxide film containing a metal element, or the nitride film containing a metal element may be removed together with hydrogen absorbed from the oxide 704. Accordingly, the oxide 704 is highly purified (reduction of impurities such as water or hydrogen) and the resistance of the oxide 704 is further increased.

Note that the metal film, the oxide film containing a metal element, or the nitride film containing a metal element is not necessarily removed. When the metal film, the oxide film containing a metal element, or the nitride film containing a metal element is oxidized by oxygen absorbed from the oxide 704 to be a high-resistance insulator, for example, the film may be left. In that case, the film may serve as a second gate insulating layer like the insulator 711.

In the case where a region having conductivity is left in the metal film, the oxide film containing a metal element, or the nitride film containing a metal element, for example, the region having conductivity is oxidized by heat treatment, so that the metal film, the oxide film containing a metal element, or the nitride film containing a metal element becomes a high-resistance insulator. The heat treatment is preferably performed in an oxidation atmosphere, for example. In the case where a structure body containing oxygen is provided in the vicinity of the metal film, the oxide film containing a metal element, or the nitride film containing a metal element, by heat treatment, the metal film, the oxide film containing a metal element, or the nitride film containing a metal element may be reacted with oxygen contained in the structure body and oxidized.

The metal film, the oxide film containing a metal element, or the nitride film containing a metal element can function as a second gate insulating layer like the insulator 711 when remains as an insulator.

For example, the metal film, the oxide film containing a metal element, or the nitride film containing a metal element is preferably provided to have a thickness of greater than or equal to 0.5 nm and less than or equal to 5 nm, further preferably greater than or equal to 1 nm and less than or equal to 2 nm. When aluminum having a thickness of greater than or equal to 0.5 nm and less than or equal to 5 nm is oxidized by heat treatment, for example, aluminum oxide having a thickness of greater than or equal to 0.7 nm and less than or equal to 8 nm may be formed. Note that in the case where heat treatment is performed in an oxidation atmosphere, such heat treatment is preferably performed after carrying out, in an atmosphere containing nitrogen, another heat treatment which is performed in a state where the oxide 704 is in contact with the metal film, the oxide film containing a metal element, or the nitride film containing a metal element. When the heat treatment is performed in an atmosphere containing nitrogen once, oxygen in the oxide 704 is easily diffused into the metal film, the oxide film containing a metal element, or the nitride film containing a metal element.

Here, a memory transistor using an oxide semiconductor or a selection transistor is likely to have its electrical characteristics changed by impurities and oxygen vacancies in a region of the oxide semiconductor where a channel is formed; accordingly, the reliability is decreased in some cases. Moreover, if the region of the oxide semiconductor where a channel is formed contains oxygen vacancies, the transistor tends to have normally-on characteristics. Thus, oxygen vacancies in the region where a channel is formed are preferably reduced as much as possible. Note that depending on the specifications of a semiconductor device, the memory transistor may be operated as a transistor having normally-on characteristics.

In the case where the conductor 712 is provided, a material similar to that of the conductor 701 can be used for the conductor 712. Since the conductor 712 needs to be formed in the opening having a large aspect ratio (in other words, the recession of the oxide 704 and the insulator 711), the conductor 712 is preferably formed by a CVD method, an ALD method, or a plating method. At this time, for the insulator 711, a material similar to that of the insulator 703 can be used.

In the case where the insulator 711 is provided on the inner side of the oxide 704c, the insulator 711 is preferably a material that can supply oxygen to the oxide 704. When an oxide that contains hydrogen and nitrogen as little as possible is used for the insulator 711, oxygen can be supplied to the oxide 704 in some cases. By supplying oxygen to the oxide 704, the oxide 704 is highly purified. When an oxide which is highly purified is used as the oxide 704, the memory transistor MT and the semiconductor device using the memory transistor MT can have high reliability.

For the insulator 711, a material that can supply impurities such as hydrogen and nitrogen may be used. When an oxide containing hydrogen and nitrogen is used for the insulator 711, for example, hydrogen and nitrogen can be supplied to the oxide 704 in some cases. When hydrogen and nitrogen are supplied to the oxide 704, the resistance value of the oxide 704 is decreased in some cases. The resistance value of the oxide 704 is decreased to the extent that it does not hinder the circuit operation, whereby the memory transistor MT can operate with lower driving voltage. Furthermore, high current drive capability in the on state of the memory transistor MT, i.e., high on-state current and high field-effect mobility can be obtained.

The top view of the opening formed in the stack provided with the memory transistor MT is, but not limited to, circular as illustrated in FIG. 2A, and the like; the top view may be, for example, elliptic or polygonal, e.g., a triangle or a quadrangle. In the case where a polygonal shape is employed, corners thereof may be rounded. The top-view shapes of the insulator 703 and the oxide 704 may change depending on the top-view shape of the opening. The opening may have a shape where a lower cross sectional area of the opening (on the conductor 706 side) is narrower than an upper cross sectional area of the opening (on the conductor 705 side).

The memory transistor MT is formed of the oxide 704, the insulator 703, and the conductor 701 (any one of the conductor 701_1 to the conductor 701_m). FIG. 1 and FIG. 2 show an example in which m stages of memory transistors MT (m is a natural number of 2 or more) are stacked. Note that in FIG. 1 and FIG. 2, four or more stages of the conductors 701 are illustrated to show a plurality of conductors 701; however, this embodiment is not limited to FIG. 1 and at least two stages of the conductors 701 are provided.

The conductor 705 is electrically connected to the oxide 704 and functions as part of the source line SL or part of the bit line BL. As the conductor 705, a conductive material containing a metal element is preferably used. Alternatively, a conductive material among materials that can be used for the metal film, the oxide film containing a metal element, or the nitride film containing a metal element that is described above can be used for the conductor 705. In that case, the resistance of part of the oxide 704 is reduced. A metal compound layer containing the metal element included in the conductor 705 and the component of the oxide 704 is preferably formed at the interface between the conductor 705 and the oxide 704. The metal compound layer is preferably formed, in which case the contact resistance between the conductor 705 and the oxide 704 is reduced. Alternatively, oxygen contained in the oxide 704 is absorbed by the conductor 705 and the resistance of the oxide 704 in the vicinity of the interface between the conductor 705 and the oxide 704 is reduced, whereby the contact resistance between the conductor 705 and the oxide 704 can be reduced.

A conductive material containing one or more metal elements selected from aluminum, ruthenium, titanium, tantalum, chromium, tungsten, and copper is preferably used as the conductor 705.

As illustrated in FIG. 2B, the conductor 706 electrically connects the oxide 704 electrically connected to the conductor 706 that functions as part of the bit line BL to the oxide 704 electrically connected to the conductor 705 that functions as part of the source line SL, so that a memory string is formed. Regions surrounded by dotted lines in FIG. 2A represent memory strings. In other words, FIG. 2A illustrates the memory cell array 700 including four memory strings.

For the conductor 706, a material similar to that for the conductor 705 can be used. Alternatively, a conductive material among materials that can be used for the metal film, the oxide film containing a metal element, or the nitride film containing a metal element can be used for the conductor 706. In that case, the resistance of part of the oxide 704 is reduced as described above. For the conductor 706, the same material as the conductor 705 may be used or a material different from that for the conductor 705 may be used.

A metal compound layer containing the metal element contained in the conductor 706 and the component of the oxide 704 is preferably formed at the interface between the conductor 706 and the oxide 704. Formation of the metal compound layer is preferable because the contact resistance between the conductor 706 and the oxide 704 can be reduced. Alternatively, oxygen contained in the oxide 704 is absorbed by the conductor 706 and the resistance of the oxide 704 in the vicinity of the interface between the conductor 706 and the oxide 704 is reduced, whereby the contact resistance between the conductor 706 and the oxide 704 can be reduced.

The conductor 707, the conductor 708, the conductor 709, the conductor 710, the conductor 714, and the conductor 715 can be formed using a material that can be used for the conductor 701, the conductor 702, or the conductor 712. For each of the conductors, the same material may be used or different materials may be used.

<Memory Cell Array 700A>

Figure 4:
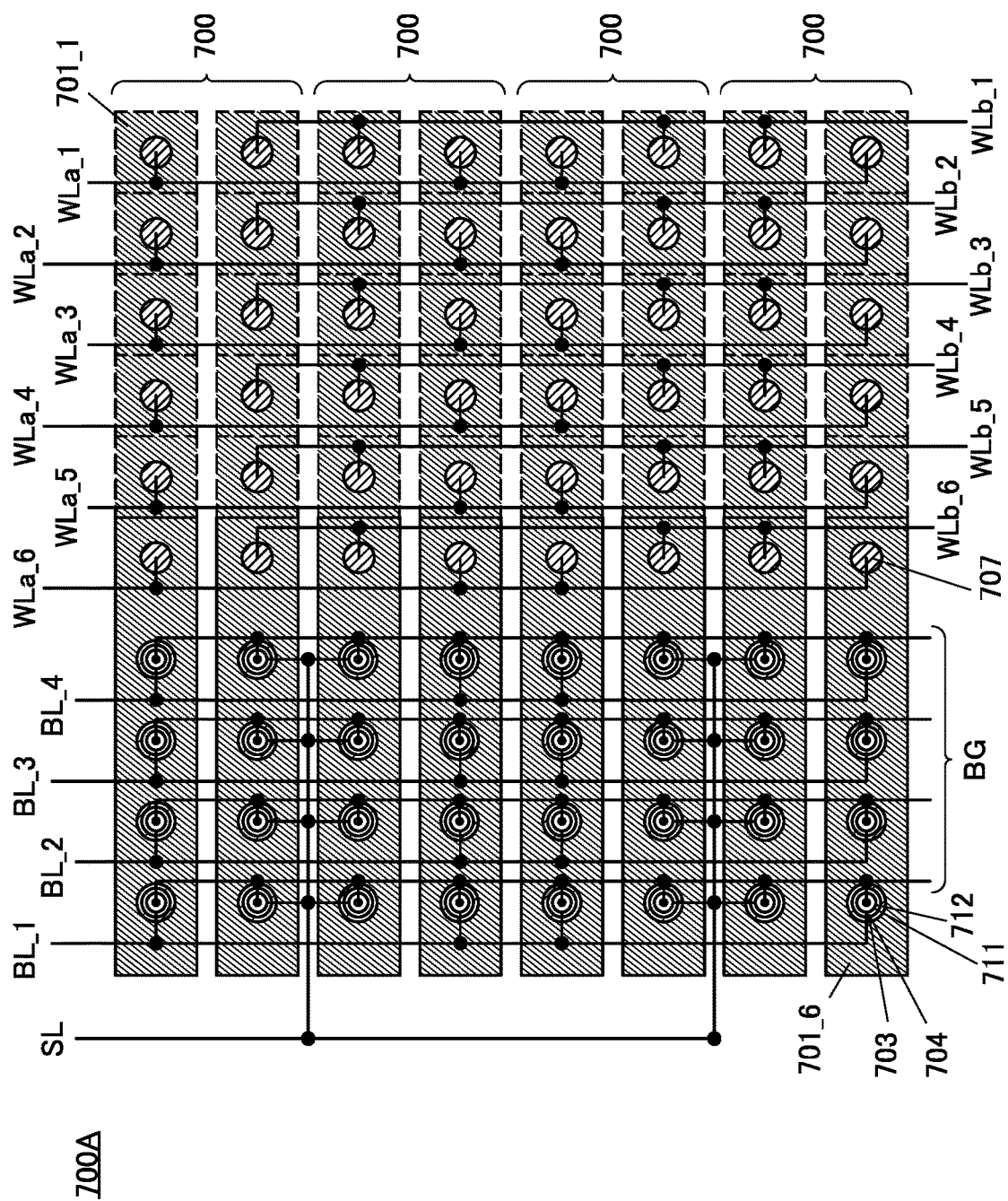
FIG. 4 is a top view illustrating an example of a semiconductor device.

FIG. 4 is a top view illustrating a memory cell array 700A in which a plurality of memory cell arrays 700 including six stages of memory transistors MT are combined. Note that in FIG. 4, some components are omitted for simple description. For example, the selection transistors (the transistor on the bit line side SDT and the transistor on the source line side SST) provided over the conductor 701 and the conductor 702 which is the component thereof are omitted. In addition, the conductor 705 serving as part of the bit line BL and the source line SL, the conductor 708 serving as part of the word line WL (a word line WLa_1 to a word line WLa_6 and a word line WLb_1 to a word line WLb_6), and the conductor 715 serving as part of the wiring BG electrically connected to the conductor 712 serving as a second gate are shown by solid lines.

In the memory cell array 700A, each memory cell array 700 includes four memory strings including six stages of memory transistors MT.

The ends of the memory strings on the bit line side are electrically connected to the respective bit lines BL (a bit line BL_1 to a bit line BL_4). The ends of the memory strings on the source line side are electrically connected to the source line SL and are supplied with a common potential. The source line SL may be grounded or may be supplied with a constant potential. Alternatively, the potential may be changed depending on the circuit operation.

The conductor 701_1 to the conductor 701_6 are electrically connected to the respective word lines WL. The conductor 701_1 to the conductor 701_6 on the bit line side are electrically connected to the word line WLa_1 to the word line WLa_6, respectively, and the conductor 701_1 to the conductor 701_6 on the source line side are electrically connected to the word line WLb_1 to the word line WLb_6, respectively.

The conductors 712 included in each of the memory strings are electrically connected to the wirings BG. Although FIG. 4 shows an example where the conductors 712 aligned in the column direction are electrically connected to the common the wiring BG, the present invention is not limited to this example. The conductors 712 aligned in the row direction may be electrically connected to the common the wiring BG. Furthermore, different potentials may be applied to the wirings BG, or the same potential may be applied to a plurality of the wirings BG. In the case where the same potential is applied to a plurality of the wirings BG, the plurality of wirings BG are preferably electrically connected to each other. The plurality of wirings BG may refer to all the wirings BG included in the memory cell array 700A.

In order that a given potential is applied to the wiring BG, the wiring BG is preferably electrically connected to a circuit that controls the potential of the wiring BG (also referred to as a BG driver or a BG driver circuit, or simply referred to as a driver or a driver circuit). The BG driver circuit may be provided for each of the wirings BG or a plurality of wirings BG may be electrically connected to one BG driver circuit. For example, the memory cell array 700A may include one BG driver circuit and all the wirings BG included in the memory cell array 700A may be electrically connected to the BG driver circuit.

By selecting the bit line BL (the bit line BL_1 to the bit line BL_4) and the word line (the word line WLa_1 to the word line WLa_6 and the word line WLb_1 to the word line WLb_6) as appropriate, a given memory transistor MT in the memory cell array 700 can be selected. In addition, writing, reading, erasing, and the like can be performed on the selected memory transistor MT.

Since the selection transistor (not illustrated) is provided in each memory string, the given memory cell array 700 in the memory cell array 700A can be selected, and writing, reading, erasing, and the like can be performed on the given memory transistor MT in the selected memory cell array 700.

<Structure Example of Memory Device 750>

Figure 5:
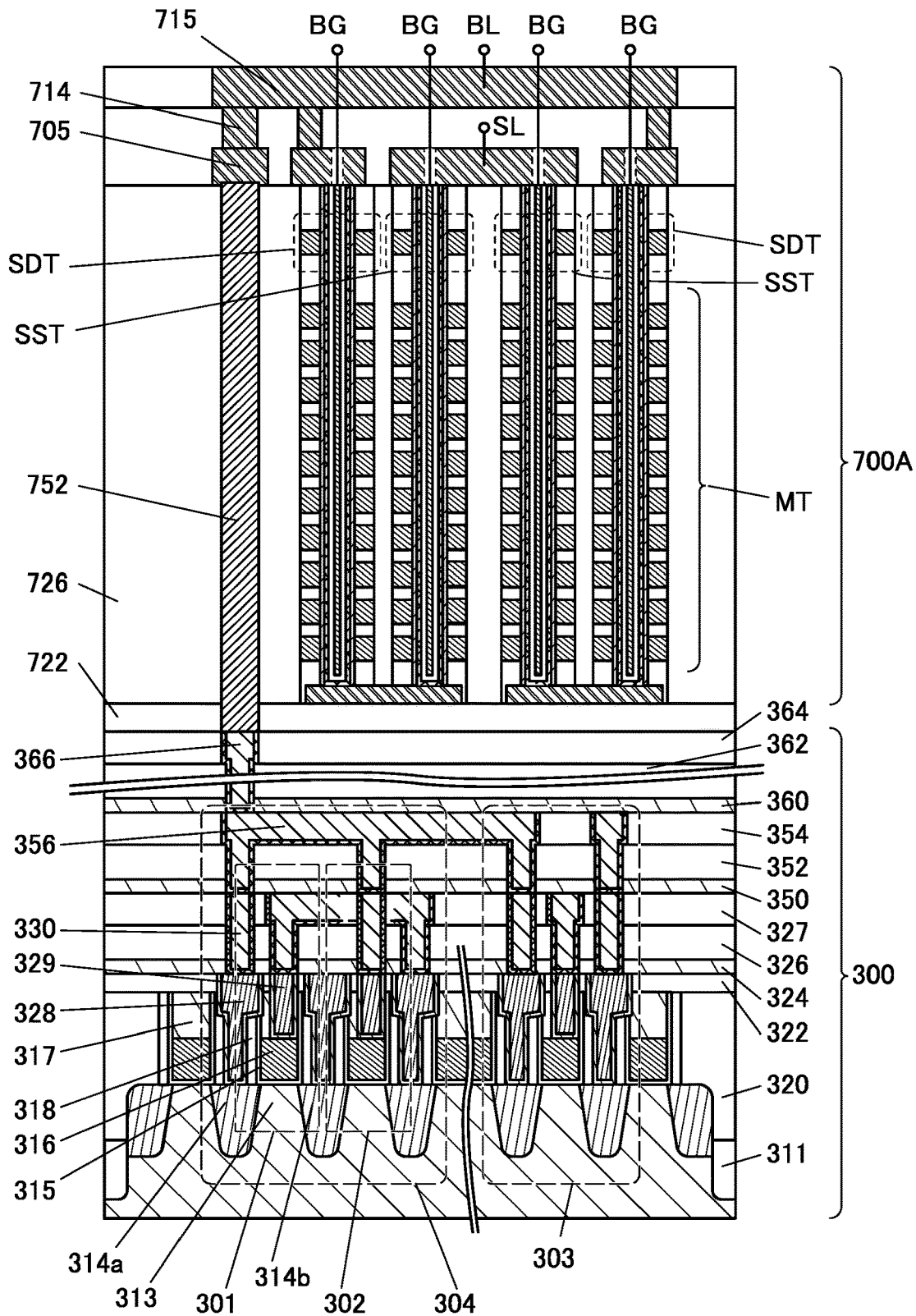
FIG. 5 is a cross-sectional view illustrating an example of a semiconductor device.

FIG. 5 illustrates a structure example of a memory device 750 in which the memory cell array 700A is stacked over a circuit 300. As illustrated in FIG. 5, the memory cell array 700A is stacked over a region where the circuit 300 including a transistor 301, a transistor 302, and a transistor 303 is formed. The transistor 301 and the transistor 302 are included in a sense amplifier 304 and the transistor 303 functions as a column selection switch. Specifically, the bit line BL of the memory cell array 700A is electrically connected to one of a source and a drain of the transistor 301, a gate of the transistor 301 is electrically connected to one of a source and a drain of the transistor 302, and a gate of the transistor 302 is electrically connected to the other of the source and the drain of the transistor 301. The one of the source and the drain of the transistor 301 and the other of the source and the drain of the transistor 302 are electrically connected to one of a source and a drain of the transistor 303 which functions as the column selection switch. Accordingly, the layout area of the memory device 750 can be reduced. Note that FIG. 5 illustrates an example where 10 stages of memory transistors MT are provided and one memory string includes 20 memory transistors MT. However, the number of stages of stacked memory transistors MT is not limited thereto. For example, 32 stages of memory transistors, 64 stages of memory transistors, 128 stages of memory transistors, or 200 or more stages of memory transistors may be stacked.

The bit line BL of the memory cell array 700A is electrically connected to the sense amplifier 304 and the transistor 303 functioning as the column selection switch through the conductor 752 formed to be embedded in an insulator 726, the insulator 722, and the like. Note that circuits and transistors included in the circuit 300 are examples, and one embodiment of the present invention is not limited to the circuit configurations and the transistor structures. In addition to the above, an appropriate circuit or transistor can be provided in accordance with the component of the memory device 750 such as a control circuit, a row decoder, a row driver, a source line driver, or an input-output circuit, or the driving method thereof.

The transistor 301, the transistor 302, and the transistor 303 are provided on a substrate 311 and includes a conductor 316, an insulator 315, a semiconductor region 313 that is a part of the substrate 311, and a low-resistance region 314a and a low-resistance region 314b functioning as a source region and a drain region. Note that as illustrated in FIG. 5, one low-resistance region may be used in common for a source region or a drain region of one of the transistor 301 and the transistor 302 and a source region or a drain region of the other of the transistor 301 and the transistor 302.

In each of the transistor 301, the transistor 302, and the transistor 303, the semiconductor region 313 (part of the substrate 311) in which a channel is formed has a protruding portion. In addition, the conductor 316 is provided to cover a side surface and a top surface of the semiconductor region 313 with the insulator 315 therebetween. Note that a material adjusting the work function may be used for the conductor 316. The transistor 301, the transistor 302, and the transistor 303 that are described above are also referred to as FIN-type transistors because they utilize convex portions of a semiconductor substrate. Note that an insulator functioning as a mask for forming the convex portion may be included in contact with an upper portion of the convex portion. Furthermore, although the case where the convex portion is formed by processing part of the semiconductor substrate is described here, a semiconductor film having a convex shape may be formed by processing an SOI substrate.

Although each of the transistor 301, the transistor 302, and the transistor 303 may be either a p-channel transistor or an n-channel transistor, the transistor 301 and the transistor 302 are preferably transistors having different polarities.

It is preferable that a region of the semiconductor region 313 where a channel is formed, a region in the vicinity thereof, the low-resistance region 314a and the low-resistance region 314b functioning as the source region and the drain region, and the like contain a semiconductor such as a silicon-based semiconductor, further preferably single crystal silicon. Alternatively, these regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 301, the transistor 302, and the transistor 303 may be an HEMT (High Electron Mobility Transistor) with the use of GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

The insulator 315 serves as a gate insulating film of each of the transistor 301, the transistor 302, and the transistor 303.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that the work function depends on a material of the conductor; thus, the threshold voltage can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

An insulator 317 functioning as an etching stopper is preferably provided over the conductor 316. In addition, an insulator 318 functioning as a spacer is preferably provided on the side surface of the insulator 315. When the insulator 317 and the insulator 318 are provided, regions where the low-resistance region 314a and the low-resistance region 314b and a conductor 328 are electrically connected to each other can be defined in a self-aligned manner. Thus, even when misalignment occurs in forming the openings for exposing part of the low-resistance region 314a and the low-resistance region 314b, the openings for exposing the intended regions can be formed. The conductor 328 provided in the openings formed in this manner can provide a favorable contact with reduced contact resistance between the low-resistance region 314a and the low-resistance region 314b and the conductor 328. The contact between the low-resistance region 314a and the low-resistance region 314b formed in this manner and the conductor 328 may be referred to as a self-aligned contact.

An insulator 320, an insulator 322, an insulator 324, an insulator 326, and an insulator 327 are stacked in this order to cover the transistor 301, the transistor 302, and the transistor 303.

The insulator 320, the insulator 322, the insulator 324, the insulator 326, and the insulator 327 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may have a function of a planarization film for planarizing a level difference caused by the transistor 301 or the like provided below the insulator 322. For example, the top surface of the insulator 322 may be planarized by planarization treatment using a chemical mechanical polishing (CMP) method or the like to improve planarity.

The insulator 324 is preferably formed using a film having a barrier property that prevents diffusion of hydrogen or impurities from the substrate 311, the transistor 301, or the like into the region where the memory cell array 700A is provided.

For the film having a barrier property against hydrogen, silicon nitride formed by a CVD method can be used, for example. Here, diffusion of hydrogen to a semiconductor element including an oxide semiconductor, such as the memory transistor MT, degrades the characteristics of the semiconductor element in some cases. Therefore, a film that inhibits hydrogen diffusion is preferably used between the memory transistor MT and the transistor 301 and the like. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of each of the insulator 326 and the insulator 327 is preferably lower than that of the insulator 324. For example, the relative permittivity of each of the insulator 326 and the insulator 327 is preferably lower than 4, further preferably lower than 3. The relative permittivity of each of the insulator 326 and the insulator 327 is, for example, preferably 0.7 times or less, further preferably 0.6 times or less the relative permittivity of the insulator 324. When a material with a low permittivity is used for the interlayer film, the parasitic capacitance generated between wirings can be reduced.

The conductor 328, a conductor 329, a conductor 330, and the like that are electrically connected to the memory cell array 700A are provided in the insulator 317, the insulator 320, the insulator 322, the insulator 324, the insulator 326, and the insulator 327. Note that the conductor 328, the conductor 329, and the conductor 330 have functions of plugs or wirings. As an example, the conductor 329 is embedded in an opening in the insulator 317 and the insulator 322, and the conductor 329 is electrically connected to the conductor 316. A plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and another part of the conductor functions as a plug.

As a material for each of the plugs and wirings (the conductor 328, the conductor 329, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is particularly preferable to use tungsten. Alternatively, each of the plugs and wirings is preferably formed using a low-resistance conductive material such as aluminum or copper. The use of a low-resistance conductive material can reduce wiring resistance.

A wiring layer may be provided over the insulator 327 and the conductor 330. For example, in FIG. 5, an insulator 350, an insulator 352, and an insulator 354 are stacked in this order. Furthermore, a conductor 356 is formed in the insulator 350, the insulator 352, and the insulator 354. The conductor 356 has a function of a plug or a wiring. Note that the conductor 356 can be provided using a material similar to those for the conductor 328, the conductor 329, and the conductor 330.

For example, like the insulator 324, the insulator 350 is preferably formed using an insulator having a barrier property against hydrogen. The conductor 356 preferably contains a conductor having a barrier property against hydrogen. That is, the conductor 356 having a bather property against hydrogen is preferably formed in an opening portion of the insulator 350 having a barrier property against hydrogen. With this structure, the transistor 301 and the like and the memory transistor MT can be separated by the barrier layer, so that diffusion of hydrogen from the transistor 301 and the like into the memory transistor MT can be inhibited.

For the conductor having a barrier property against hydrogen, tantalum nitride is preferably used, for example. In addition, the use of a stack including tantalum nitride and tungsten, which has high conductivity, can inhibit diffusion of hydrogen from the transistor 301 and the like while the conductivity of a wiring is maintained. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 5, an insulator 360, an insulator 362, and an insulator 364 are stacked in this order. Furthermore, a conductor 366 is formed in the insulator 360, the insulator 362, and the insulator 364. The conductor 366 has a function as a plug or a wiring. Note that the conductor 366 can be provided using a material similar to those for the conductor 328, the conductor 329, and the conductor 330.

For example, like the insulator 324, the insulator 360 is preferably formed using an insulator having a barrier property against hydrogen. Furthermore, the conductor 366 preferably contains a conductor having a barrier property against hydrogen. That is, the conductor 366 having a barrier property against hydrogen is preferably formed in an opening portion of the insulator 360 having a barrier property against hydrogen. With this structure, the transistor 301 and the like and the memory transistor MT can be separated by the barrier layer, so that diffusion of hydrogen from the transistor 301 and the like into the memory transistor MT can be inhibited.

The insulator 722 is provided over the insulator 364 and the conductor 366, and the memory cell array 700A is provided above the insulator 722. A barrier film formed using a material similar to that of the insulator 324 may be provided between the insulator 364 and the insulator 722.

Figure 6:
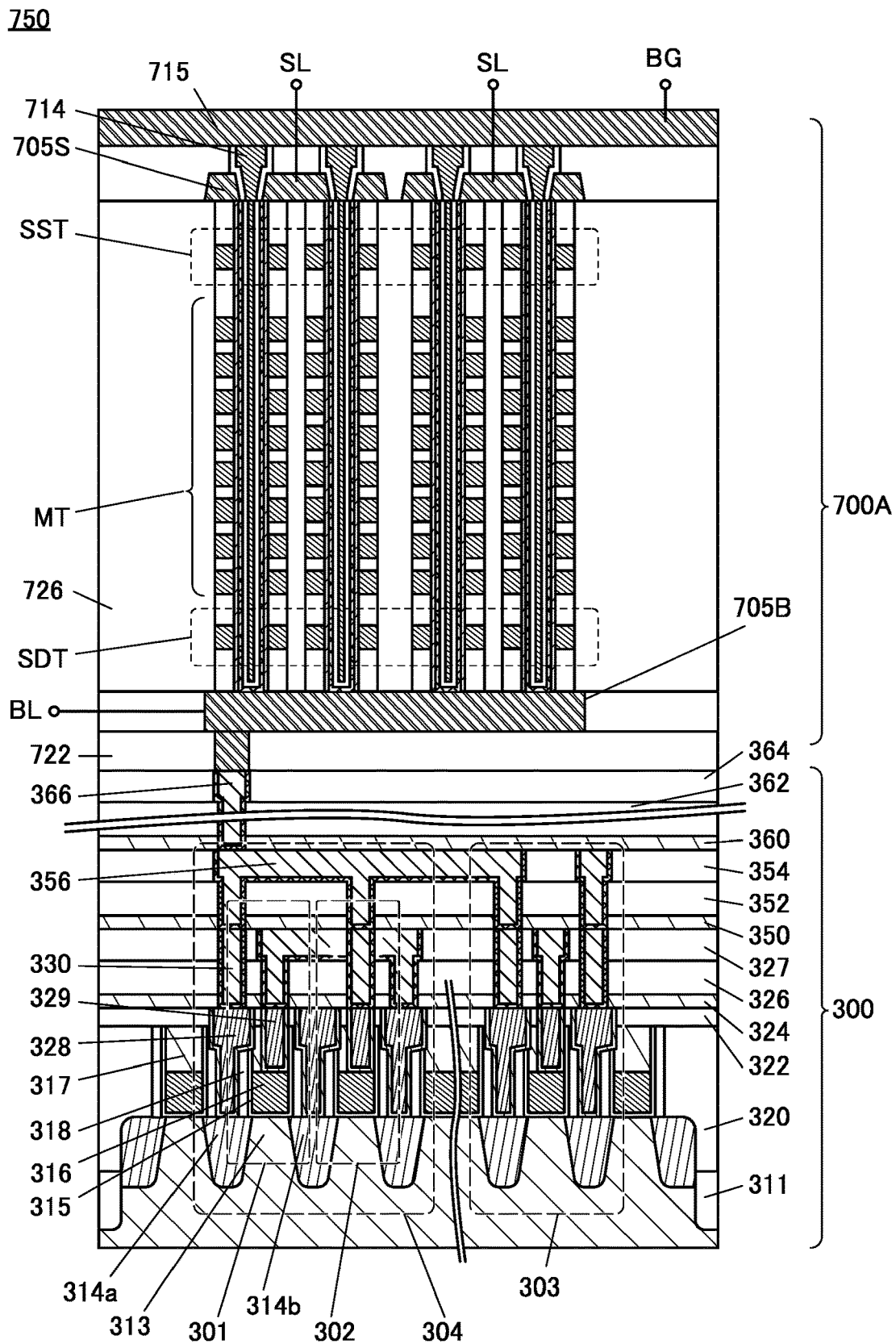
FIG. 6 is a cross-sectional view illustrating an example of a semiconductor device.

FIG. 5 illustrates an example of the memory cell array 700A including the U-shaped memory string in which the two columnar oxides 704 are electrically connected to each other through the conductor 706; however, the present invention is not limited to this example. In FIG. 6, in the columnar oxide 704 including 8 stages of memory transistors MT and the two selection transistors (SDT and SST), the lower end of one columnar oxide 704 is electrically connected to a conductor 705B functioning as the bit line BL and the upper end thereof is electrically connected to a conductor 705S functioning as the source line SL. That is, one memory string is formed of one columnar oxide 704. Although the conductor 705B is electrically connected to the lower ends of four columnar oxides in FIG. 6, the present invention is not limited thereto. One conductor 705B may be electrically connected to one columnar oxide 704, or one conductor 705B may be electrically connected to two or more columnar oxides 704. The conductor 705S is electrically connected to upper ends of two columnar oxides; however, the present invention is not limited thereto. One conductor 705S may be electrically connected to one columnar oxide 704, or one conductor 705S may be electrically connected to two or more columnar oxides 704.

The selection transistor SDT is provided between the conductor 705B and the memory transistor MT and the selection transistor SST is provided between the conductor 705S and the memory transistor MT. Such a structure in which the conductor 705B serving as the bit line BL is electrically connected to the circuit 300 provided under the conductor 705B is preferably used, in which case the number of wirings (lead wirings) and plugs for electrically connecting the memory cell array 700A to the circuit 300 can be reduced and the layout area of the memory device 750 can be reduced. Note that in FIG. 6, 8 stages of the memory transistors MT are stacked; however, the present invention is not limited thereto. The number of stages of memory transistors MT may be greater than or equal to 2 and less than or equal to 7, or may be greater than or equal to 9. For example, 32 stages of memory transistors, 64 stages of memory transistors, 128 stages of memory transistors, or 200 or more stages of memory transistors may be stacked.

<<Metal Oxide>>

A metal oxide that can be used for the oxide 704 of the present invention is described below.

The metal oxide preferably contains at least indium or zinc. In particular, indium and zinc are preferably contained. In addition, aluminum, gallium, yttrium, tin, or the like is preferably contained. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, the element M, and zinc, is considered. The element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium. Note that a plurality of the above elements may be used in combination as the element M in some cases.

Note that in this specification and the like, a metal oxide containing nitrogen is also collectively referred to as a metal oxide in some cases. A metal oxide containing nitrogen may be referred to as a metal oxynitride.

[Composition of Metal Oxide]

The composition of a CAC (Cloud-Aligned Composite)-OS that can be used in a transistor disclosed in one embodiment of the present invention is described below.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used for a channel formation region of a transistor, the transistor in the on state can achieve high current driving capability, that is, a high on-state current and high field-effect mobility.

In other words, the CAC-OS or the CAC-metal oxide can also be referred to as a matrix composite or a metal matrix composite.

[Structure of Metal Oxide]

An oxide semiconductor (metal oxide) is classified into a single crystal oxide semiconductor and a non-single-crystal oxide semiconductor. Examples of the non-single-crystal oxide semiconductors include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

Oxide semiconductors might be classified in a manner different from the above-described one when classified in terms of the crystal structure. The classification of the crystal structures of oxide semiconductor is explained with FIG. 7A. FIG. 7A is a diagram showing the classification of crystal structures of an oxide semiconductor, typically IGZO (a metal oxide containing In, Ga, and Zn).

As shown in FIG. 7A, IGZO is roughly classified into Amorphous, Crystalline, and Crystal. Amorphous includes completely amorphous structure. Crystalline includes CAAC (c-axis-aligned crystalline), nc (nanocrystalline), and CAC (Cloud-Aligned Composite). Crystal includes single crystal and poly crystal.

Note that the structure shown in the thick frame in FIG. 7A is a structure that belongs to new crystalline phase. This structure is positioned in a boundary region between Amorphous and Crystal. In other words, Amorphous, which is energetically unstable, and Crystalline are completely different structures.

A crystal structure of a film or a substrate can be analyzed with X-ray diffraction (XRD) images. Here, XRD spectra of quartz glass and IGZO, which has a crystal structure classified into Crystalline (also referred to as Crystalline IGZO), are shown in FIG. 7B and FIG. 7C. FIG. 7B shows an XRD spectrum of quartz glass and FIG. 7C shows an XRD spectrum of crystalline IGZO. Note that the crystalline IGZO shown in FIG. 7C has a composition of In:Ga:Zn=4:2:3 [atomic ratio]. Furthermore, the crystalline IGZO shown in FIG. 7C has a thickness of 500 nm.

As indicated by arrows in FIG. 7B, the XRD spectrum of the quartz glass shows a substantially symmetrical peak. In contrast, as indicated by arrows in FIG. 7C, the XRD spectrum of the crystalline IGZO shows an asymmetrical peak. The asymmetrical peak of the XRD spectrum clearly shows the existence of crystal. In other words, the structure cannot be regarded as Amorphous unless it has a bilaterally symmetrical peak in the XRD spectrum.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary cannot be observed in the CAAC-OS; thus, it can be said that a reduction in electron mobility due to the crystal grain boundary is less likely to occur. Furthermore, entry of impurities, formation of defects, or the like might decrease the crystallinity of a metal oxide, which means that the CAAC-OS is a metal oxide having small amounts of impurities and defects (e.g., oxygen vacancies (Vo)). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Transistor Including Metal Oxide]

Next, the case where the above metal oxide is used in a channel formation region of a transistor is described.

Note that when the above metal oxide is used in a channel formation region of a transistor, a transistor having high field-effect mobility can be achieved. In addition, a transistor having high reliability can be achieved.

Here, an example of the hypothesis about electric conduction of a metal oxide is described.

Electric conduction in a solid is inhibited by a scattering source called a scattering center. For example, it is known that in the case of single crystal silicon, lattice scattering and ionized impurity scattering are main scattering centers. In other words, in the elemental state with few lattice defects and impurities, the carrier mobility is high because there is no factor that inhibits the electric conduction in the solid.

The above presumably applies to a metal oxide. For example, it is probable that a metal oxide containing less oxygen than oxygen in the stoichiometric composition has many oxygen vacancies Vo. Atoms around the oxygen vacancies are located in places shifted from those in the elemental state. This distortion due to the oxygen vacancies might become a scattering center.

Furthermore, a metal compound containing more oxygen than oxygen in the stoichiometric composition contains excess oxygen, for example. Excess oxygen existing in a liberated state in the metal compound becomes $O^-$ or $O^{2-}$ by receiving an electron. Excess oxygen that has become $O^-$ or $O^{2-}$ might be a scattering center.

According to the above, it is probable that in the case where the metal oxide has an elemental state containing oxygen in the stoichiometric composition, the carrier mobility is high.

Since crystals of an indium-gallium-zinc oxide (hereinafter, IGZO) that is a kind of metal oxide containing indium, gallium, and zinc tend not to grow particularly in the air and thus, a stable structure is obtained in some cases when IGZO is formed of smaller crystals (e.g., the above-described nanocrystals) rather than larger crystals (here, crystals with a size of several millimeters or several centimeters). This is probably because connection of small crystals, rather than formation of large crystals, leads to a reduction in distortion energy.

Note that in a region where small crystals are connected to each other, defects are formed in some cases to reduce the distortion energy of the region. Thus, when the distortion energy is reduced without formation of a defect in the region, the carrier mobility can be increased.

A metal oxide with a low carrier concentration is preferably used for the transistor. In order to reduce the carrier concentration of the metal oxide film, the concentration of impurities in the metal oxide film is reduced so that the density of defect states can be reduced. In this specification and the like, a state with a low impurity concentration and a low density of defect states is referred to as a highly purified intrinsic or substantially highly purified intrinsic state. For example, the carrier concentration of the metal oxide is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

Moreover, a highly purified intrinsic or substantially highly purified intrinsic metal oxide film has a low density of defect states and accordingly may have a low density of trap states.

Charges trapped by the trap states in the metal oxide take a long time to be released and may behave like fixed charges. Thus, a transistor whose channel formation region includes a metal oxide having a high density of trap states has unstable electrical characteristics in some cases.

Accordingly, in order to obtain stable electrical characteristics of the transistor, it is effective to reduce the impurity concentration in the metal oxide. In addition, in order to reduce the impurity concentration in the metal oxide, the impurity concentration in an adjacent film is also preferably reduced. Examples of impurities include hydrogen, nitrogen, an alkali metal, an alkaline earth metal, iron, nickel, and silicon.

[Impurities]

Here, the influence of each impurity in the metal oxide is described.

When silicon or carbon that is a Group 14 element is contained in the metal oxide, defect states are formed in the metal oxide. Thus, the concentration of silicon or carbon in the metal oxide and the concentration of silicon or carbon near an interface with the metal oxide (the concentration measured by secondary ion mass spectrometry (SIMS)) are set to lower than or equal to $2\times10^{18}$ atoms/cm$^3$, preferably lower than or equal to $2\times10^{17}$ atoms/cm$^3$.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS is set lower than or equal to $1\times10^{18}$ atoms/cm$^3$, preferably lower than or equal to $2\times10^{16}$ atoms/cm$^3$.

Furthermore, when containing nitrogen, the metal oxide easily becomes n-type by generation of electrons serving as carriers and an increase in carrier concentration. As a result, a transistor using a metal oxide containing nitrogen for its channel formation region is likely to have normally-on characteristics. Thus, nitrogen in the channel formation region of the metal oxide is preferably reduced as much as possible. For example, the nitrogen concentration in the metal oxide is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$ in SIMS.

Hydrogen contained in a metal oxide reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using a metal oxide containing hydrogen is likely to have normally-on characteristics. Accordingly, hydrogen in the metal oxide is preferably reduced as much as possible. Specifically, the hydrogen concentration of the metal oxide obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When a metal oxide whose impurities are sufficiently reduced is used in a channel formation region of a transistor, the off-state current of the transistor can be reduced and stable electrical characteristics can be provided.

<Manufacturing Method of Memory Cell>

Next, one embodiment of a manufacturing method of the memory transistor MT that functions as a memory cell of the present invention is described with reference to FIG. 8 to FIG. 12. Note that FIG. 8 to FIG. 12 are cross-sectional views illustrating a manufacturing process of the memory transistor MT.

Figure 8A:
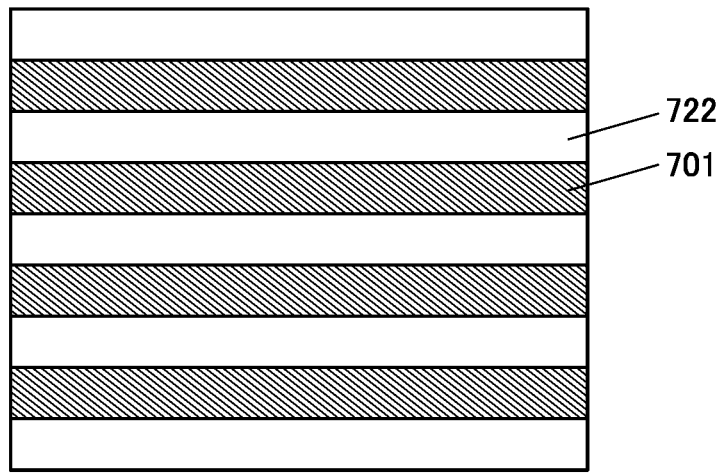
FIG. 8A and FIG. 8B are cross-sectional views illustrating an example of manufacturing steps of a semiconductor device.

First, as illustrated in FIG. 8A, the conductors 701 and the insulators 722 are alternately stacked.

Figure 8B:
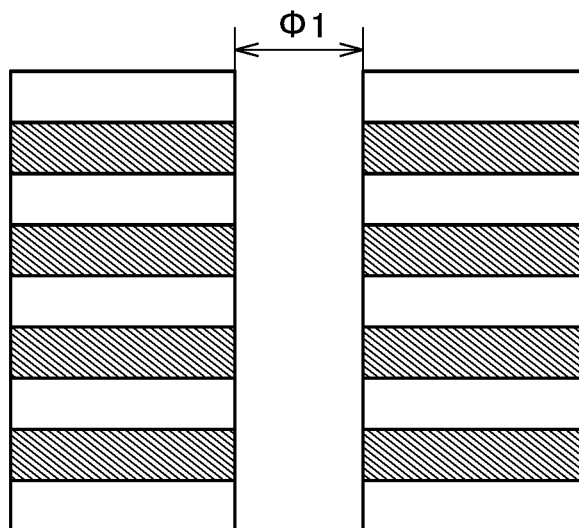

Then, as illustrated in FIG. 8B, the conductors 701 and the insulators 722 are processed to form an opening with a diameter of φ1 in the conductors 701 and the insulators 722.

Figure 9A:
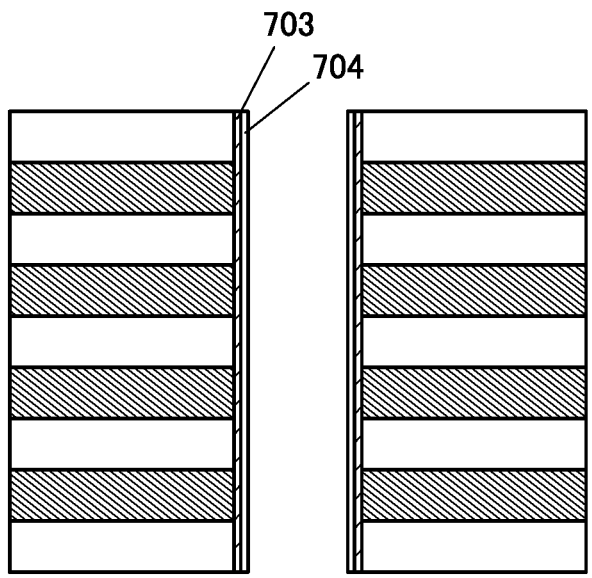
FIG. 9A, FIG. 9B, and FIG. 9C are cross-sectional views illustrating an example of manufacturing steps of a semiconductor device.

Next, as illustrated in FIG. 9A, the insulator 703 and the oxide 704 are formed in the opening with a diameter of φ1. Although not illustrated in FIG. 9A, the insulator 703 is formed by stacking the insulator 703a, the insulator 703b, and the insulator 703c in this order. The oxide 704 is formed by stacking the oxide 704a, the oxide 704b, and the oxide 704c in this order. Before the oxide 704 is formed, the insulator 703 in the bottom portion of the opening is preferably removed. The insulator 703a is formed in contact with a side surface of the conductor 701 and a side surface of the insulator 722, with high coverage.

Figure 9B:
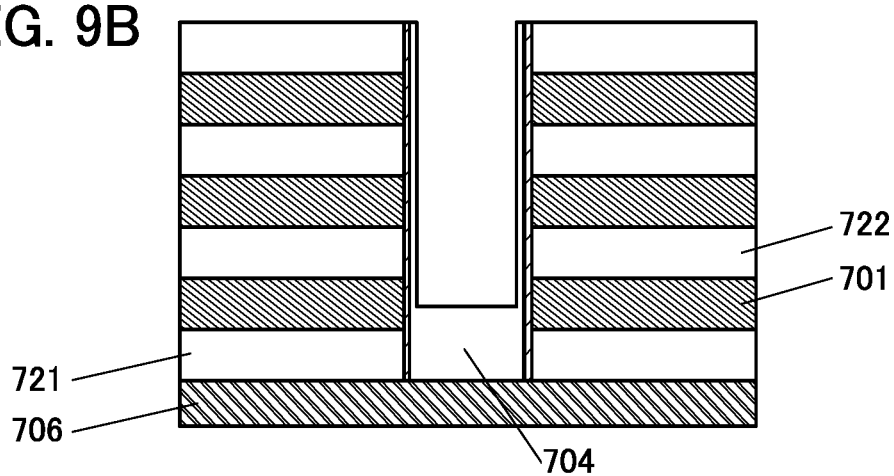
Figure 9C:
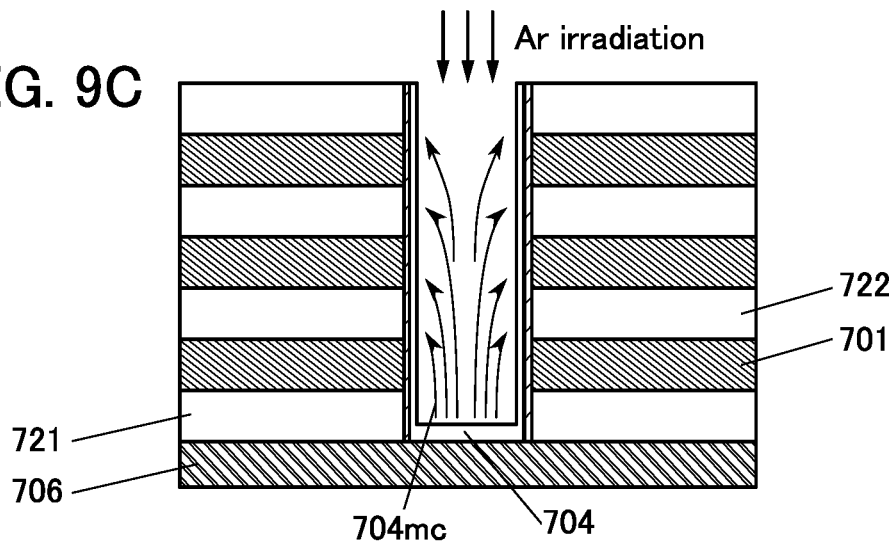

In the case where the oxide 704 is formed in the opening with a diameter of φ1, the oxide 704 is formed thicker over the conductor 706 at the bottom portion of the opening than on the side surface of the opening as illustrated in FIG. 9B in some cases. In this case, reverse sputtering treatment may be used after the formation of the oxide 704. Note that in this specification and the like, the reverse sputtering treatment refers to treatment in which a voltage is applied to the substrate side with the use of an RF (Radio Frequency) power source and plasma is generated in the vicinity of the substrate to modify the surface. For the stack illustrated in FIG. 9B, for example, Ar irradiation is performed on the bottom portion of the opening using reverse sputtering treatment in which an Ar gas or the like is introduced, so that metal components 704mc of the oxide 704 that are formed at the bottom portion of the opening can be sputtered, and the metal components 704mc can be formed on the side surface of the opening (FIG. 9C).

Figure 10A:
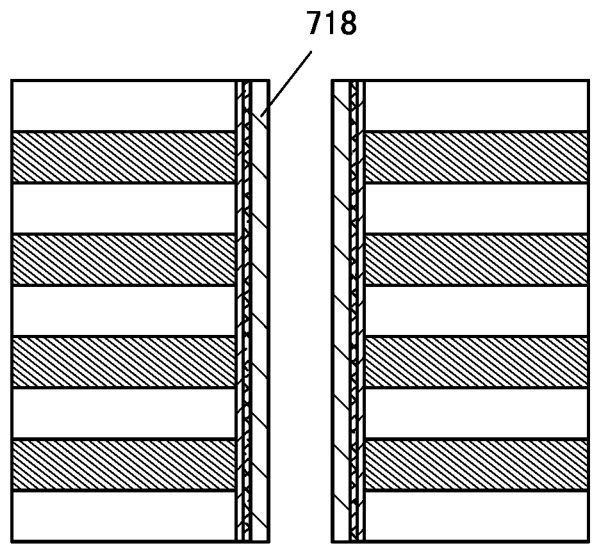
FIG. 10A and FIG. 10B are cross-sectional views illustrating an example of manufacturing steps of a semiconductor device.
Figure 10B:
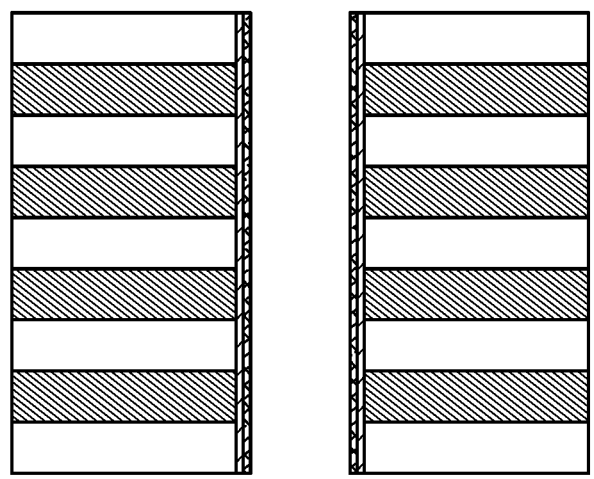

Note that as illustrated in FIG. 10A, a film 718 is formed in contact with the oxide 704 to increase or decrease the resistance of the oxide 704. In the case of increasing the resistance of the oxide 704, a film having a property of absorbing hydrogen is used as the film 718. In the case of decreasing the resistance of the oxide 704, a film having a property of supplying impurities such as hydrogen or nitrogen (for example, a metal film, an oxide film containing a metal element, or a nitride film containing a metal element) is used as the film 718. Furthermore, at this time, heat treatment may be performed as necessary. After the resistance of the oxide 704 is increased or decreased, the film 718 may be removed as illustrated in FIG. 10B.

Note that as for the above heat treatment, for example, when the heat treatment that can be performed after the insulator 721 and the insulator 726 are formed and before the insulator 717 is formed is performed, impurities (typically, water or hydrogen) that can be contained in the oxide 704 can be removed. Alternatively, the heat treatment may be performed after, for example, the insulator 721, the insulator 726, and the insulator 717 are formed or may be performed before and after the formation of the insulator 717. When the heat treatment is performed, a structure of a combination of aluminum oxide and silicon nitride is preferable for the insulator 721, the insulator 726, and the insulator 717.

Note that aluminum oxide has a function of capturing hydrogen or fixing hydrogen. Silicon nitride has a function of having a high hydrogen blocking property. When a stack having the above two functions is used for the insulator 721, the insulator 726, and the insulator 717, hydrogen can be removed efficiently. Specifically, for example, in the case where silicon nitride having a high hydrogen blocking property is used for the insulator 703b included in the insulator 703, hydrogen contained in the oxide 704 is diffused into the insulator 703c and the insulator 711 and reaches the insulator 717. At this time, in the case where the insulator 717 is a stack having the above two functions, the insulator 717 can capture or fix hydrogen diffused from the oxide 704 into the insulator 703c and the insulator 711. For example, in the case where the insulator 703 does not have a hydrogen blocking property, a structure of a combination of aluminum oxide and silicon nitride is used for the insulator 721 and the insulator 726, hydrogen can be extracted efficiently from the oxide 704. Moreover, the insulator 721 preferably contains excess oxygen.

Note that hydrogen existing in the oxide 704 is diffused into another structure body through the insulator 703c and the insulator 711, which are in contact with the oxide 704, and the insulator 717. Specifically, excess oxygen in the insulator 703c and the insulator 711 reacts with hydrogen in the oxide 704 to form an OH bond, and the hydrogen atom is diffused into the insulator 703c and the insulator 711. When a hydrogen atom having an OH bond reaches a material having a function of capturing or fixing hydrogen (for example, aluminum oxide), the hydrogen atom reacts with an oxygen atom bonded to a metal atom in aluminum oxide and is captured or fixed in the insulator 717 in some cases. Furthermore, a hydrogen atom having an OH bond that is not captured or fixed in the insulator 717 is diffused into the insulator 722, the insulator 724, and the like through the insulator 703 in some cases. In this case, hydrogen passes through the insulator 722 and the insulator 724 and is captured or fixed by the insulator 726. The oxygen atom of the excess oxygen that has an OH bond probably remains as the excess oxygen in the insulator 703c and the insulator 711. That is, the excess oxygen in the insulator 703c and the insulator 711 highly probably acts as a bridge in the hydrogen diffusion.

Note that the above heat treatment is preferably performed at 350° C. or higher, further preferably 400° C. or higher under an atmosphere containing oxygen, an atmosphere containing nitrogen, or a mixed atmosphere of oxygen and nitrogen. Furthermore, the heat treatment time is one hour or more, preferably four hours or more, further preferably eight hours or more.

Note that the film 718 is not necessarily removed. In the case where the film 718 is an insulator or is oxidized by oxygen absorbed from the oxide 704 to be an insulator, for example, the film may remain. In that case, the film may serve as a second gate insulating layer like the insulator 711.

In the case of decreasing the resistance of the oxide 704, the film 718 preferably has at least one of a function of supplying hydrogen to the oxide 704, a function of supplying nitrogen to the oxide 704, and a function of extracting oxygen from the oxide 704. The film 718 having such a function is in contact with the oxide 704, whereby carriers are generated in the oxide 704.

Specifically, oxygen is extracted from the oxide 704, whereby oxygen vacancies are generated in the oxide 704. When hydrogen is trapped by these oxygen vacancies, carriers are generated. Alternatively, in the case where nitrogen is trapped by these oxygen vacancies, nitrogen is substituted for oxygen bonded to two indium atoms. When nitrogen is bonded to these two indium atoms, it is probable that nitrogen has an unpaired electron and serves as a carrier.

As the material having a function of supplying hydrogen to the oxide 704, silicon nitride containing hydrogen can be used. Furthermore, a material formed using a gas containing hydrogen when the material is formed can be used. For example, silicon, silicon oxide, silicon oxynitride, silicon nitride oxide, or the like formed using monosilane, disilane, ammonia, or the like can be used. As the material having a function of supplying nitrogen to the oxide 704, a nitride containing silicon or a metal element can be used. As such a material, silicon nitride, silicon nitride oxide, silicon oxynitiride, or the like can be used. Alternatively, a nitride containing one or more of aluminum, tantalum, and titanium can be used. Specifically, aluminum nitride, tantalum nitride, titanium nitride, a nitride containing aluminum and tantalum, a nitride containing aluminum and titanium, or the like can be used.

For example, the film 718 is preferably formed to have a thickness of greater than or equal to 0.5 nm and less than or equal to 5 nm, preferably greater than or equal to 1 nm and less than or equal to 2 nm. When aluminum having a thickness of greater than or equal to 0.5 nm and less than or equal to 5 nm is oxidized by heat treatment, for example, aluminum oxide having a thickness of greater than or equal to 0.7 nm and less than or equal to 8 nm may be formed. Note that in the case where heat treatment is performed in the oxidation atmosphere, such heat treatment is preferably performed after carrying out, in an atmosphere containing nitrogen, another heat treatment that is performed in a state where the oxide 704 is in contact with the metal film, the oxide film containing a metal element, or the nitride film containing a metal element. When the heat treatment is performed in an atmosphere containing nitrogen once, oxygen in the oxide 704 is easily diffused into the metal film, the oxide film containing a metal element, or the nitride film containing a metal element.

After the film 718 containing any one of a metal element, hydrogen, and nitrogen is provided in contact with the oxide 704, heat treatment is preferably performed. The heat treatment is performed, whereby extraction of oxygen, supply of hydrogen, or supply of nitrogen is promoted, and the resistance of part of the oxide 704 can be efficiently decreased.

As described above, when the resistance of the oxide 704 is decreased, in the memory string or memory cell array where the memory cells are stacked, the series resistance between the memory cells can be reduced.

Figure 11A:
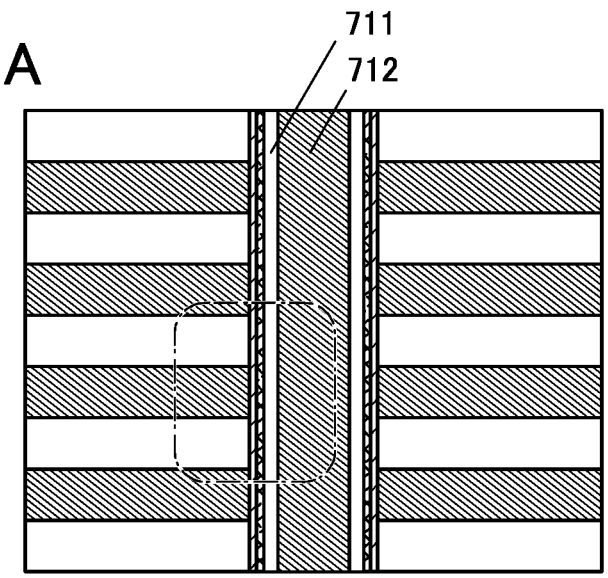
FIG. 11A and FIG. 11B are cross-sectional views illustrating an example of a manufacturing step of a semiconductor device.
Figure 11B:
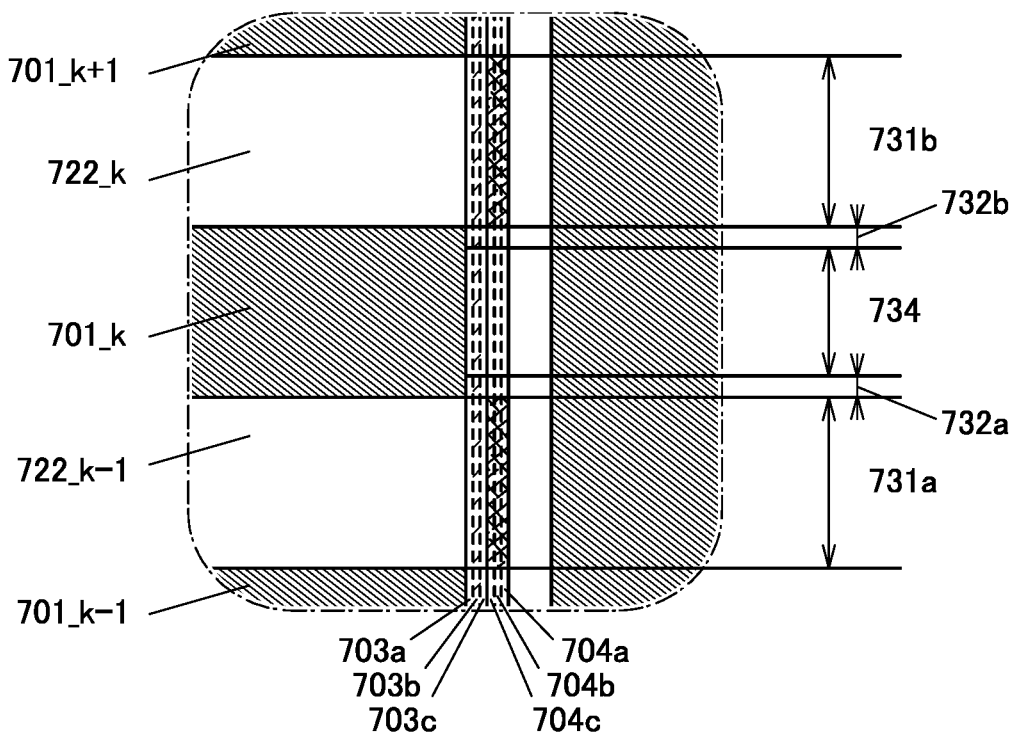

Next, the insulator 711 is formed on the inner side of the oxide 704, and the conductor 712 is formed on the inner side of the insulator 711 (see FIG. 11A). Note that in the case where the film 718 is not removed in the previous step, the film 718 may be treated as the insulator 711, or the insulator 711 may be formed on the inner side of the film 718. In addition, FIG. 11B is an enlarged view of a portion surrounded by the dashed-dotted line in FIG. 11A, and illustrates a cross section of the conductor 701_k–1 and the insulator 722_k–1 in the k–1-th stage, the conductor 701_k and the insulator 722_k in the k-th stage, and the conductor 701_k+1 in the k+1-th stage (k is an integer of greater than or equal to 2 and less than or equal to m–1).

The region 734 of the oxide 704 serves as a channel formation region of the memory transistor MT in the k-th stage. A region 731a serves as one of a source and a drain of the memory transistor MT in the k-th stage and a region 731b serves as the other of the source and the drain of the memory transistor MT in the k-th stage. The conductor 701_k serves as a first gate of the memory transistor MT in the k-th stage, the conductor 712 serves as a second gate, the insulator 703a serves as a first gate insulating layer, the insulator 703b serves as a charge accumulation layer, the insulator 703c serves as a tunnel insulating layer, and the insulator 711 serves as a second gate insulating layer. Note that the source or the drain of the memory transistor MT in which the conductor 701_k serves as a gate may serve as a drain or a source in the transistor positioned over or under the memory transistor MT. For example, when the region 731b serves as a source of a transistor in which the conductor 701_k serves as a gate, the region 731b may serve as a drain of a transistor in which the conductor 701_k+1 serves as a gate. Moreover, a region 732a and a region 732b may function as channel formation regions like the region 734, or may function as a source and a drain like the region 731a and the region 731b.

Through the above steps, the memory transistor MT functioning as a memory cell can be formed. By the above method, the memory transistors MT in a plurality of layers can be formed at a time without performing patterning for forming the memory transistors MT for each layer. Furthermore, in the case where a memory cell array is formed by the above method, even when the number of layers of the memory transistors MT is increased, the number of steps of patterning and etching of the memory transistors MT is not increased. In this manner, the number of manufacturing steps of the memory cell array can be reduced; thus, a semiconductor device with high productivity can be provided.

Figure 12:
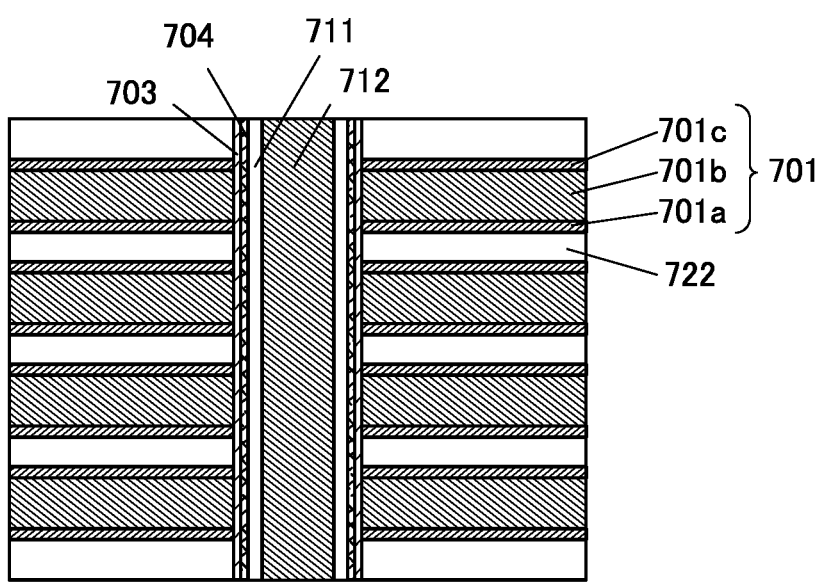
FIG. 12 is a view illustrating an example of a manufacturing step of a semiconductor device.

FIG. 12 illustrates another example of the conductor 701. In FIG. 12, the conductor 701 has a three-layer structure of a conductor 701a, a conductor 701b, and a conductor 701c. Such a shape is preferably used, in which case an electric field from the conductor 701 can be applied to not only the region 734 but also the region 732, and the on-state characteristics of the memory transistor MT is improved.

<Manufacturing Method of Memory Cell Array>

Next, one embodiment of a manufacturing method of a memory cell array of the present invention is described with reference to FIG. 13 to FIG. 29. Note that in each of FIG. 13 to FIG. 29, A of each drawing is a top view seen from the z-axis direction, and B of each drawing is a cross-sectional view of a portion indicated by a dashed-dotted line A1-A2 in A of the corresponding drawing. Furthermore, C of each drawing is a cross-sectional view of a portion indicated by a dashed-dotted line A3-A4 in A of the corresponding drawing. Moreover, FIG. 22D is an enlarged cross-sectional view of a portion surrounded by the dashed-dotted line in FIG.

Figure 13A:
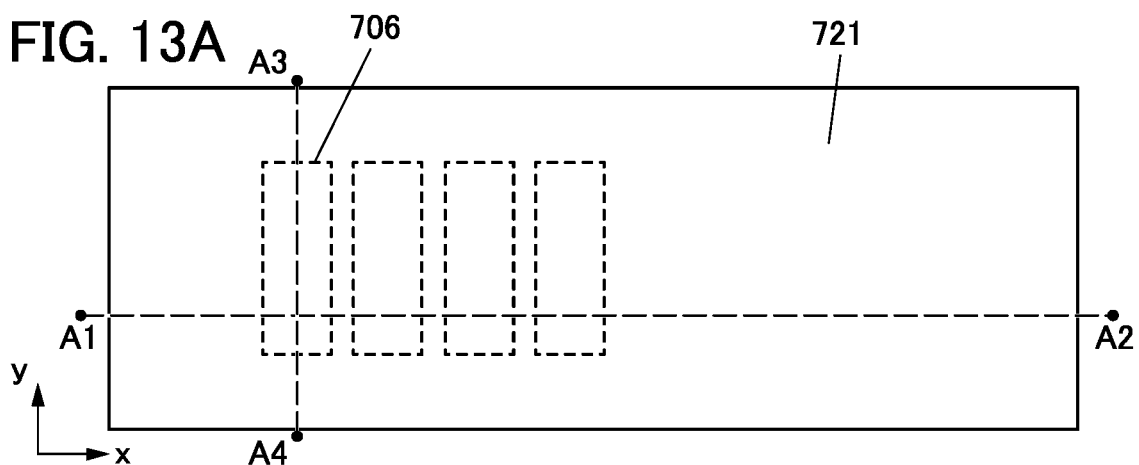
FIG. 13A is a top view illustrating an example of a manufacturing step of a semiconductor device.
Figure 13B:
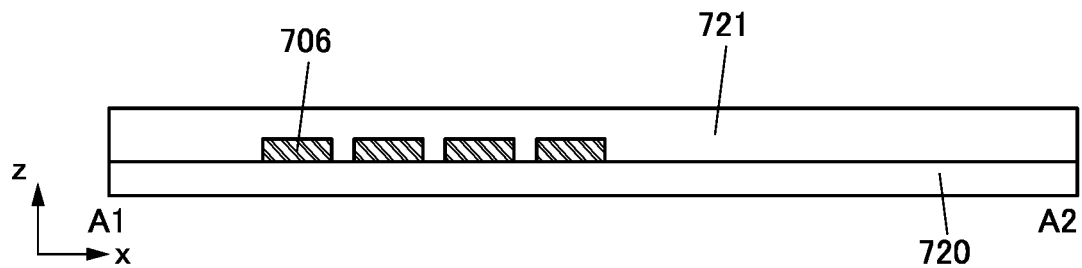
FIG. 13B and FIG. 13C are cross-sectional views illustrating an example of a manufacturing step of a semiconductor device.
Figure 13C:
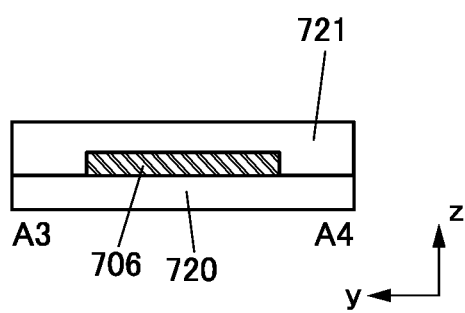

First, the conductor 706 is formed over the base 720 having an insulating surface, and the insulator 721 is formed to cover the conductor 706 (see FIG. 13A to FIG. 13C).

A conductive film is formed and processed by a lithography method, whereby the conductor 706 is formed. Note that the method of forming the conductor 706 and the insulator 721 is not limited thereto. The insulator 721 may be formed over the base 720 and an unnecessary portion of the insulator 721 may be removed to form a groove or an opening, and the conductor 706 may be embedded in the groove or the opening portion. Such a formation method of a conductor is referred to as a damascene method (a single damascene method or a dual damascene method) in some cases. When an insulating film is further formed over the conductor 706 formed by the damascene method and the insulator 721, the structure illustrated in FIG. 13A to FIG. 13C can be obtained.

The conductor 706 and the insulator 721 can be formed by a sputtering method, a chemical vapor deposition (CVD) method, a molecular beam epitaxy (MBE) method, a pulsed laser deposition (PLD) method, an ALD (Atomic Layer Deposition) method, or the like.

Note that the CVD method can be classified into a plasma CVD (PECVD: Plasma Enhanced CVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. In contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

An ALD method is also a deposition method that enables less plasma damage to an object. An ALD method also does not cause plasma damage during deposition, so that a film with few defects can be obtained.

Unlike a deposition method in which particles ejected from a target or the like are deposited, a CVD method and an ALD method are deposition methods in which a film is formed by reaction at a surface of an object to be processed. Thus, a CVD method and an ALD method are deposition methods that enable favorable step coverage almost regardless of the shape of an object to be processed. In particular, an ALD method has excellent step coverage and excellent thickness uniformity and thus is suitable for covering a surface of an opening with a high aspect ratio, for example. On the other hand, an ALD method has a relatively low deposition rate, and thus is preferably used in combination with another deposition method with a high deposition rate, such as a CVD method, in some cases.

A CVD method and an ALD method enable control of the composition of a film to be obtained with the flow rate ratio of the source gases. For example, by a CVD method and an ALD method, a film with a certain composition can be deposited depending on the flow rate ratio of the source gases. Moreover, by a CVD method or an ALD method, by changing the flow rate ratio of the source gases during the deposition, a film whose composition is continuously changed can be deposited. In the case of forming a film while changing the flow rate ratio of the source gases, as compared with the case of forming a film with use of a plurality of deposition chambers, the time taken for the film formation can be shortened because the time taken for transfer and pressure adjustment is omitted. Thus, the productivity of the semiconductor device can be increased in some cases.

Note that in the lithography method, first, a resist is exposed to light through a photomask. Next, a region exposed to light is removed or left using a developer, so that a resist mask is formed. Then, etching treatment through the resist mask is conducted, whereby a conductor, a semiconductor, an insulator, or the like can be processed into a desired shape. The resist mask is formed by, for example, exposure of the resist to KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that the resist mask can be removed by dry etching treatment such as ashing, wet etching treatment, wet etching treatment after dry etching treatment, or dry etching treatment after wet etching treatment.

In addition, a hard mask formed of an insulator or a conductor may be used instead of the resist mask. In the case where a hard mask is used, a hard mask with a desired shape can be formed by forming an insulating film or a conductive film to be the hard mask material over the conductive film, forming a resist mask thereover, and then etching the hard mask material.

For the processing, a dry etching method or a wet etching method can be employed. Processing by a dry etching method is suitable for microfabrication.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may be employed in which different high-frequency powers are applied to one of the parallel plate electrodes. Alternatively, a structure may be employed in which high-frequency powers with the same frequency are applied to the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

In the case where a hard mask is used for etching of the conductive film, the etching treatment may be performed after the resist mask used for formation of the hard mask is removed or with the resist mask left. In the latter case, the resist mask sometimes disappears during the etching. The hard mask may be removed by etching after the etching of the conductive film. Meanwhile, the hard mask is not necessarily removed when the hard mask material does not affect later steps or can be utilized in later steps.

As the conductive film to be the conductor 706, a conductive film containing a metal element is preferably formed by a sputtering method. The conductive film can also be formed by a CVD method.

A surface of the insulator 721 is preferably subjected to planarization treatment as needed. A chemical mechanical polishing (CMP) method or a reflow method can be used as the planarization treatment.

Figure 14A:
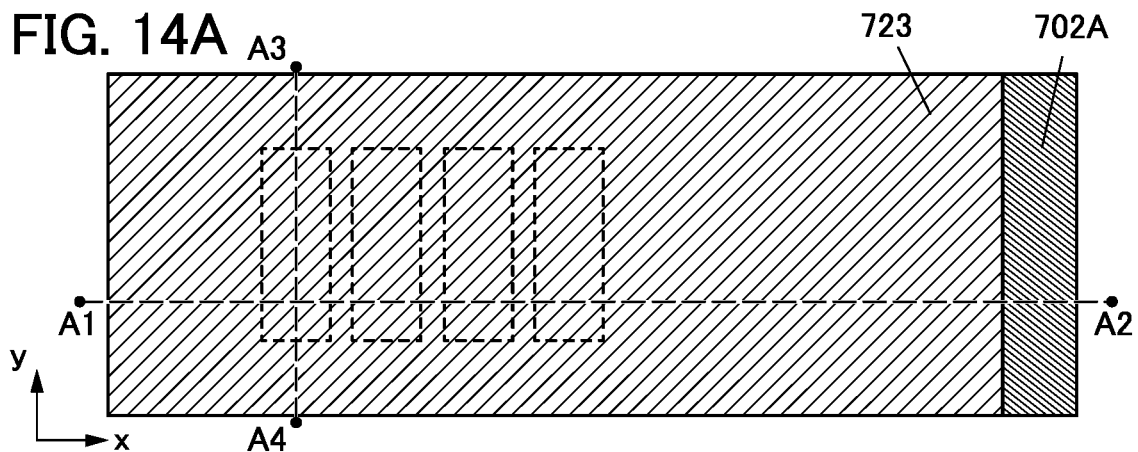
FIG. 14A is a top view illustrating an example of a manufacturing step of a semiconductor device.
Figure 14B:
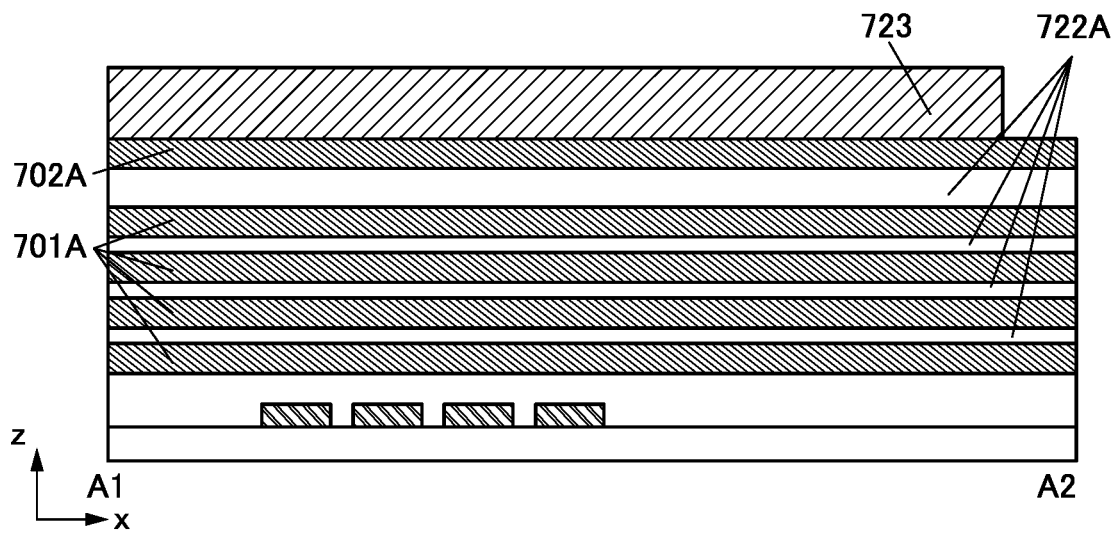
FIG. 14B and FIG. 14C are cross-sectional views illustrating an example of a manufacturing step of a semiconductor device.
Figure 14C:
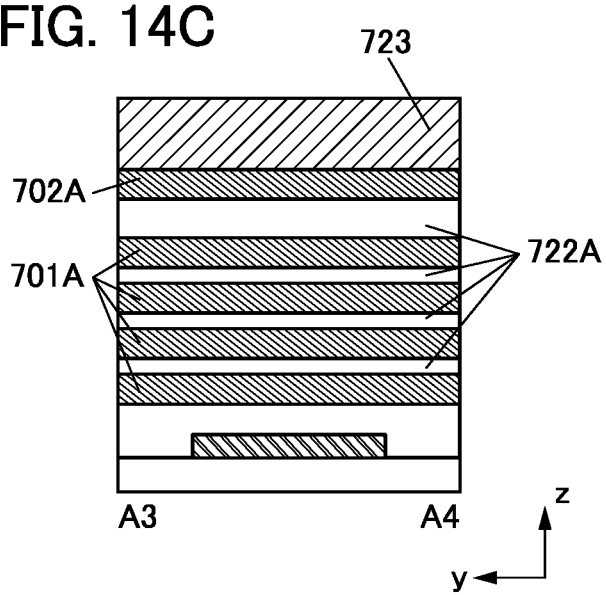

Next, conductive films 701A and insulating films 722A are alternately stacked over the conductor 706 and the insulator 721 (see FIG. 14A to FIG. 14C). This embodiment shows an example in which the conductive film 701A is formed over the insulator 721 and the insulating film 722A is formed over the conductive film 701A; however, the order of the formation is not limited thereto. The insulating film 722A may be formed over the insulator 721, and the conductive film 701A may be formed over the insulating film 722A. A CVD method can be used for the formation of the conductive film 701A and the insulating film 722A. Alternatively, a sputtering method may be used.

Although the conductive films 701A and the insulating films 722A are each formed to have four layers in this embodiment, the number of stacked layers is not limited thereto. Each may be formed to have five or more layers depending on the required performance of the semiconductor device. For example, the conductive films 701A and the insulating films 722A may each be formed to have 32 layers, 64 layers, 128 layers, or 200 or more layers.

A conductive film 702A is formed over the uppermost conductive film 722A. A mask 723 is formed over the conductive film 702A (see FIG. 14A to FIG. 14C). The conductive film 702A can be formed using a method and a material similar to those of the conductive film 701A. Note that the conductive film 702A may be formed by the same method as or a method different from that of the conductive films 701A. As the conductive film 702A, a material that is the same as or different from that of the conductive films 701A may be used.

Figure 15A:
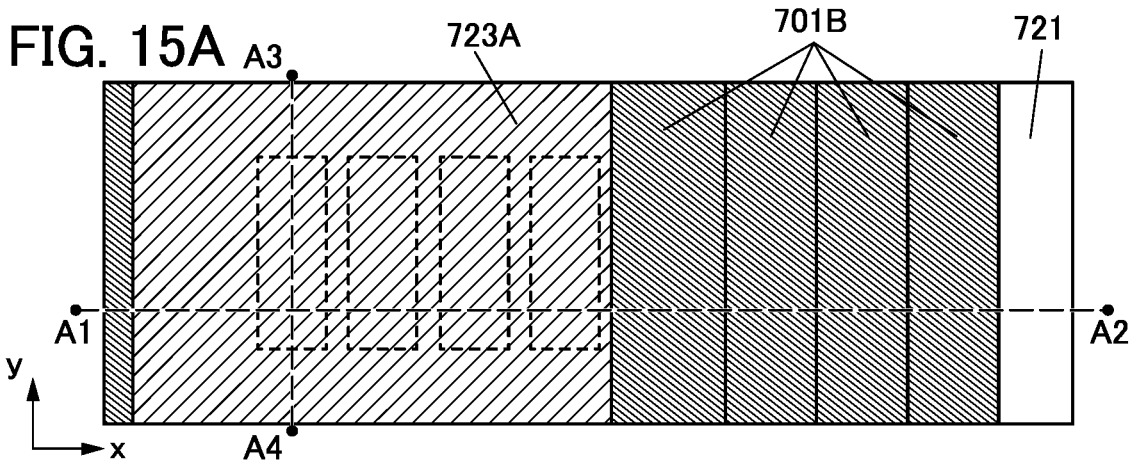
FIG. 15A is a top view illustrating an example of a manufacturing step of a semiconductor device.
Figure 15B:
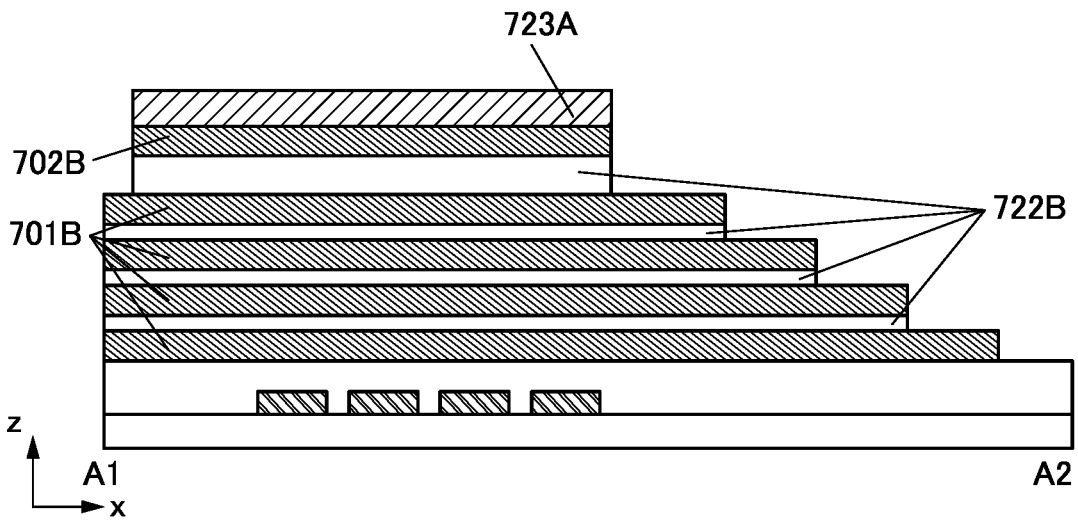
FIG. 15B and FIG. 15C are cross-sectional views illustrating an example of a manufacturing step of a semiconductor device.
Figure 15C:
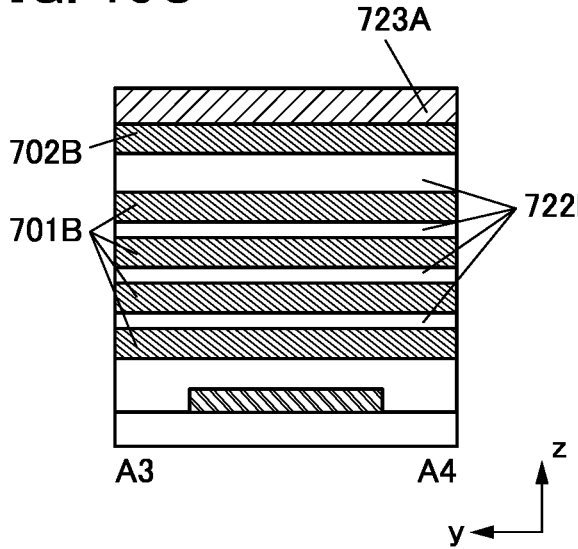
Figure 16A:
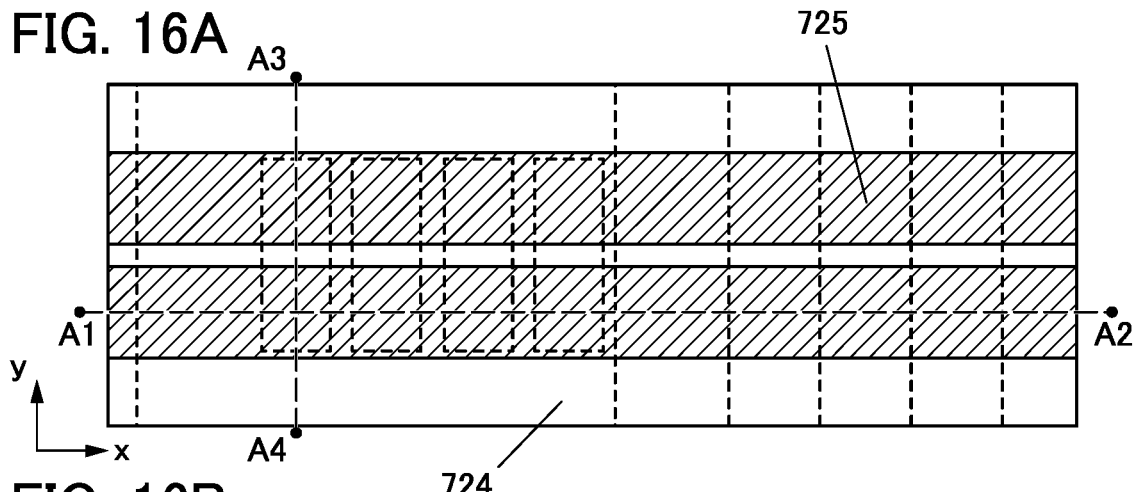
FIG. 16A is a top view illustrating an example of a manufacturing step of a semiconductor device.
Figure 16B:
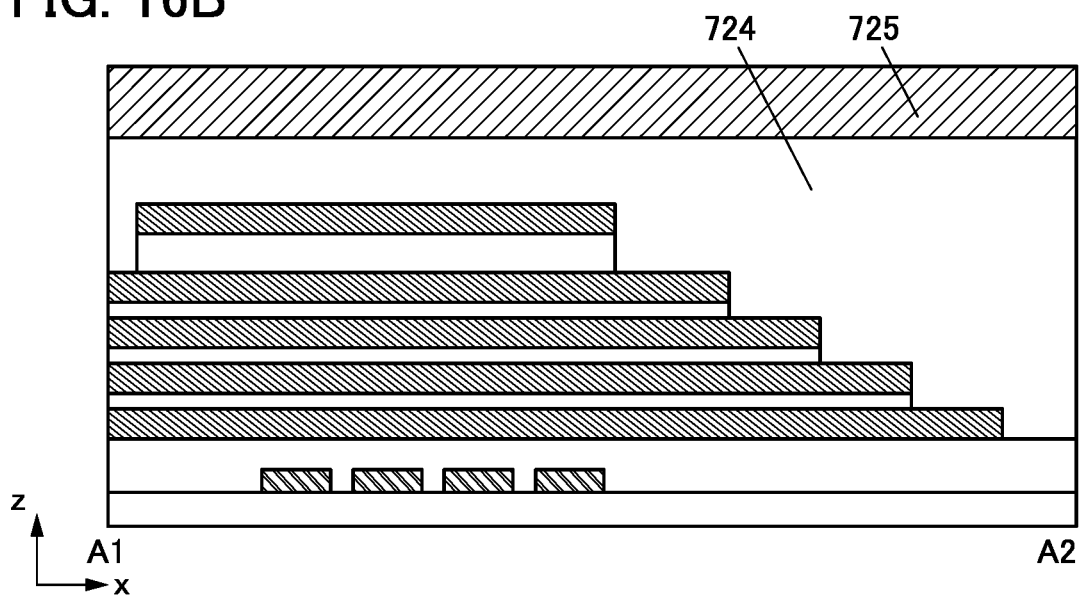
FIG. 16B and FIG. 16C are cross-sectional views illustrating an example of a manufacturing step of a semiconductor device.
Figure 16C:
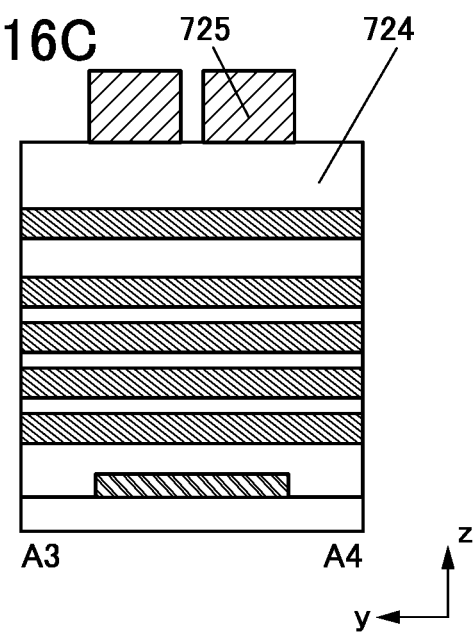
Figure 17A:
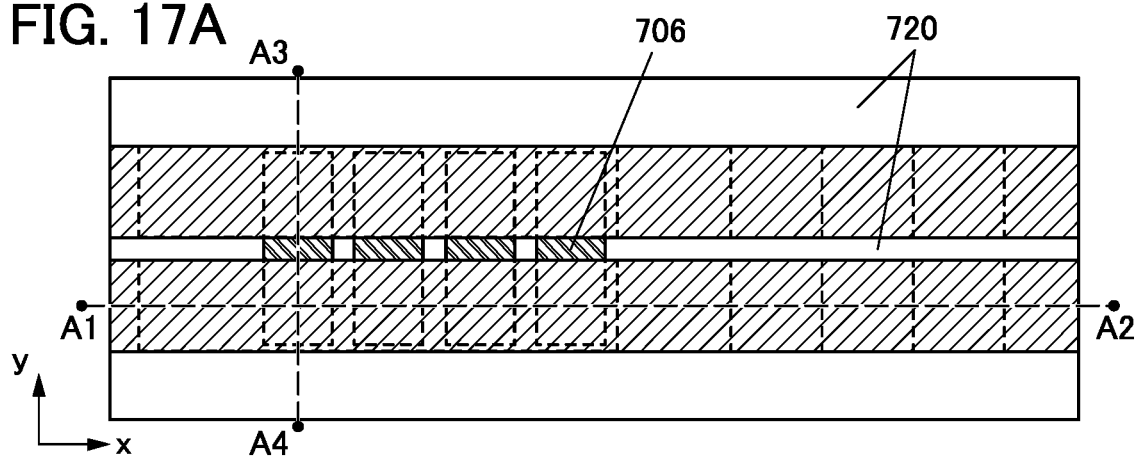
FIG. 17A is a top view illustrating an example of a manufacturing step of a semiconductor device.
Figure 17B:
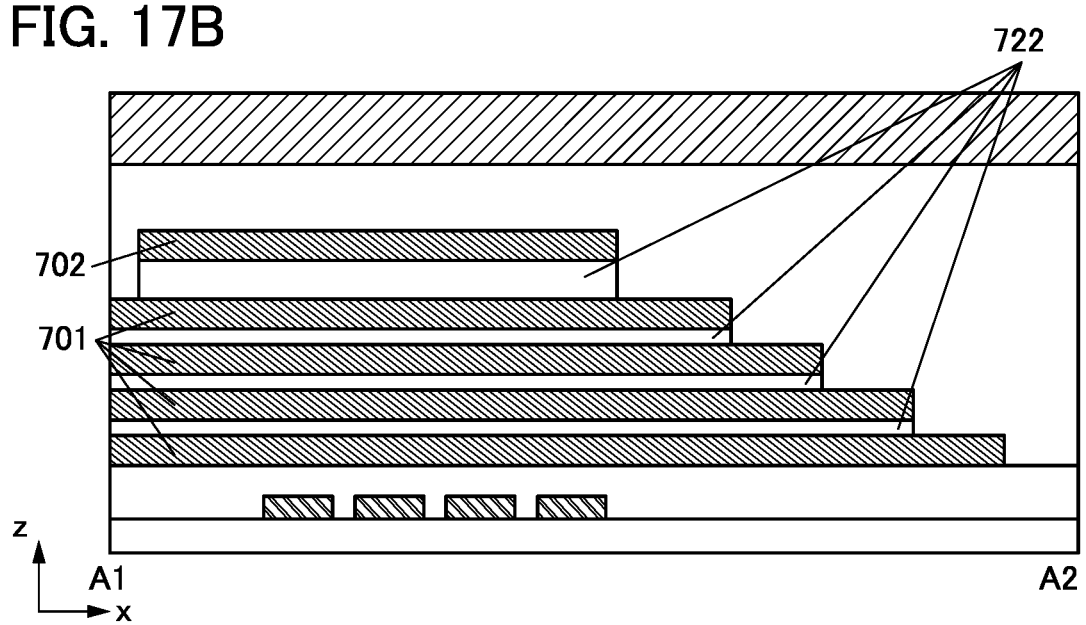
FIG. 17B and FIG. 17C are cross-sectional views illustrating an example of a manufacturing step of a semiconductor device.
Figure 17C:
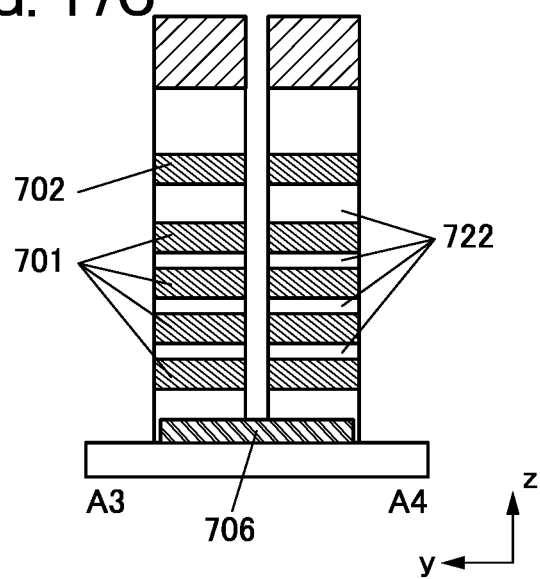
Figure 18A:
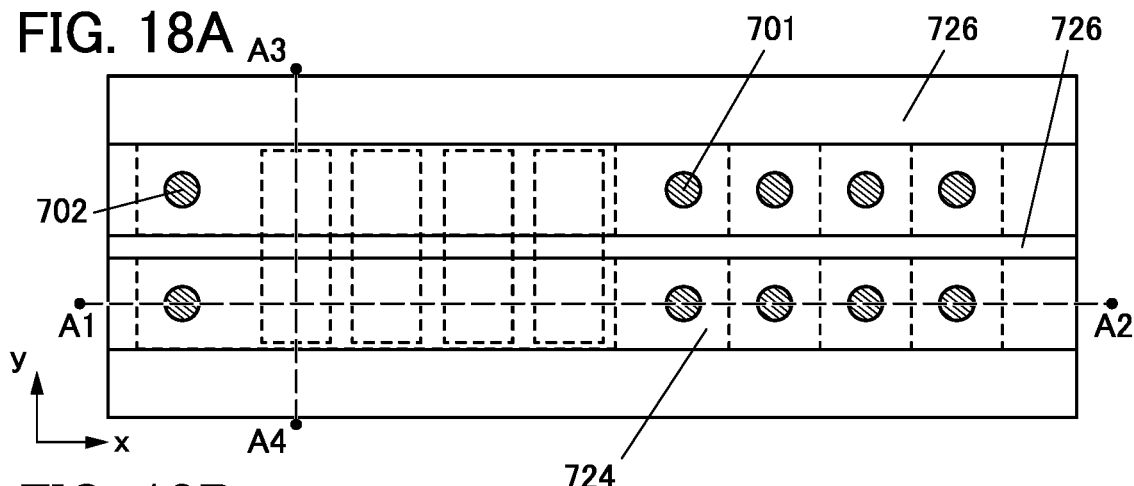
FIG. 18A is a top view illustrating an example of a manufacturing step of a semiconductor device.
Figure 18B:
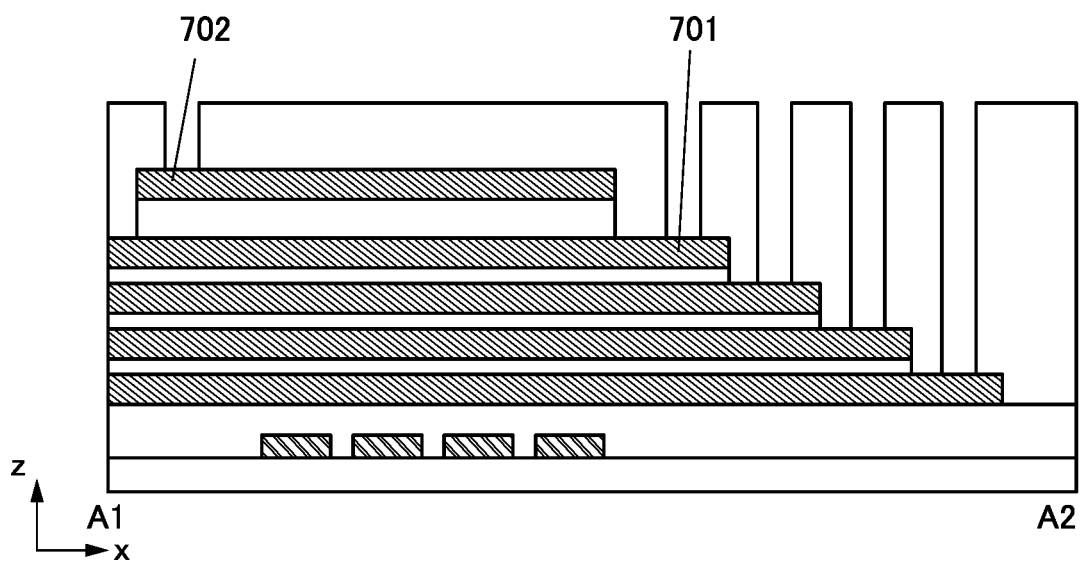
FIG. 18B and FIG. 18C are cross-sectional views illustrating an example of a manufacturing step of a semiconductor device.
Figure 18C:
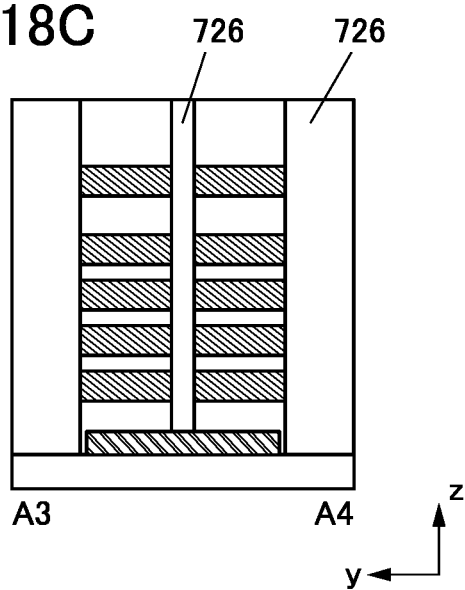

Next, the conductive film 702A, the conductive film 701A, and the insulating film 722A are processed to form a conductive film 701B, a conductive film 702B, and an insulating film 722B which have a step-like shape as illustrated in FIG. 15B. In the processing of the conductive film 702A, the conductive film 701A, and the insulating film 722A, etching of the conductive film 702A, the conductive film 701A, and the insulating film 722A and slimming of the mask 723 are alternately performed, whereby the conductive film 701B, the conductive film 702B, and the insulating film 722B which have a step-like shape can be formed. By the processing of the conductive film 702A, the conductive film 701A, and the insulating film 722A, the mask 723 is reduced in width and thickness to be a mask 723A (see FIG. 15A to FIG. 15C).

Then, the mask 723A is removed, and an insulator 724 is formed. The insulator 724 can be formed by a CVD method. The insulator 724 is preferably subjected to planarization treatment by a CMP method or a reflow method. Next, a mask 725 is formed over the insulator 724. The mask 725 is formed over the planarized insulator 724, whereby the accuracy of lithography is improved (see FIG. 16A to FIG. 16C).

Then, the insulator 724, the conductive film 702B, the conductive film 701B, the insulating film 722B, and the insulator 721 are processed with the mask 725. By the processing, the conductor 701 which functions as the gate of the memory transistor MT and is electrically connected to the word line, and the conductor 702 which functions as the gate of the selection transistor are formed. In addition, by the processing, the insulating film 722B is processed into the insulator 722 (see FIG. 17A to FIG. 17C).

Then, the mask 725 is removed. After that, the insulator 726 is formed to be embedded in the portions in the insulator 724, the conductive film 702B, the conductive film 701B, the insulating film 722B, and the insulator 721, which are removed by the above processing. The insulator 726 can be formed by a CVD method or an ALD method. It is particularly preferable to employ an ALD method, in which case a film with a uniform thickness can be formed even in a groove or an opening portion having a large aspect ratio. Alternatively, the insulator 726 may be formed by a combination of an ALD method and a CVD method. The insulator 726 is preferably subjected to planarization treatment by a CMP method or a reflow method. In the case where the planarization treatment is performed by a CMP method, the insulator 726 may be polished until a surface of the insulator 724 is exposed. Alternatively, the insulator 724 and the insulator 726 may be polished together. In this case, the thickness of the insulator 724 becomes small.

Next, the insulator 724 is processed by a lithography method to form a first opening so that the conductor 701 and the conductor 702 are exposed. The first opening is formed to expose each of the conductors 701 formed in a step-like shape (see FIG. 18A to FIG. 18C).

Figure 19A:
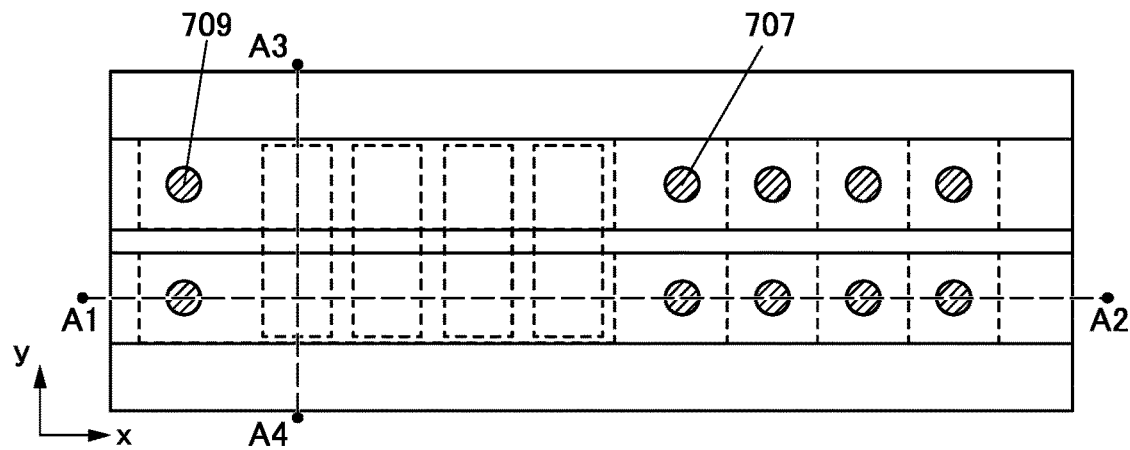
FIG. 19A is a top view illustrating an example of a manufacturing step of a semiconductor device.
Figure 19B:
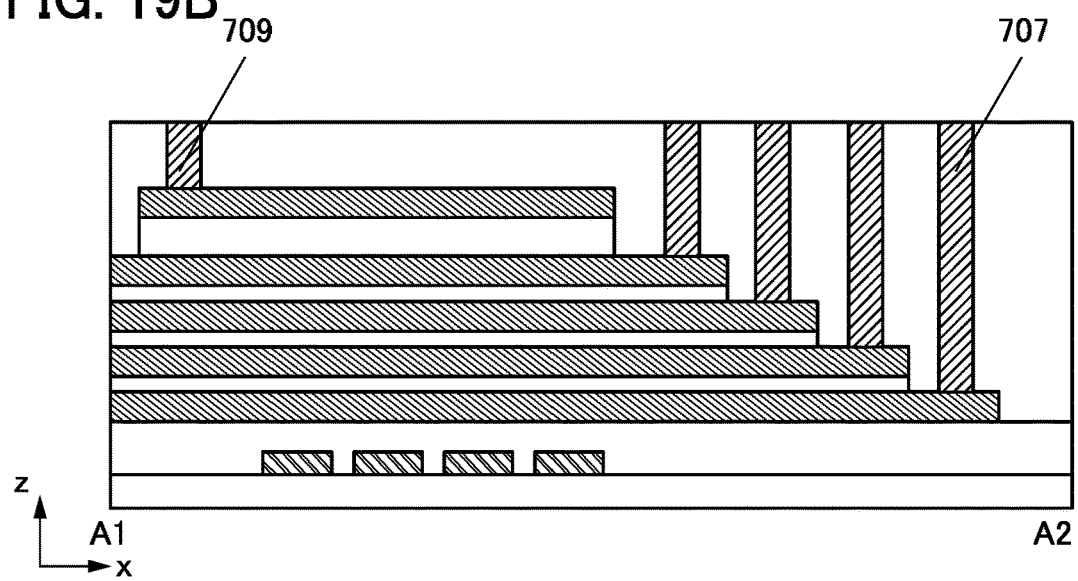
FIG. 19B and FIG. 19C are cross-sectional views illustrating an example of a manufacturing step of a semiconductor device.
Figure 19C:
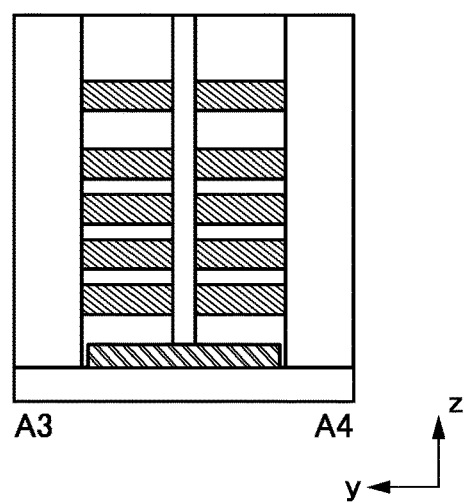

Next, the conductor 707 electrically connected to the conductor 701 and the conductor 709 electrically connected to the conductor 702 are formed to fill the first opening (see FIG. 19A to FIG. 19C). The conductor 707 and the conductor 709 can be formed by a CVD method or an ALD method. It is particularly preferable to employ an ALD method, in which case a film with a uniform thickness can be formed even in a groove or an opening portion having a large aspect ratio. Alternatively, the conductor 707 and the conductor 709 may be formed by a combination of an ALD method and a CVD method. The conductor 707 and the conductor 709 may have a stacked-layer structure composed of a plurality of layers. The conductor 707 and the conductor 709 can be formed in such a manner that a conductive film to be the conductor 707 and the conductor 709 is formed over the insulator 724 and inside the first opening and an unnecessary conductive film is removed by CMP or the like.

Figure 20A:
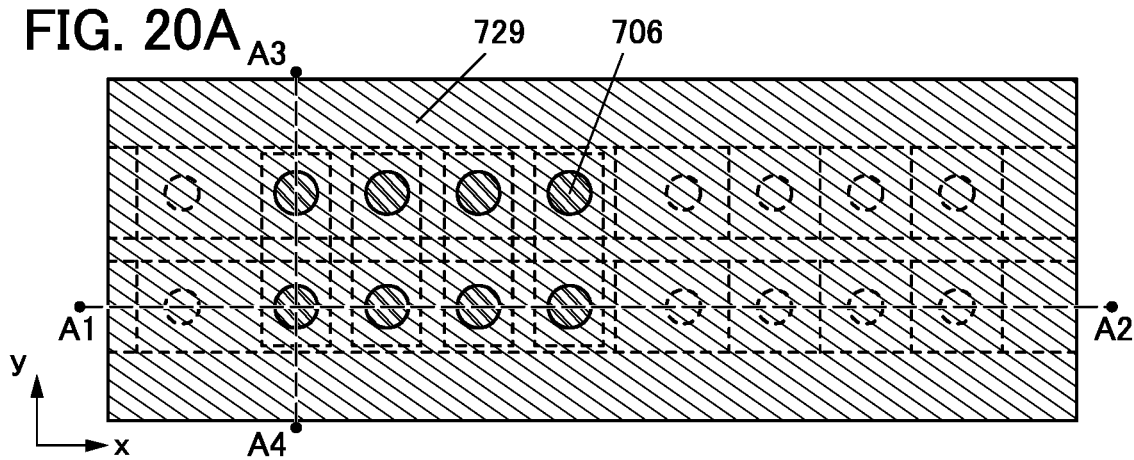
FIG. 20A is a top view illustrating an example of a manufacturing step of a semiconductor device.
Figure 20B:
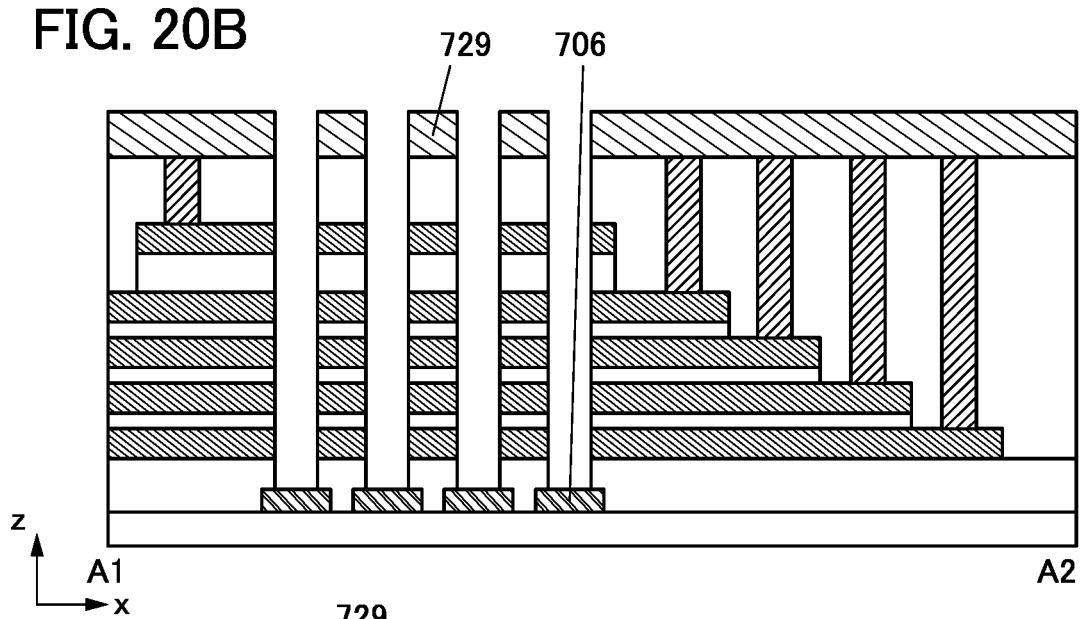
FIG. 20B and FIG. 20C are cross-sectional views illustrating an example of a manufacturing step of a semiconductor device.
Figure 20C:
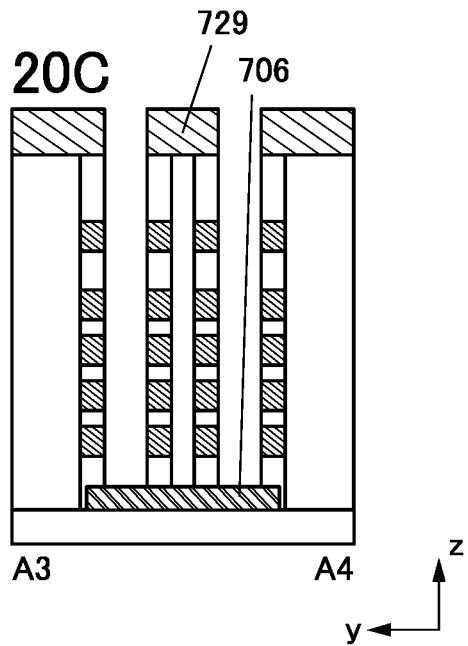

Next, a mask 729 is formed over the insulator 724 and the insulator 726, the insulator 724, the conductor 702, the conductor 701, the insulator 722, and the insulator 721 are processed by a lithography method, and a second opening is formed to expose the conductor 706 (see FIG. 20A to FIG. 20C).

Figure 21A:
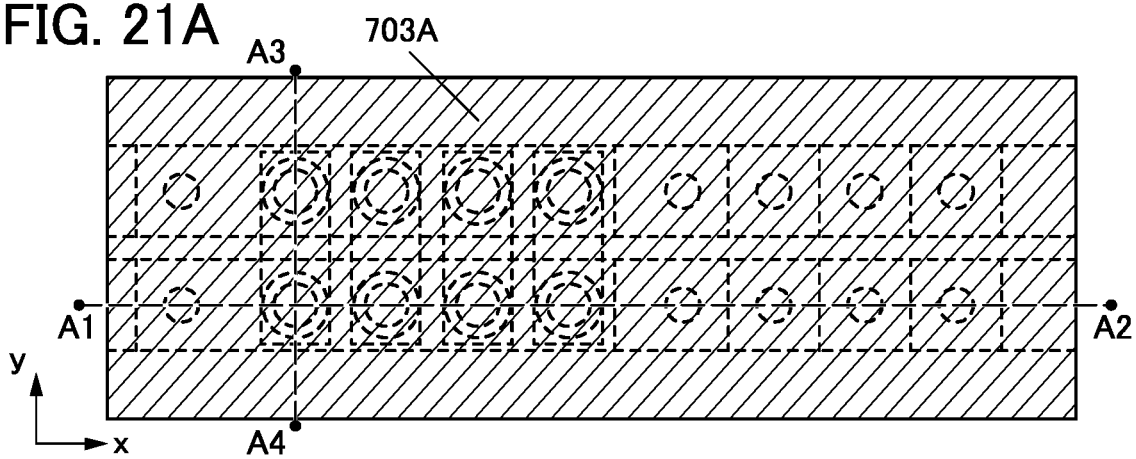
FIG. 21A is a top view illustrating an example of a manufacturing step of a semiconductor device.
Figure 21B:
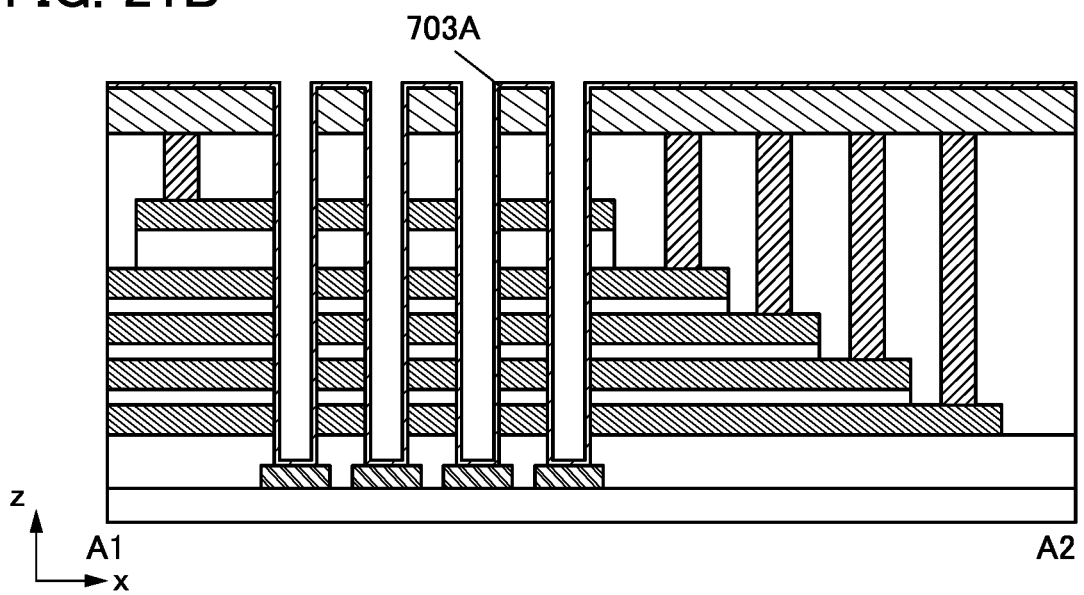
FIG. 21B and FIG. 21C are cross-sectional views illustrating an example of a manufacturing step of a semiconductor device.
Figure 21C:
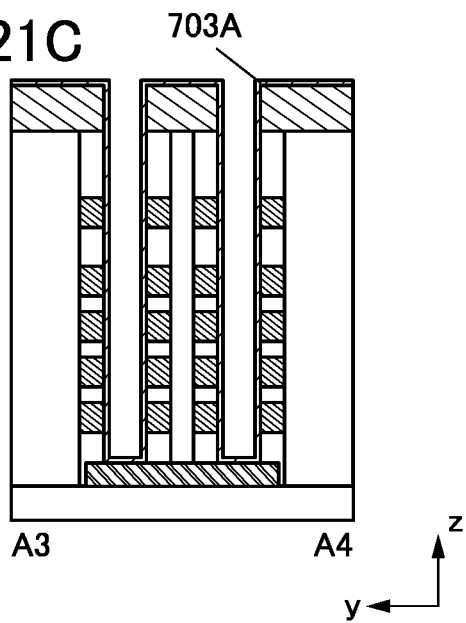
Figure 22A:
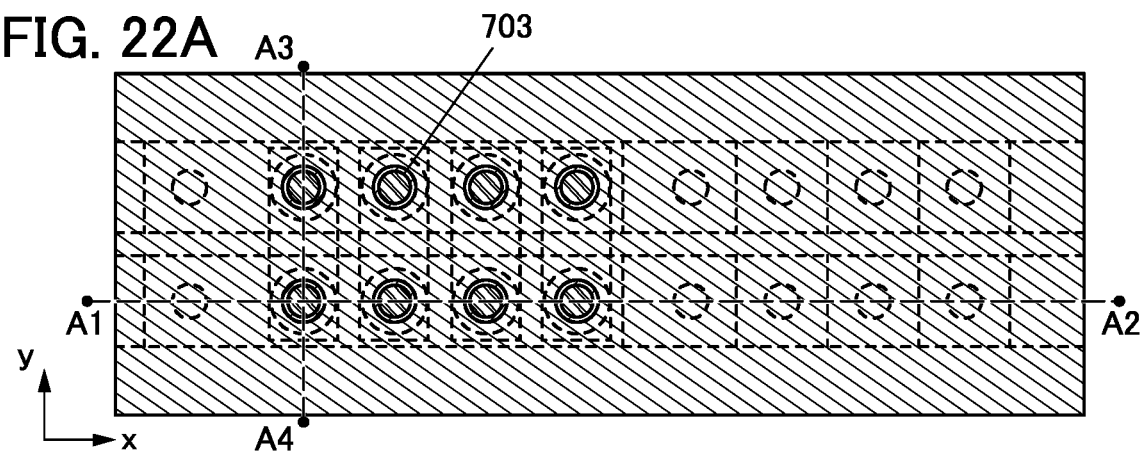
FIG. 22A is a top view illustrating an example of a manufacturing step of a semiconductor device.
Figure 22B:
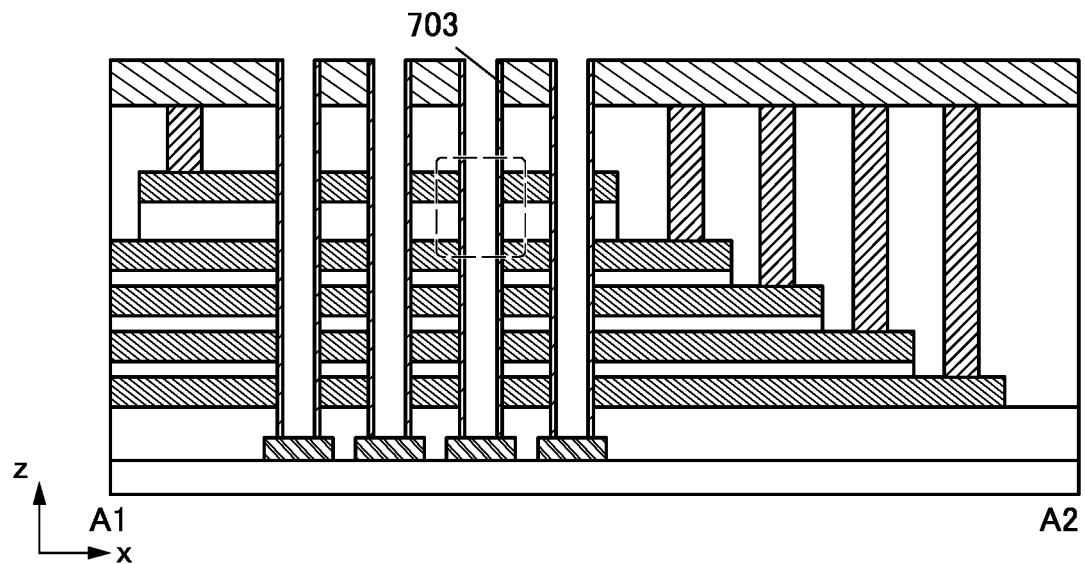
FIG. 22B, FIG. 22C, and FIG. 22D are cross-sectional views illustrating an example of a manufacturing step of a semiconductor device.
Figure 22C:
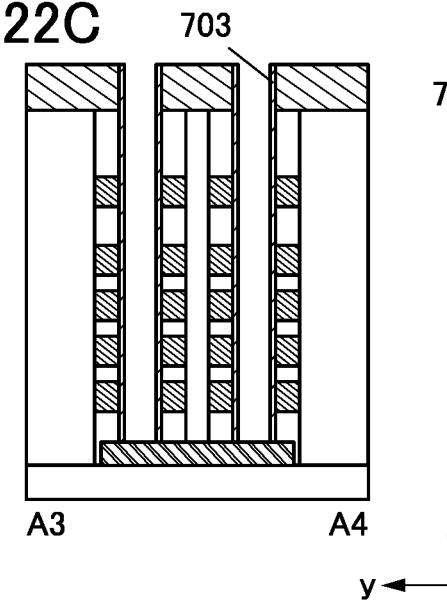
Figure 22D:
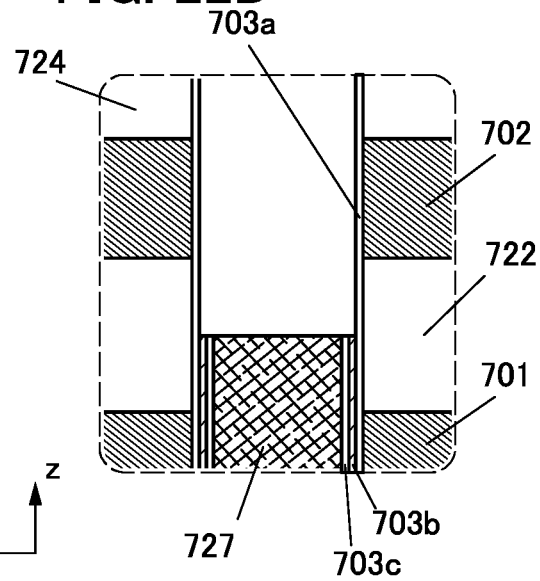

Next, an insulating film 703A to be the insulator 703 is formed in the second opening to cover the insulator 724, the insulator 726, and the mask 729 (see FIG. 21A to FIG. 21C).

Although not illustrated in FIG. 21A to FIG. 21C, the insulating film 703A is formed by stacking an insulating film to be the insulator 703a, an insulating film to be the insulator 703b, and an insulating film to be the insulator 703c in this order. The insulating film 703A can be formed by a CVD method or an ALD method. It is particularly preferable to employ an ALD method, in which case a film with a uniform thickness can be formed even in a groove or an opening portion having a large aspect ratio. Alternatively, the insulating film 703A may be formed by a combination of an ALD method and a CVD method. The insulating film to be the insulator 703a, the insulating film to be the insulator 703b, and the insulating film to be the insulator 703c may be formed using the same deposition apparatus or different deposition apparatuses. The insulating film to be the insulator 703c is preferably formed to be thinner than the insulating film to be the insulator 703a so that the insulator 703c is thinner than the insulator 703a.

The insulating film 703A formed by the above method can have high coverage and can be formed in contact with the side surface of each of the conductor 701 and the conductor 702.

Then, the insulating film 703A formed on the bottom portion of the second opening is removed, so that the insulator 703 is obtained. Anisotropic etching is preferably used to remove the insulating film 703A. Here, the insulating film 703A over the mask 729 is also removed; thus, the insulator 703 is provided only on the side wall of the second opening (see FIG. 22A to FIG. 22D). The conductor 706 is exposed again by removing the insulating film 703A on the bottom portion of the second opening.

Here, as illustrated in FIG. 22D, the insulator 703b and the insulator 703c of the insulator 703 that are positioned in the upper portion of the second opening may be removed. FIG. 22D is an enlarged view of a portion surrounded by the dashed-dotted line in FIG. 22B. First, a material 727 (also referred to as a sacrifice layer) that can be easily removed in a later step is formed to be embedded in the second opening and is removed by etching or the like to a desired depth inside the second opening. The insulator 703c and the insulator 703b exposed by the etching are removed in this order, whereby only the insulator 703a can be used as the insulator 703 positioned in the horizontal direction (x-y direction) of the conductor 702. In this case, the gate insulating film of each of the selection transistor SST and the selection transistor SDT is formed of the insulator 703a. After the insulator 703c and the insulator 703b are removed, the material 727 is removed.

Figure 23A:
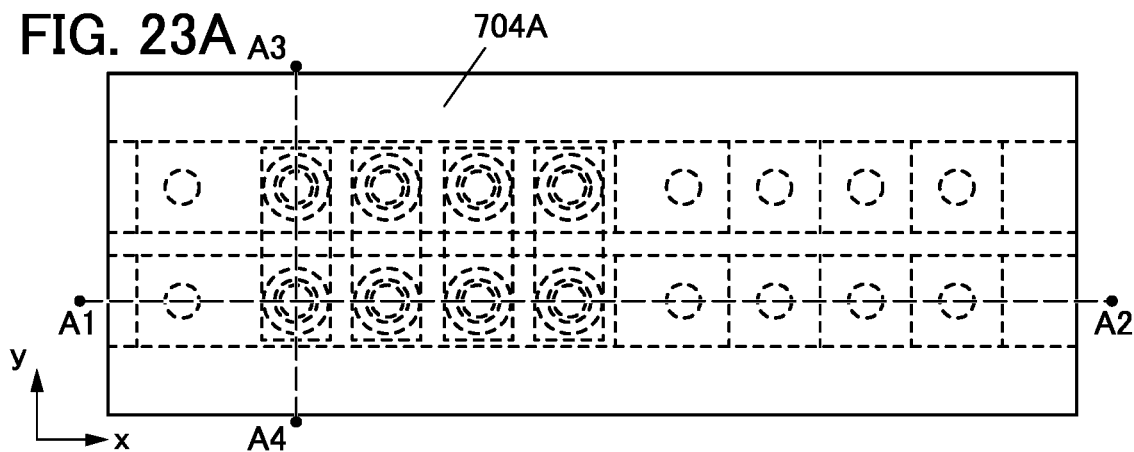
FIG. 23A is a top view illustrating an example of a manufacturing step of a semiconductor device.
Figure 23B:
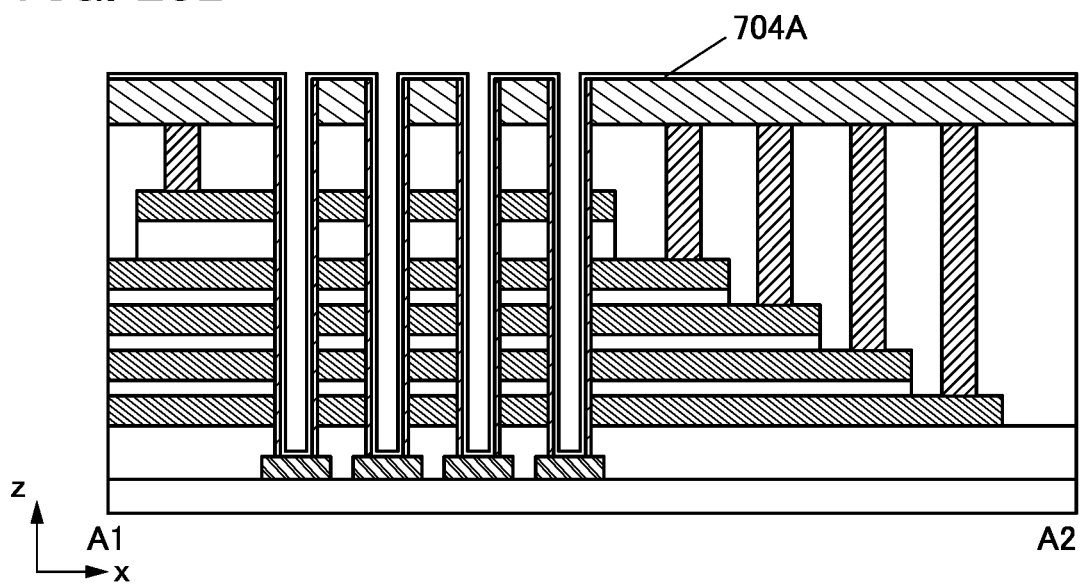
FIG. 23B and FIG. 23C are cross-sectional views illustrating an example of a manufacturing step of a semiconductor device.
Figure 23C:
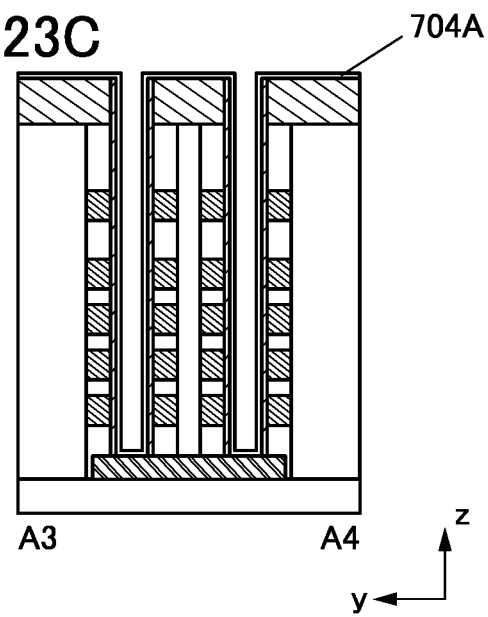

Next, an oxide film 704A to be the oxide 704 is formed in the second opening (see FIG. 23A to FIG. 23C). The oxide film 704A can be formed in such a manner that an oxide film to be the oxide 704a, an oxide film to be the oxide 704b, and an oxide film to be the oxide 704c are formed sequentially over the mask 729 and in the second opening. The oxide film 704A is formed along the side surfaces of the conductor 701 and the conductor 702 with the insulator 703 therebetween. Part of the oxide film 704A is formed in contact with the conductor 706.

The oxide film to be the oxide 704a, the oxide film to be the oxide 704b, and the oxide film to be the oxide 704c can be formed by a CVD method, an ALD method, a sputtering method, or the like. It is particularly preferable to employ an ALD method, in which case a film with a uniform thickness can be formed even in a groove or an opening portion having a large aspect ratio. Alternatively, the oxide films may be formed by a combination of an ALD method and a CVD method. Alternatively, the oxide films may be formed using different deposition methods or different deposition apparatuses.

In the case of decreasing the resistance of the oxide 704, an element such as argon, hydrogen, boron, carbon, nitrogen, fluorine, phosphorus, sulfur, chlorine, titanium, helium, neon, krypton, or xenon, or a metal element that improves the conductivity of the oxide 704, such as aluminum, ruthenium, titanium, tantalum, tungsten, chromium, or indium is added to the oxide film 704A. As the method for adding the element, the plasma treatment, ion implantation treatment, ion doping treatment, reverse sputtering treatment, or the like can be used. The plasma treatment can be performed with an etching apparatus or a CVD apparatus. The reverse sputtering treatment can be performed with a sputtering apparatus (not illustrated).

Figure 24A:
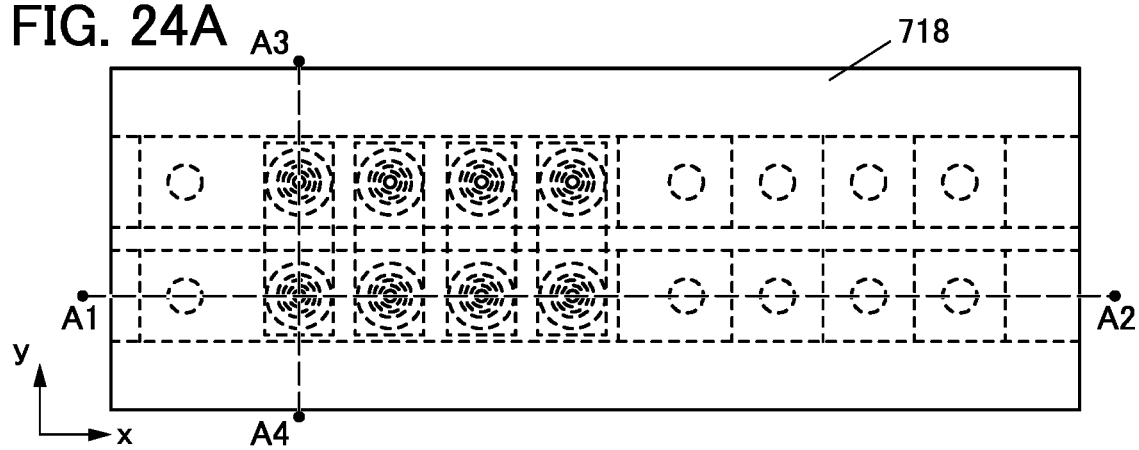
FIG. 24A is a top view illustrating an example of a manufacturing step of a semiconductor device.
Figure 24B:
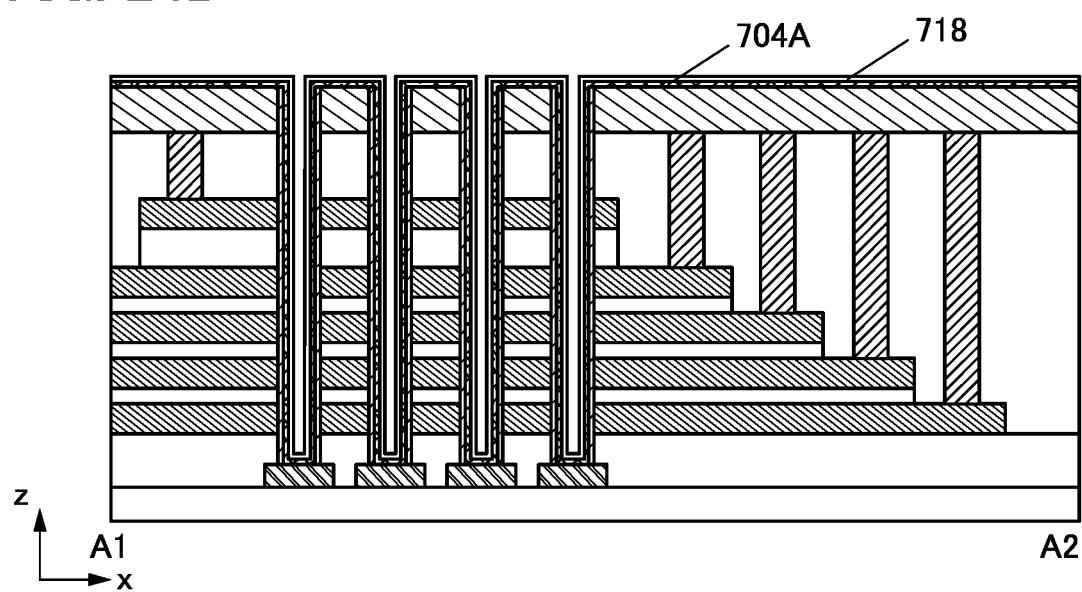
FIG. 24B and FIG. 24C are cross-sectional views illustrating an example of a manufacturing step of a semiconductor device.
Figure 24C:
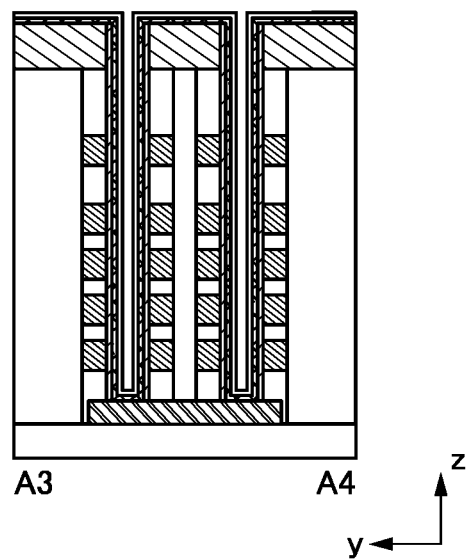

In contrast, in the case of increasing the resistance of the oxide 704, the film 718 having a property of absorbing hydrogen (for example, a metal film, an oxide film containing a metal element, or a nitride film containing a metal element) is formed as the oxide film 704A (see FIG. 24A to FIG. 24C). After that, the film 718 may be removed together with the absorbed hydrogen, or in the case where the resistance of the film 718 absorbing hydrogen is high, the film 718 may be left as an insulator.

Note that in this manufacturing method, description is given on the assumption that treatment for decreasing the resistance and treatment for increasing the resistance are not performed on the oxide 704.

Then, an insulating film 711A is formed on the inner side of the oxide film 704A, and a conductive film 712A is formed on the inner side of the insulating film 711A. The insulating film 711A and the conductive film 712A can be formed by a CVD method or an ALD method. It is particularly preferable to employ an ALD method, in which case a film with a uniform thickness can be formed even in a groove or an opening portion having a large aspect ratio.

Figure 25A:
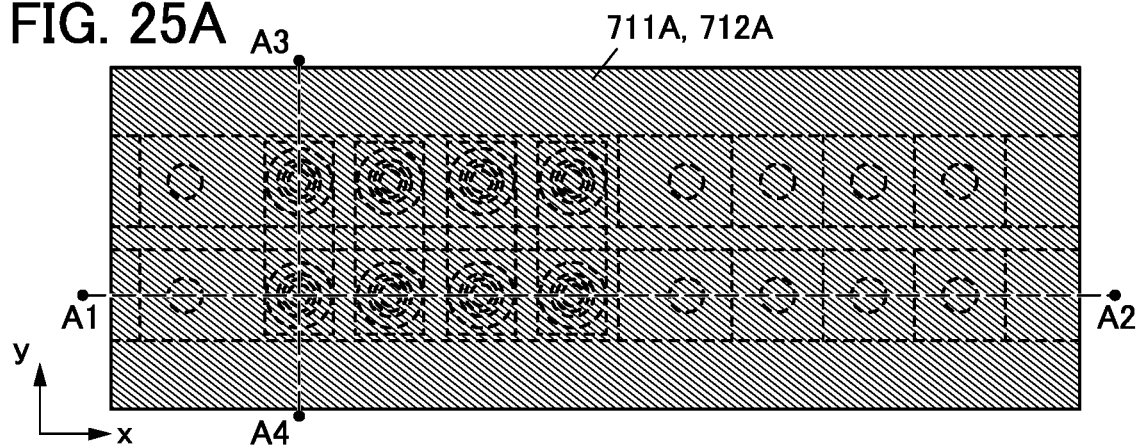
FIG. 25A is a top view illustrating an example of a manufacturing step of a semiconductor device.
Figure 25B:
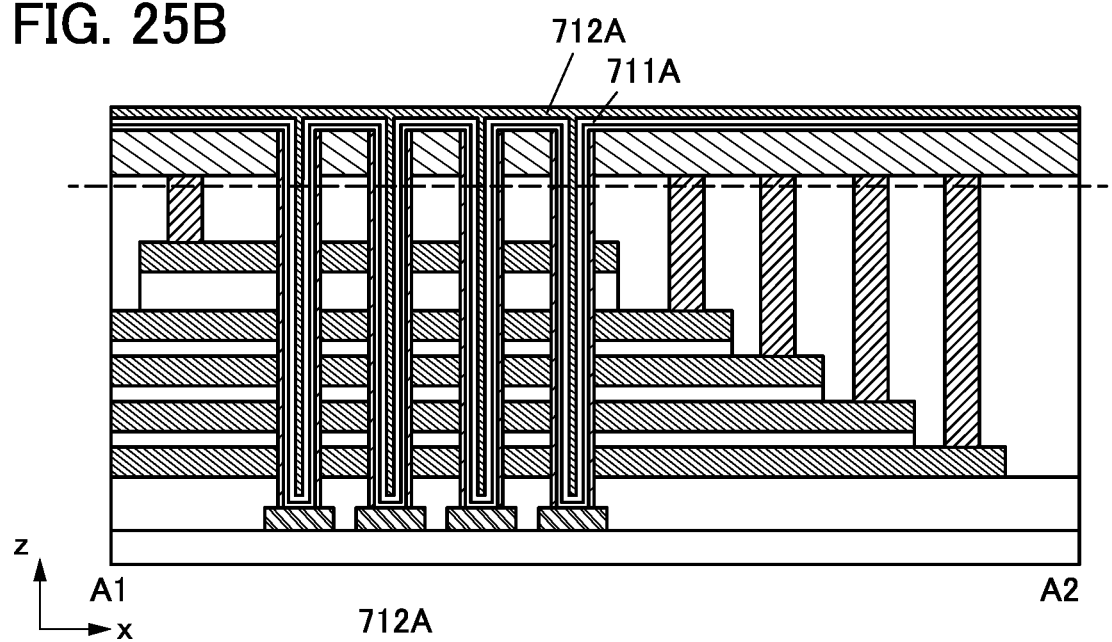
FIG. 25B and FIG. 25C are cross-sectional views illustrating an example of a manufacturing step of a semiconductor device.
Figure 25C:
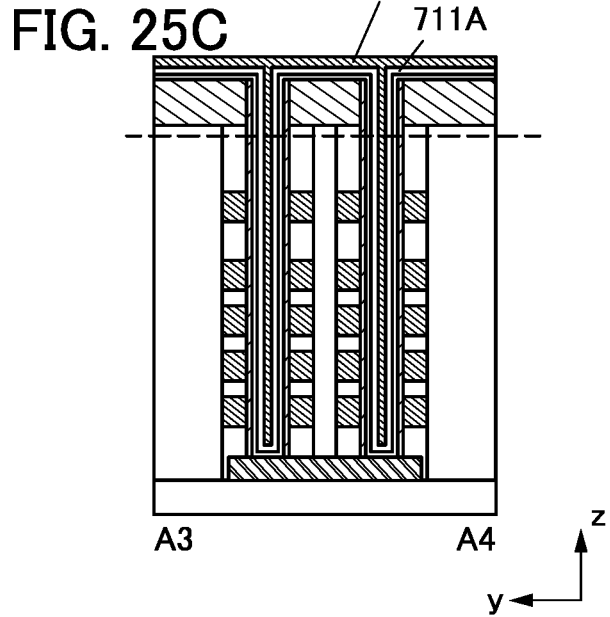

Alternatively, the insulating film 711A and the conductive film 712A may be formed by a combination of an ALD method and a CVD method (see FIG. 25A to FIG. 25C).

For the insulator 711, a material that supplies oxygen to the oxide 704 or a material that supplies hydrogen can be used in accordance with the characteristics needed for the memory transistors MT and the semiconductor device including the memory transistors MT.

Then, heat treatment is performed. The heat treatment is preferably performed in an atmosphere containing nitrogen at higher than or equal to 200° C. to lower than or equal to 500° C., preferably higher than or equal to 300° C. to lower than or equal to 400° C. The atmosphere in which heat treatment is performed is not limited to the above atmosphere as long as at least one of nitrogen, oxygen, and argon is contained. The heat treatment may be performed in a reduced-pressure atmosphere or in an atmospheric pressure atmosphere.

When the heat treatment is performed in the state where the oxide film 704A and the conductor 706 are in contact with each other, the resistance of the oxide film 704A is reduced in some cases. When the oxide film 704A is in contact with the conductor 706, a metal compound layer containing a metal element contained in the conductor 706 and the component of the oxide film 704A is formed at the interface between the conductor 706 and the oxide film 704A in some cases. Formation of the metal compound is preferable because the contact resistance between the conductor 706 and the oxide film 704A can be reduced. Oxygen contained in the oxide film 704A is absorbed by the conductor 706 in some cases. At this time, the resistance of the oxide film 704A in the vicinity of the interface between the conductor 706 and the oxide film 704A is reduced, so that the contact resistance between the conductor 706 and the oxide film 704A can be reduced. When the heat treatment is performed in the state where the oxide film 704A and the conductor 706 are in contact with each other, the oxide film 704A has lower resistance and the contact resistance between the conductor 706 and the oxide film 704A is further reduced.

Figure 26A:
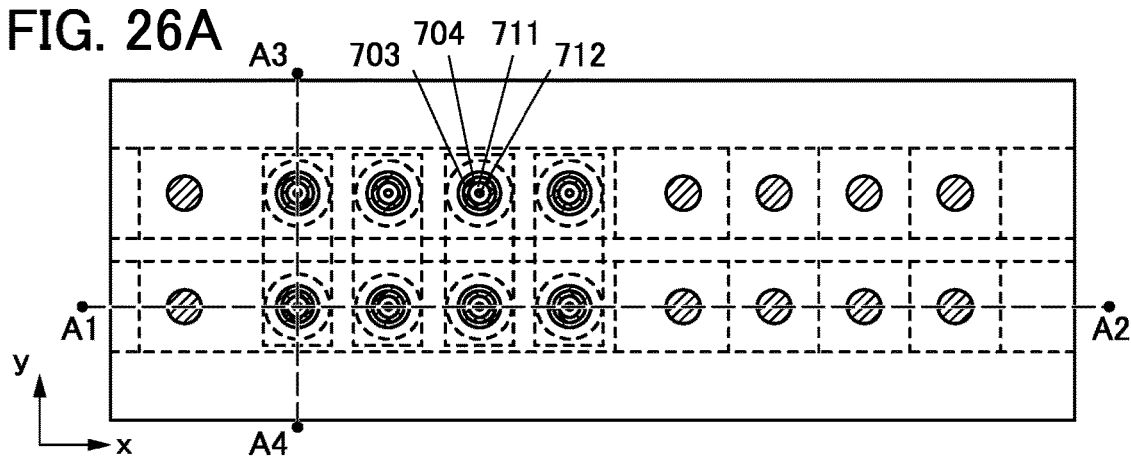
FIG. 26A is a top view illustrating an example of a manufacturing step of a semiconductor device.
Figure 26B:
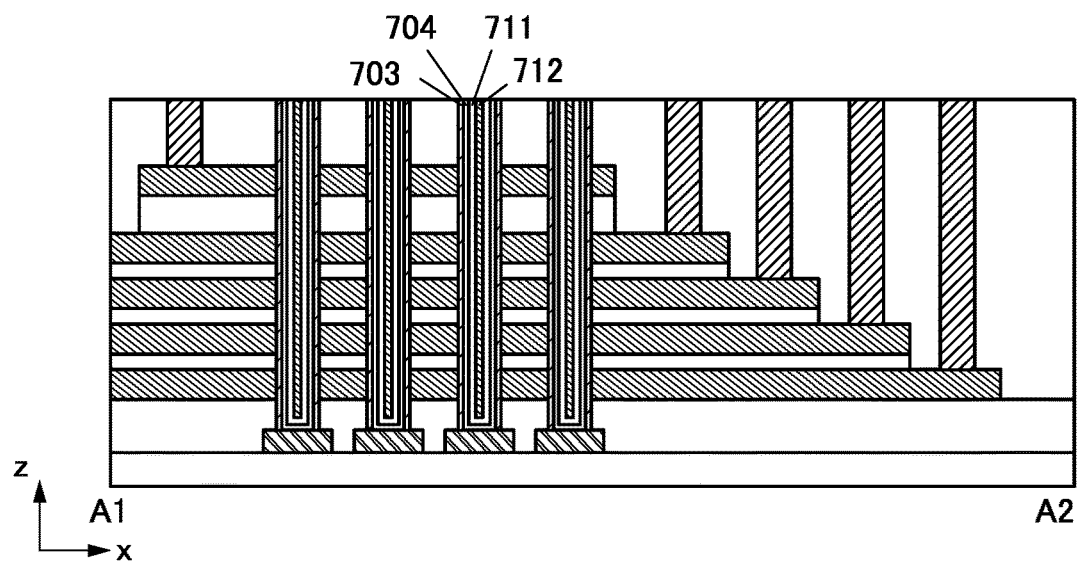
FIG. 26B and FIG. 26C are cross-sectional views illustrating an example of a manufacturing step of a semiconductor device.
Figure 26C:
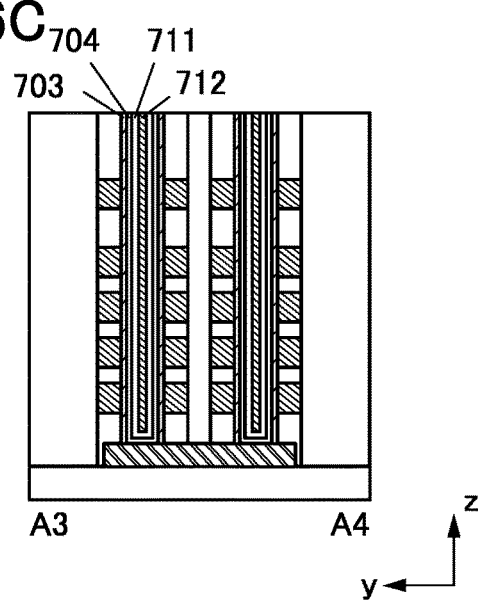

Next, the mask 729 and unnecessary portions of the conductive film 712A, the insulating film 711A, the oxide film 704A, the insulator 703, and the like, which are portions above the dotted lines illustrated in FIG. 25B and FIG. 25C, are removed by a CMP method or the like to obtain the oxide 704, the insulator 711, and the conductor 712 (see FIG. 26A to FIG. 26C). Note that the above-described heat treatment may be performed after the removal of unnecessary portions of the conductive film 712A, the insulating film 711A, and the oxide film 704A. In the case where the mask 729 is removed after the formation of the first opening and before the formation of the insulating film 703A, the mask 729 is not necessarily removed in the present step.

Figure 27A:
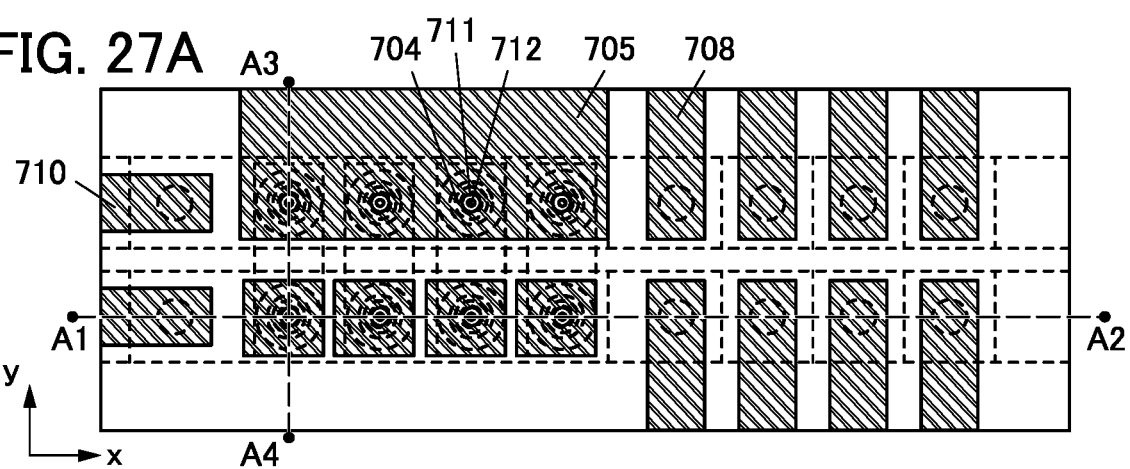
FIG. 27A is a top view illustrating an example of a manufacturing step of a semiconductor device.
Figure 27B:
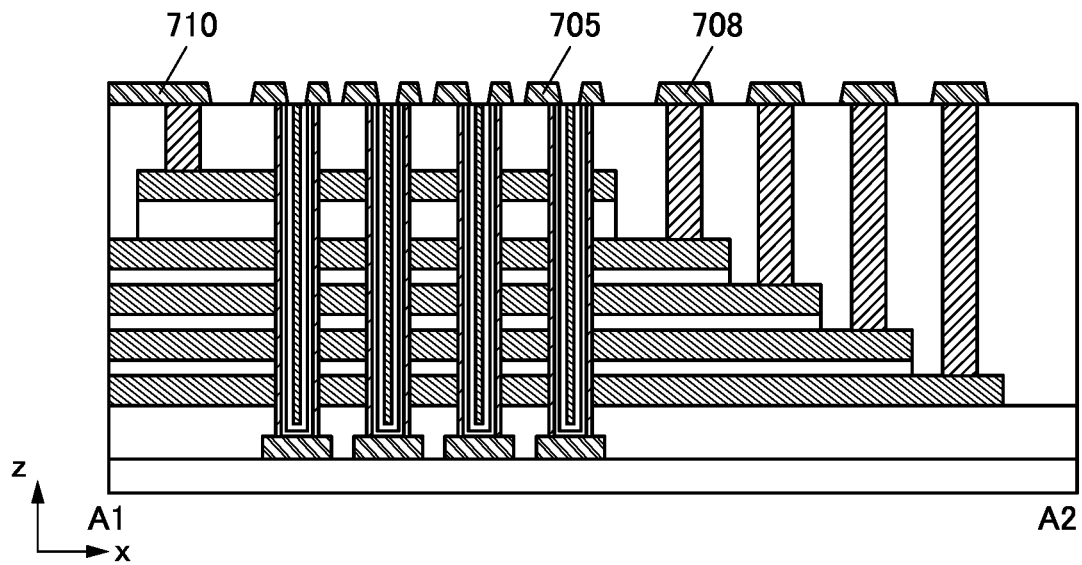
FIG. 27B and FIG. 27C are cross-sectional views illustrating an example of a manufacturing step of a semiconductor device.
Figure 27C:
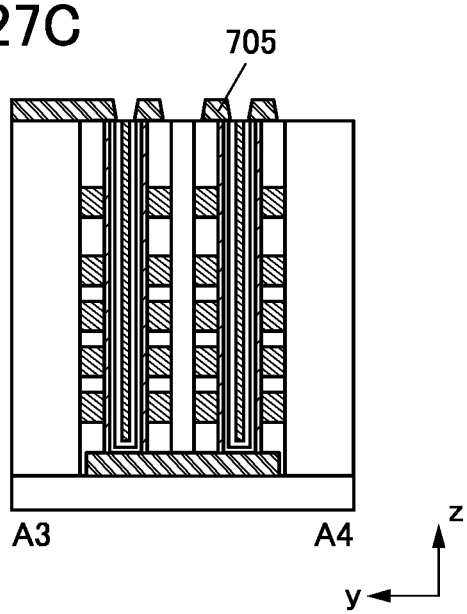

Next, as illustrated in FIG. 27A to FIG. 27C, the conductor 705, the conductor 708, and the conductor 710 are formed. In particular, the conductor 705 is provided to be electrically connected to the oxide 704. Furthermore, the conductor 708 is provided to be electrically connected to the conductor 707. In the case where the conductor 712 is provided on the inner side of the oxide 704, it is preferable that at least an opening that exposes the conductor 712 be provided in the conductor 705 so that the conductor 705 and the conductor 712 are electrically separated from each other. In this case, the opening may be provided to expose the insulator 711. Part of the oxide 704 may be exposed. Furthermore, the conductor 705 functions as part of the bit line BL or the source line SL, the conductor 708 functions as part of the word line WL, and the conductor 710 functions as part of a selection gate line.

Figure 28A:
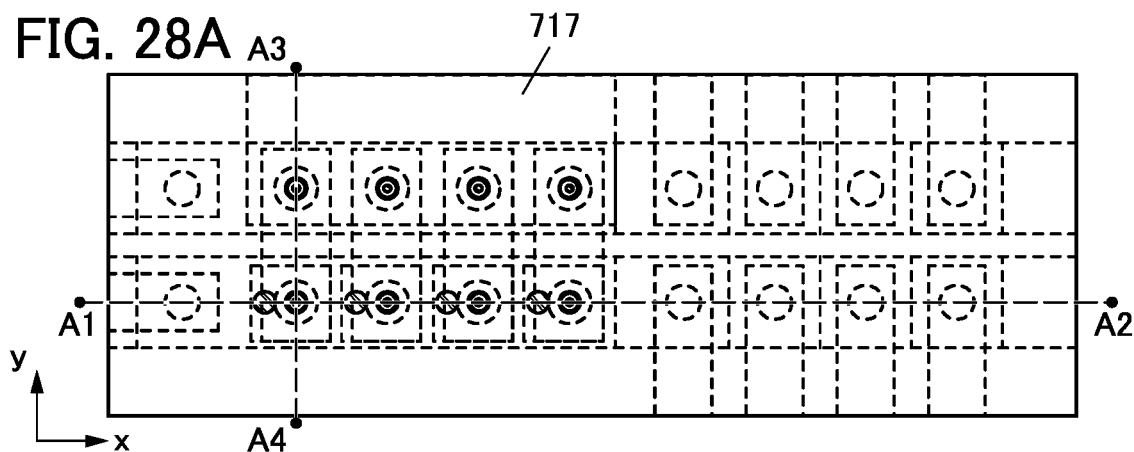
FIG. 28A is a top view illustrating an example of a manufacturing step of a semiconductor device.
Figure 28B:
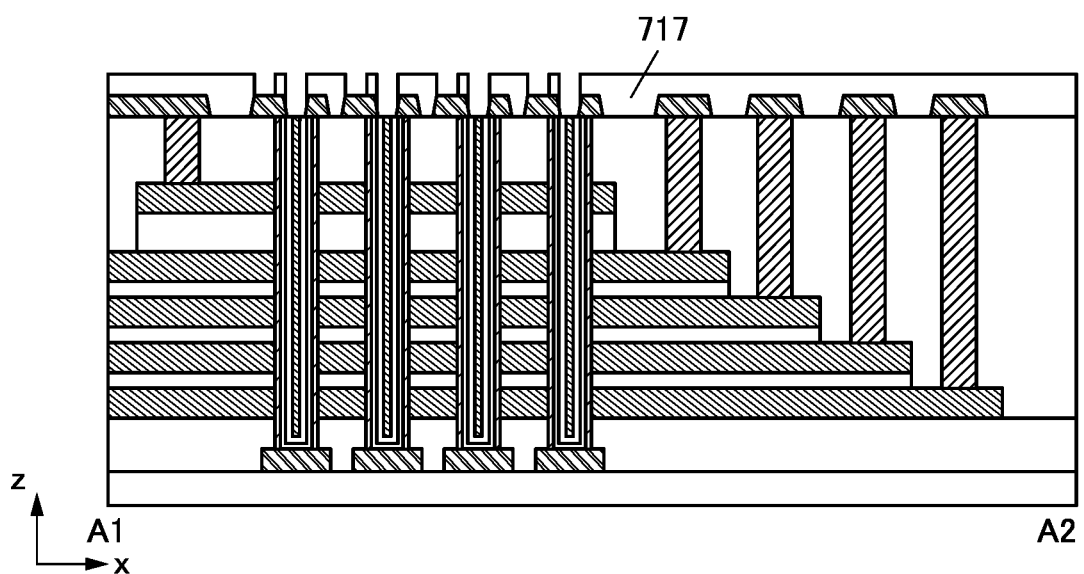
FIG. 28B and FIG. 28C are cross-sectional views illustrating an example of a manufacturing step of a semiconductor device.
Figure 28C:
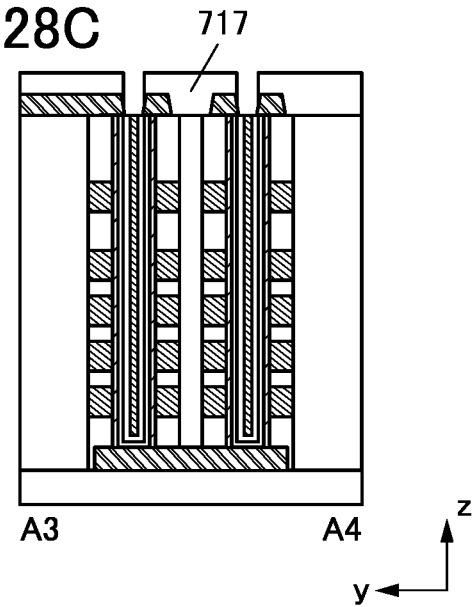

Then, as illustrated in FIG. 28A to FIG. 28C, the insulator 717 is formed to cover the conductor 705. In the insulator 717, an opening that exposes part of the conductor 705 (the conductor 705 electrically connected to the oxide 704 on the bit line side) and the conductor 712 is provided. In the case where the opening that exposes the conductor 712 is formed, the diameter of the opening may be larger than that of the opening provided in the conductor 705. Since the opening is provided in the conductor 705, the opening that exposes the conductor 712 can be formed in a self-aligned manner and thus a defect such as formation of the opening whose diameter at the bottom portion has an unexpected size and a defect such as displacement of the opening from the conductor 712 can be inhibited, which is preferable.

Figure 29A:
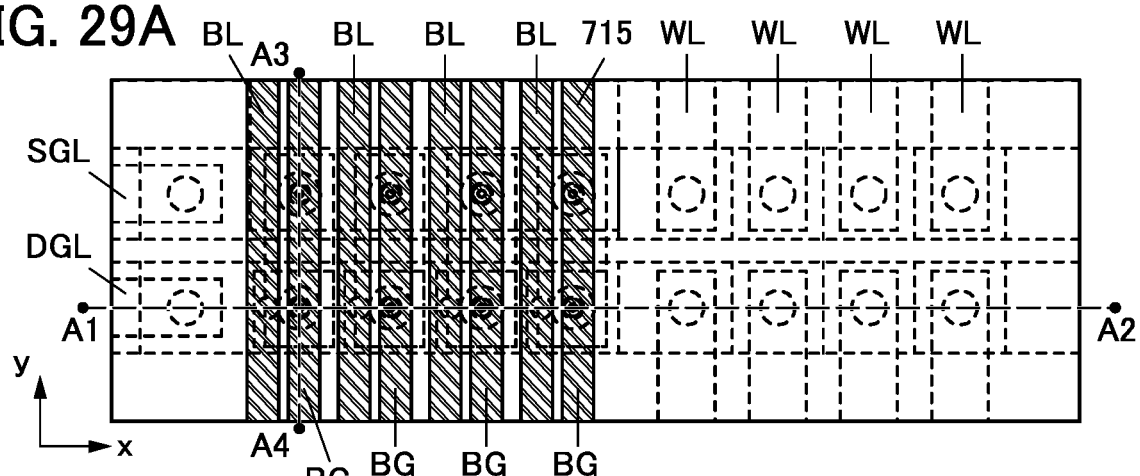
FIG. 29A is a top view illustrating an example of a manufacturing step of a semiconductor device.
Figure 29B:
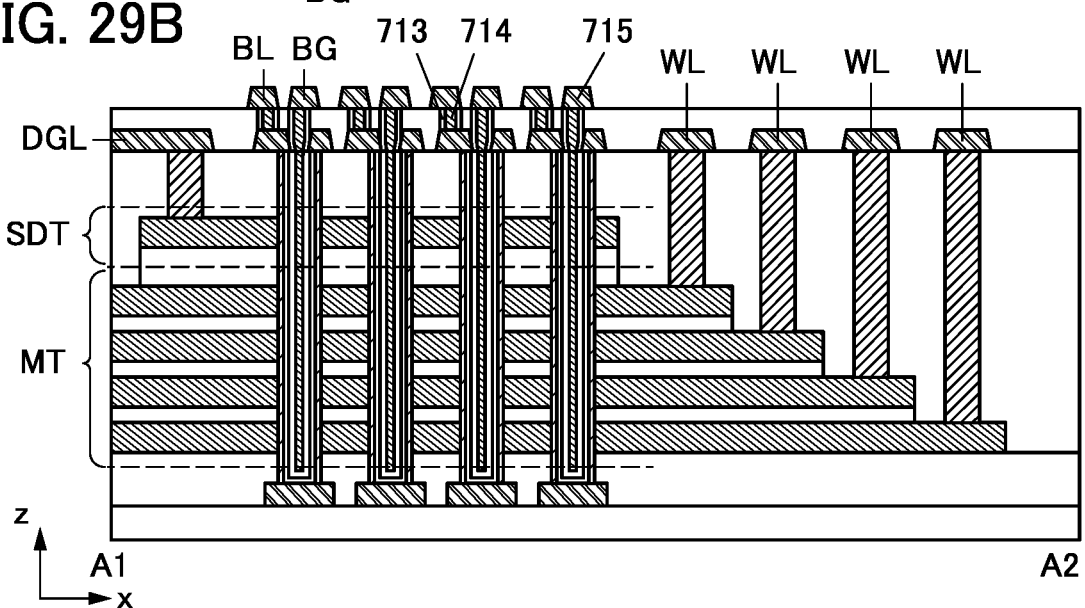
FIG. 29B and FIG. 29C are cross-sectional views illustrating an example of a manufacturing step of a semiconductor device.
Figure 29C:
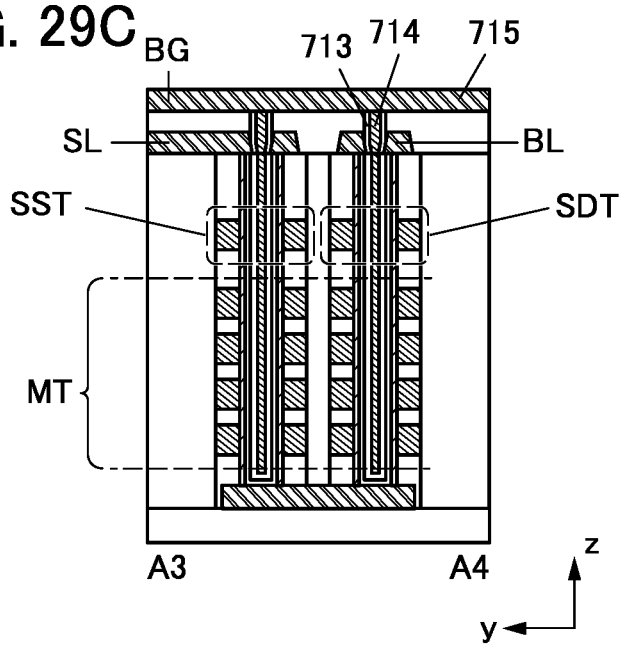

Next, as illustrated in FIG. 29A to FIG. 29C, the insulator 713 positioned at the side surface of the opening that exposes the conductor 712 and is provided in the insulator 717 is formed. An insulating film to be the insulator 713 is formed over the insulator 717 by a CVD method or an ALD method, and then anisotropic etching is performed, whereby the insulating film formed at the bottom portion of the opening is removed. At this time, the insulating film over the insulator 717 is also removed to form the insulator 713. The insulating film may be processed by a lithography method. At this time, the formed insulator 713 exists also over the insulator 717 in some cases.

Next, the conductor 714 and the conductor 715 that serve as the bit line BL and the wiring BG are formed. Although the conductor 714 and the conductor 715 are illustrated as different layers in FIG. 29A to FIG. 29C, the present invention is not limited thereto. The conductor 714 and the conductor 715 may be formed as one conductor at a time. When the conductor 714 and the conductor 715 are separately formed, a conductive film to be the conductor 714 is formed over the insulator 717 to be embedded in the opening formed in the insulator 717, and an unnecessary portion of the conductive film is removed by a CMP method or the like, whereby the conductor 714 can be formed. After that, the conductor 715 is formed. The conductor 715 may be formed by a lithography method or a damascene method. At this time, the insulator 713 is provided on the side surface of the opening formed in the insulator 717 and the conductor 705; thus, the conductor 715 electrically connected to the conductor 712 is not electrically connected to the conductor 705. When the conductor 714 and the conductor 715 are formed at a time, a conductor serving as the conductor 714 and the conductor 715 can be formed by forming a conductive film over the insulator 717 to be embedded in the opening formed in the insulator 717 and processing the film by a lithography method.

Through the above steps, the memory cell array can be manufactured. In the description of this manufacturing process, the memory cell array includes four layers of the memory transistors MT and four memory strings; however, the present invention is not limited thereto. The memory cell may include five or more layers of the memory transistors MT or five or more memory strings. For example, a memory cell array including 32 layers, 64 layers, or 128 layers of the memory transistors MT can be manufactured. A memory cell array including 200 or more layers of the memory transistors MT can be manufactured.

The memory cell array is manufactured in the above manner, whereby the memory transistors in a plurality of layers can be formed at a time without patterning for forming the memory transistors MT for the plurality of layers. Furthermore, in the case where a memory cell array is formed by the above method, even when the number of layers of the memory transistors MT is increased, the number of steps of patterning and etching of the memory transistors MT is not increased. In this manner, the number of manufacturing steps of the memory cell array can be reduced; thus, a semiconductor device with high productivity can be provided.

<Configuration example of 3D NAND>

Figure 30A:
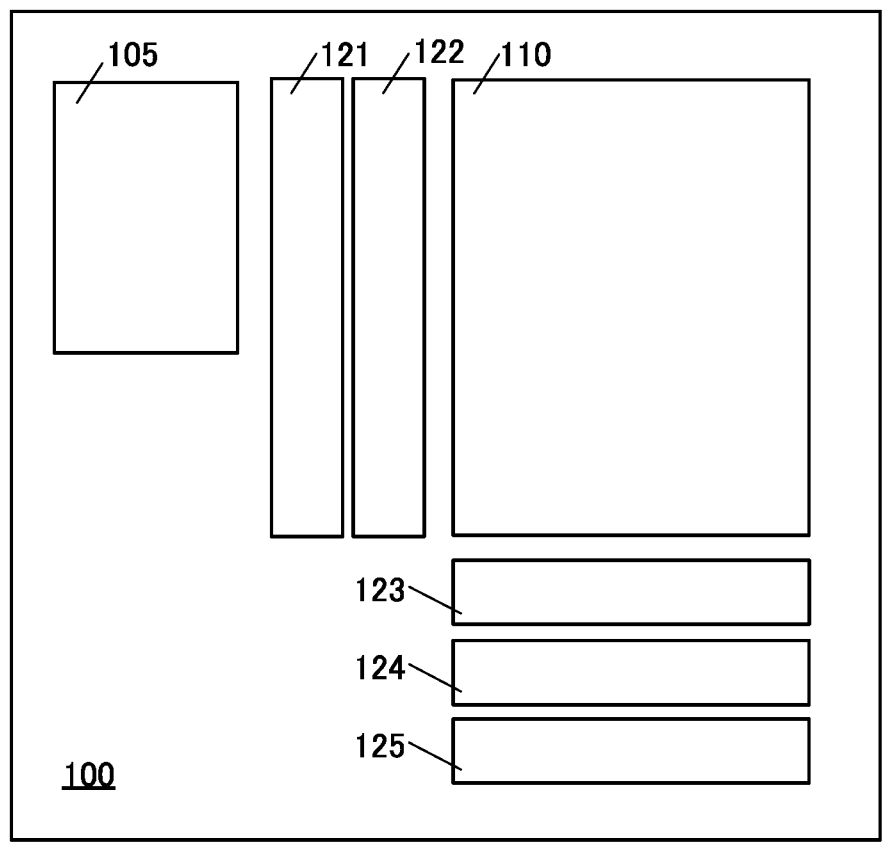
FIG. 30A is a functional block diagram illustrating a configuration example of a memory device.

FIG. 30A illustrates a configuration example of a NAND-type nonvolatile memory device having a three-dimensional structure (3D NAND). A memory device 100 illustrated in FIG. 30A includes a control circuit 105, a memory cell array 110, and peripheral circuits.

The control circuit 105 controls the whole memory device 100 collectively and performs data writing and data reading. The control circuit 105 processes a command signal from the outside and generates a control signal for the peripheral circuits. As the peripheral circuits, a row decoder 121, a row driver 122, a sense amplifier 123, a source line driver 124, and an input/output circuit 125 are provided.

Figure 30B:
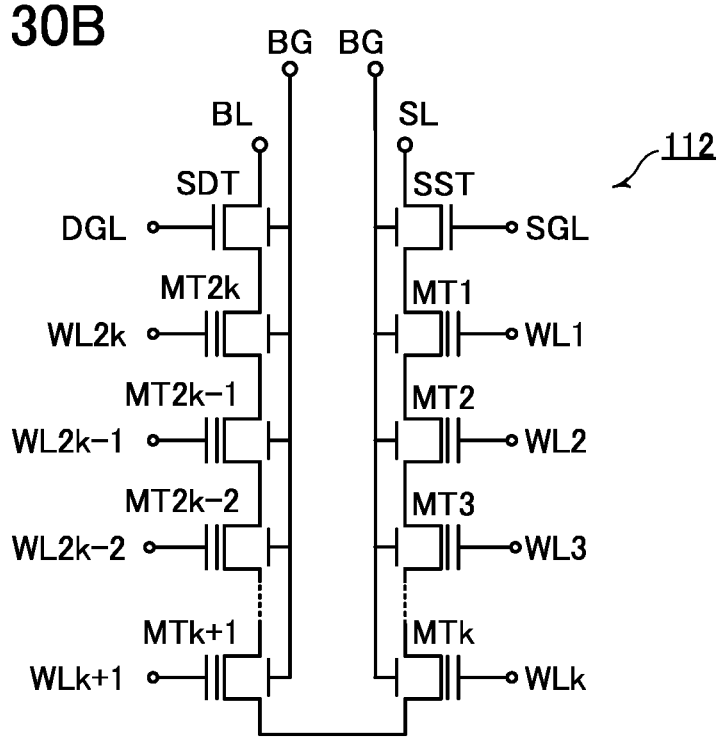
FIG. 30B is a circuit diagram illustrating a configuration example of a memory string.

The memory cell array 110 includes a plurality of memory strings 112. FIG. 30B illustrates a circuit configuration example of the memory string 112. In the memory string 112, the selection transistor SST, a memory transistor MT1 to a memory transistor MT2$k$ ($k$ is an integer of greater than or equal to 1), and the selection transistor SDT are electrically connected in series between the bit line BL and the source line SL.

Note that in the case where the memory transistor MT1 to the memory transistor MT2$k$ are not distinguished from each other, these memory transistors are referred to as memory transistors MT. The same applies to the other elements.

As described above, the selection transistor SST, the selection transistor SDT, and the memory transistor MT1 to the memory transistor MT2$k$ are each a transistor in which the channel is formed of a metal oxide. The memory transistor MT includes a charge accumulation layer and forms a nonvolatile memory cell.

Gates of the selection transistor SST and the selection transistor SDT are electrically connected to the selection gate line SGL and the selection gate line DGL, respectively. Gates of the memory transistor MT1 to the memory transistor MT2$k$ are electrically connected to a word line WL1 to a word line WL2$k$, respectively. The bit line BL extends in the column direction, and the selection gate line SGL, the selection gate line DGL, and the word lines WL (the word line WL1 to the word line WL2$k$) extend in the row direction.

The selection transistor SST, the selection transistor SDT, and the memory transistor MT may each have a second gate as illustrated in FIG. 30B. The second gate is electrically connected to the wiring BG. FIG. 30B illustrates the wiring BG that is electrically connected to the second gates of the selection transistor SST and the memory transistor MT1 to the memory transistor MT$k$ and the wiring BG that is electrically connected to the second gates of the selection transistor SDT and the memory transistor MT$k$+1 to the memory transistor MT2$k$. Different potentials or the same potential may be applied to the wirings BG. Furthermore, the wirings BG may be electrically connected to each other.

The wiring BG preferably extends in the column direction parallel to the bit line BL but may extend in the row direction.

With the wiring BG, the threshold values of the selection transistor SST and the selection transistor SDT can be controlled. Furthermore, the potential of the wiring BG may be controlled in accordance with the circuit operation of the memory cell array.

The input/output circuit 125 temporarily holds data written to the memory cell array 110 and temporarily holds data read from the memory cell array 110, for example.

The source line driver 124 drives the source line SL.

The bit line BL is electrically connected to the sense amplifier 123. The sense amplifier 123 detects voltage that is read from the memory string 112 to the bit line BL at the time of data reading and amplifies it. In addition, the sense amplifier 123 inputs voltage corresponding to the writing data to the bit line BL at the time of data writing.

The row decoder 121 decodes address data input from the outside and selects a row to be accessed. The row driver 122 inputs voltage needed for writing, reading, and erasing data to the selection signal line DGL, the selection signal line SGL, and the word lines WL in accordance with the decoded results by the row decoder 121.

Figure 31:
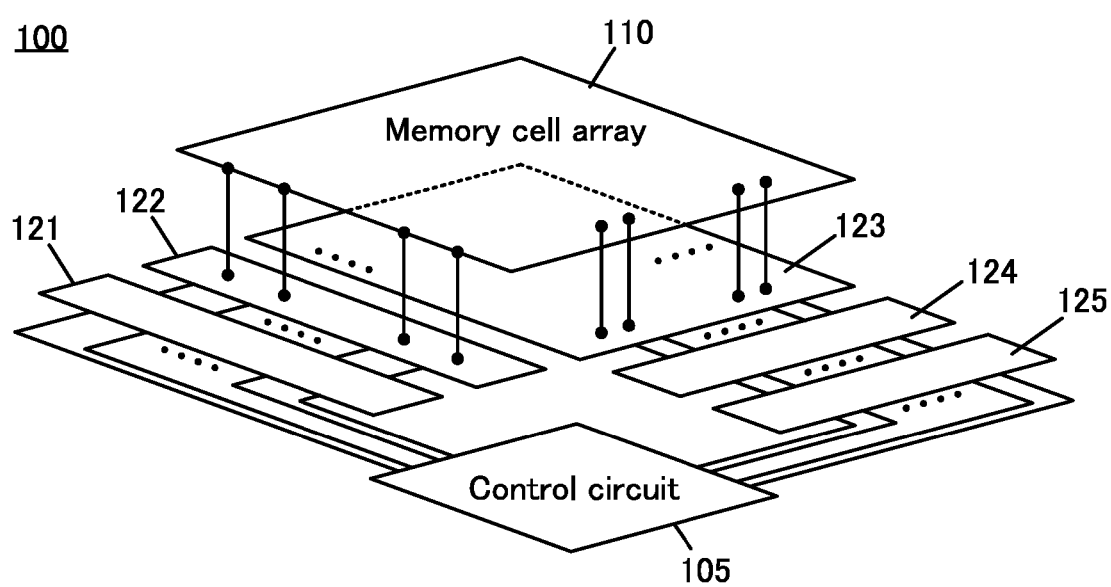
FIG. 31 is a functional block diagram showing a configuration example of a memory device.

The memory cell array 110 may be provided in a layer different from the peripheral circuits such as the control circuit 105 and the sense amplifier 123. In particular, the memory cell array 110 is preferably stacked and overlapped with the sense amplifier 123, in which case the wiring led from the memory cell array 110 to the sense amplifier 123 can be more compact. FIG. 31 shows a block diagram of the memory device 100, shown in FIG. 30A, with a three-dimensional structure in which the memory cell array 110 is provided over the control circuit 105, the row decoder 121, the row driver 122, the sense amplifier 123, the source line driver 124, and the input/output circuit 125 to overlap with the sense amplifier 123.

Figure 32:
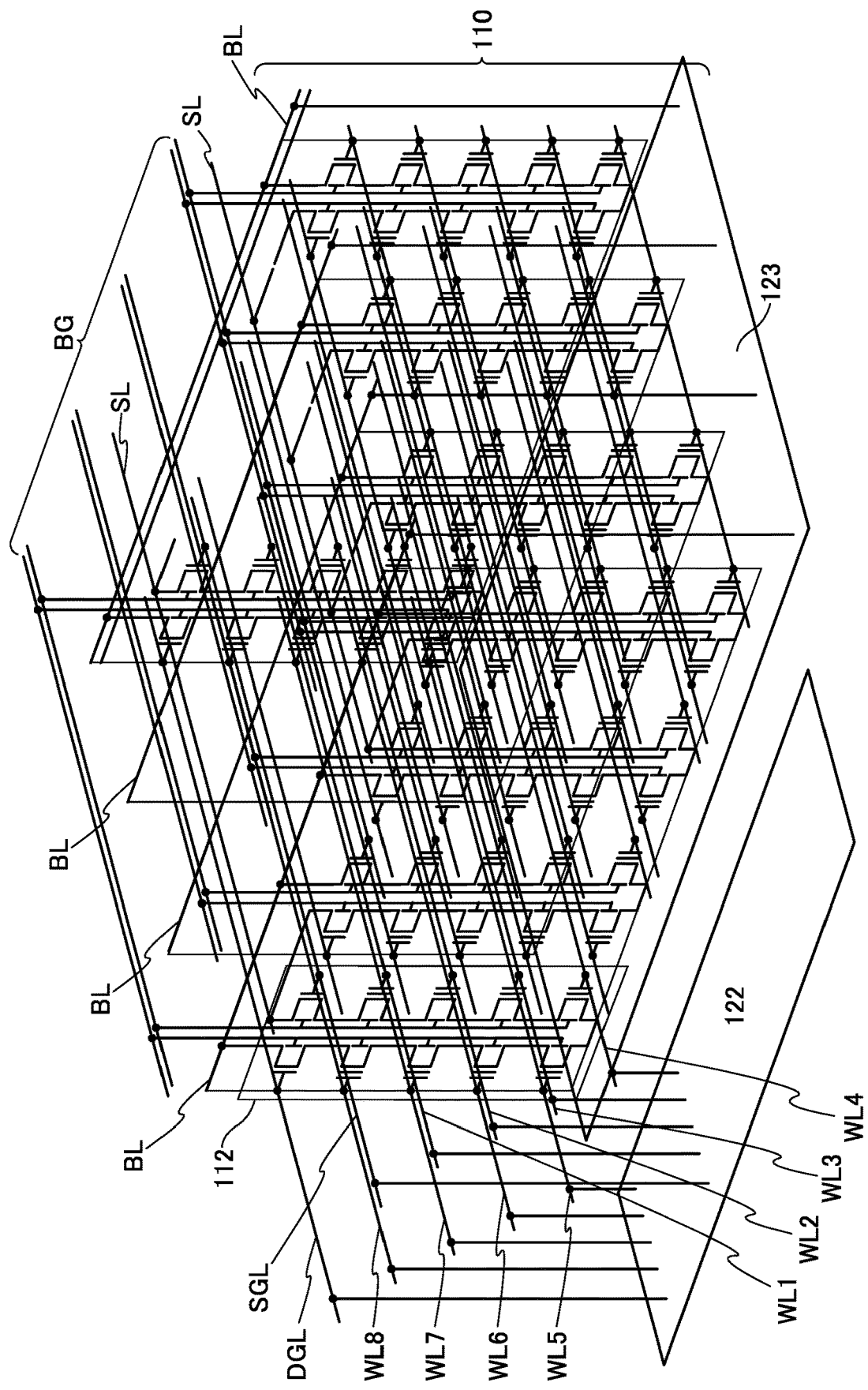
FIG. 32 is a view illustrating a three-dimensional structure example of a memory cell array.
Figure 33:
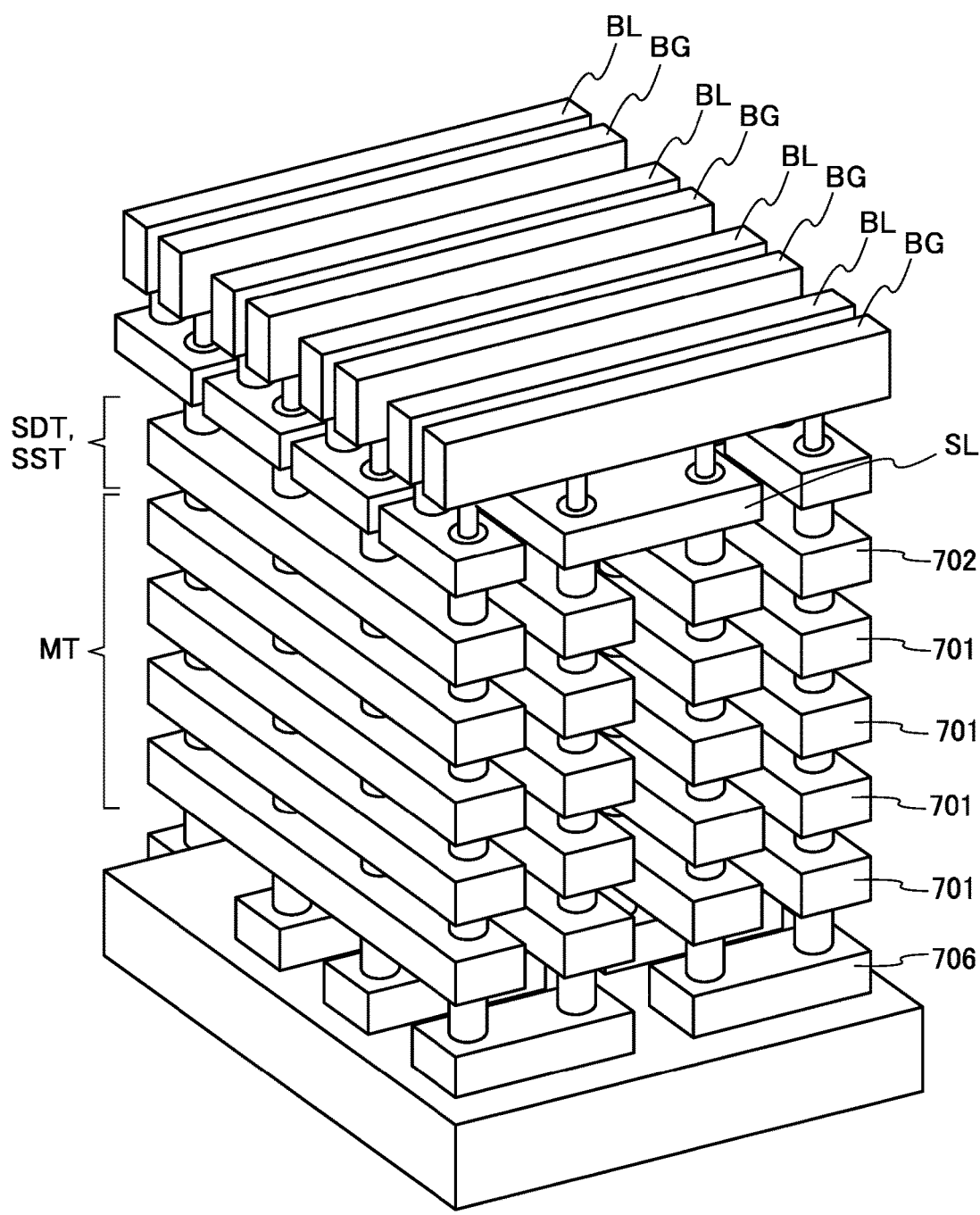
FIG. 33 is a view illustrating a three-dimensional structure example of a memory cell array.
Figure 34:
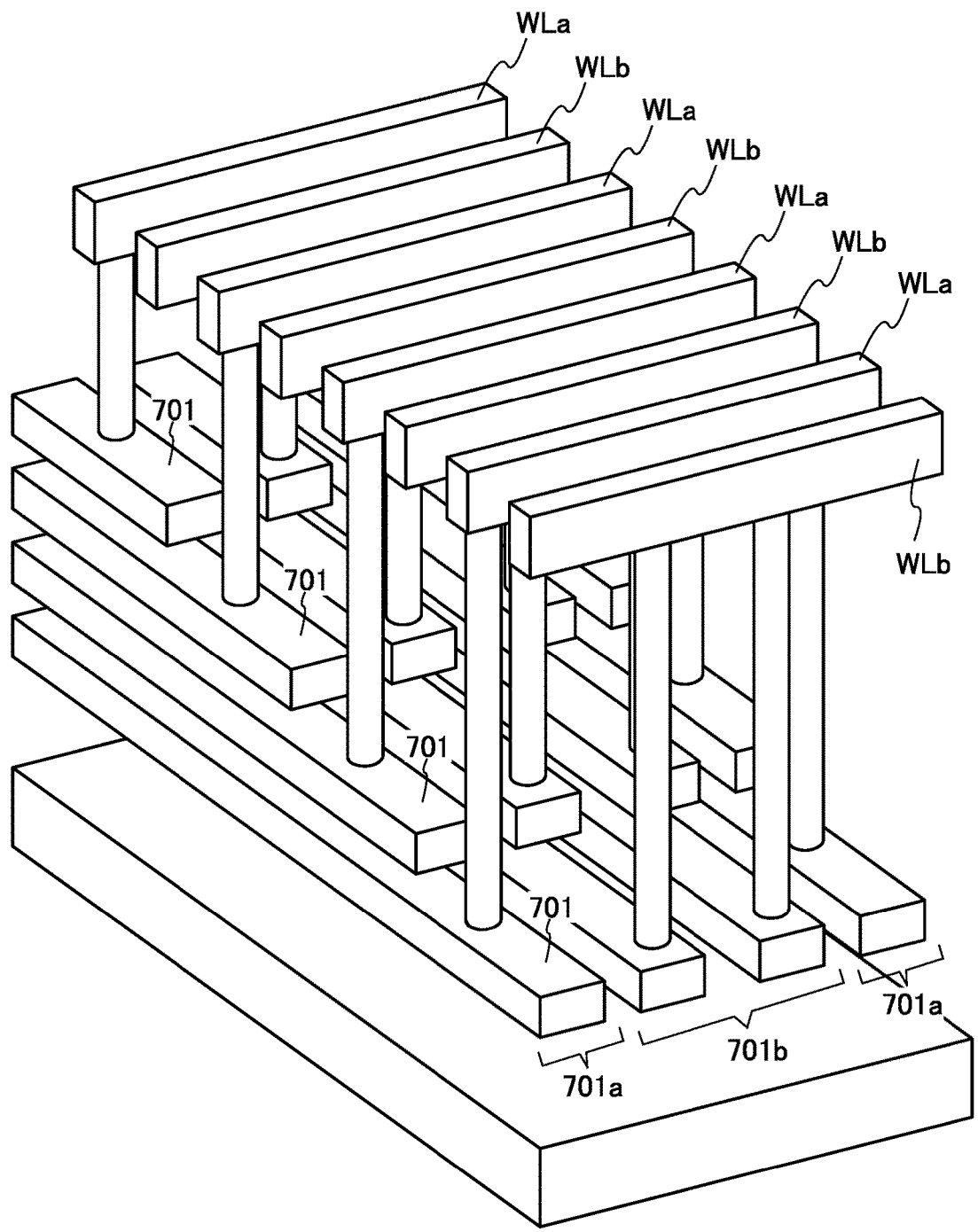
FIG. 34 is a view illustrating a three-dimensional structure example of a memory cell array.

A three-dimensional stacked-layer structure example of the memory cell array 110 is illustrated in FIG. 32 to FIG. 34. FIG. 32 is a view schematically illustrating the example of the three-dimensional structure of the memory cell array 110 in the form of a circuit diagram. Some circuits (memory strings) are not illustrated for easy description. FIG. 33 is a perspective view illustrating the three-dimensional structure example of the memory cell array 110. FIG. 34 is a perspective view illustrating the three-dimensional structure example of the connection portion of the word line WL and the conductor 701. As illustrated in FIG. 32, the memory cell array 110 is stacked over a region where the sense amplifier 123 is formed. Accordingly, the layout area of the memory device 100 can be reduced. As illustrated in FIG. 33 and FIG. 34, even in the conductor 701 in the same stage, the conductor 701a on the bit line BL side is connected to the word line WLa, and the conductor 701b on the source line SL side is connected to the word line WLb. The wiring BG electrically connected to the conductor 712 is provided in the same layer as the bit line BL and extends in the column direction like the bit line BL in this example; however, the present invention is not limited thereto. An insulator may be provided over the bit line BL, and the wiring BG may be provided over the insulator. The wiring BG does not necessarily extend in the column direction and may extend in the row direction. Note that FIG. 32 to FIG. 34 illustrate an example in which eight memory transistors MT1 to MT8 are provided in one memory string 112.

<Description 1 of Circuit Operation of Memory Device>

Next, operation of writing and reading out data to/from the memory string 112 is described with reference to FIG. 35A to FIG. 35C. The memory transistors MT sharing the word line WL1 to the word line WL2$k$ are collectively called a page below.

Figure 35A:
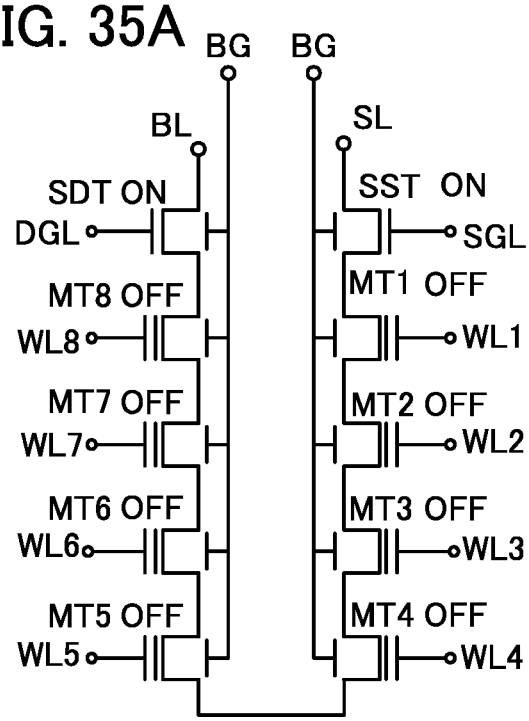
FIG. 35A, FIG. 35B, and FIG. 35C are circuit diagrams for illustrating operation examples of a memory device.
Figure 35B:
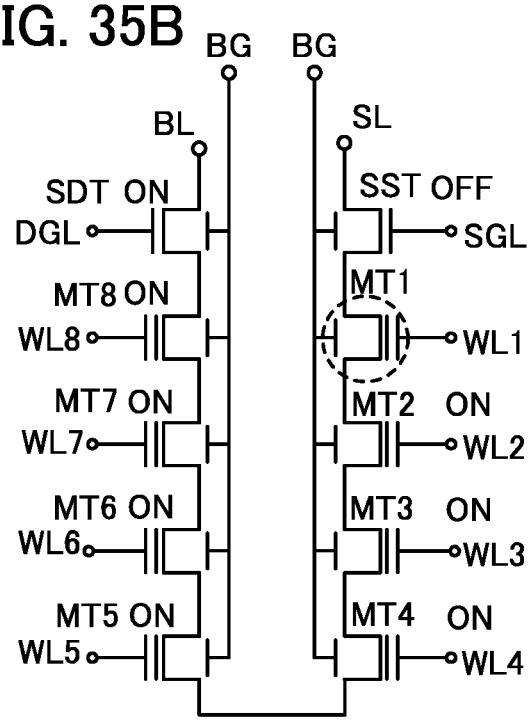
Figure 35C:
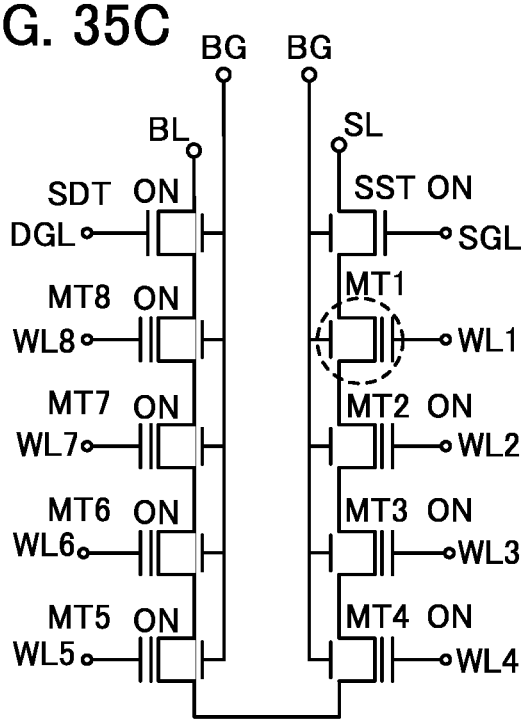

Although the memory string 112 includes the memory transistor MT1 to the memory transistor MT8 as an example in FIG. 35A to FIG. 35C, the number of memory transistors MT is not limited to this.

<<Erasing Operation>>

In the case where data is written to the memory transistor MT, data is preferably erased before the writing operation. The operation of erasing data is also referred to as a reset operation in some cases. An erasing operation is performed on every memory string 112 (also referred to as block). For example, an erasing operation can be performed in the following manner: a block storing data to be erased is selected, a low potential (a potential at which the memory transistor MT1 to the memory transistor MT8 are turned off, such as 0 V) is applied to the word line WL1 to the word line WL8, an erasing potential VE is applied to the source line SL and the bit line BL, and the selection transistor SDT and the selection transistor SST are turned on, as shown in FIG. 35A. Through the reset operation, electrons accumulated in the charge accumulation layer of each of the memory transistor MT1 to the memory transistor MT8 can be extracted. Accordingly, the memory transistor MT1 to the memory transistor MT8 hold data "1".

Alternatively, the erasing operation can be performed by application of an erasing potential to the wiring BG. The erasing operation can be performed in the following manner: an erasing potential, e.g., 15 V, is applied to the wiring BG, a low potential (a potential at which the transistor MT1 to the transistor MT8 are turned off, such as 0 V) is applied to the word line WL1 to the word line WL8, and the selection transistor SDT and the selection transistor SST are turned on.

Alternatively, data of the memory transistor MT can be erased in the following manner: the selection transistor SDT and the selection transistor SST are turned off to set an oxide including a channel formation region of the memory transistor MT in a floating state, and a positive charge (e.g., 15 V) is applied to the wiring BG as the erasing potential. At this time, the selection transistor SDT and the selection transistor SST are off, and thus the bit line BL and the source line SL are set at any potential. For example, to the word line WL1 to the word line WL8, a low potential (a potential at which the memory transistors MT1 to MT8 are turned off, such as 0 V) is applied. As a result, an oxide including a channel formation region is in a floating state; thus, the potential of the oxide increases with the increasing potential of the wiring BG, and electrons stored in the charge accumulation layer can be extracted to the oxide side.

In another erasing operation, to the word line WL1 to the word line WL8, a low potential (a potential at which the memory transistor MT1 to the memory transistor MT8 are turned off, such as 0 V) is applied, for example. Then, the selection transistor SDT and the selection transistor SST are turned on to increase the potentials of the bit line BL and the source line SL. At this time, the potentials of the bit line BL and the source line SL are set lower than that of the wirings BG. For example, the potentials of the bit line BL and the source line SL are set to 10 V and the potential of the wiring BG is set to 12 V. At this time, the memory transistor MT is turned on by the potential of the wiring BG, and an oxide included in the memory transistor MT holds a potential of 10 V. As a result, electrons stored in the charge accumulation layer can be extracted to the oxide side.

Note that data in the memory transistor MT that is not subjected to data rewriting is preferably stored in a different memory region in advance of the erasing operation of the block.

<<Writing Operation>>

Next, a data writing operation is described with reference to FIG. 35B.

First, a positive potential, e.g., 2 V, is applied to the wiring BG. Accordingly, carriers are induced in the region 731a, the region 731b, the region 732a, the region 732b, and the region 734 (see FIG. 11B), and thus the resistance of the oxide 704 is decreased. In particular, in the memory transistor MT, the threshold voltage is lowered, and thus the memory transistor MT has normally-on characteristics.

The data writing operation can be performed for each of the above pages. First, a writing potential (e.g., 15 V) is applied to a word line of a page subjected to writing, and then a positive potential (a potential at which a transistor is turned on, e.g., 3 V) is applied to a word line of a page which is not subjected to writing. As shown in FIG. 35B, a writing potential is applied to the word line WL1 first, and then positive potentials are applied to the word line WL2 to the word line WL8. Then, the selection transistor SST is turned off and the selection transistor SDT is turned on. Thus, data corresponding to the potential of the bit line BL is written to the memory transistor MT1. Specifically, when a potential of the bit line BL is a low potential (e.g., 0 V), as a potential difference from the writing potential applied to the word line WL1 increases, electrons are injected into the charge accumulation layer of the memory transistor MT1. Furthermore, for example, when a potential of the bit line BL is a positive potential, owing to a small potential difference from the writing potential applied to the word line WL1, electrons are not injected into the charge accumulation layer of the memory transistor MT1. That is, when the low potential is applied to the bit line BL, data "0" is written to the memory transistor MT1, and when the positive potential is applied, the data held in the memory transistor MT1 remains "1".

Data writing can be performed page by page in such a manner that different potentials are applied to the bit lines BL in the memory strings 112.

Note that multilevel data can be written to the memory transistor MT. For example, the amount of charges injected into the charge accumulation layer of the memory transistor MT is controlled in accordance with a potential of the bit line BL or the like or a potential applying period.

<<Reading Operation>>

Then, a data reading operation is described with reference to FIG. 35C.

Also in the data reading operation, a positive potential is preferably applied to the wiring BG. Like the writing operation, for example, 2 V is applied to the wiring BG as a positive potential, and thus the resistance of the oxide 704 is decreased. Therefore, the reading speed of data is increased in some cases. In addition, a potential applied to the word line WL can be reduced, and power consumption of the memory device can be reduced in some cases. Furthermore, the threshold voltage (Vth) of the memory transistor MT shifts in the negative direction, and thus, the memory transistor MT on which writing is not performed is adjusted to be normally on. Accordingly, in the data reading operation, wrong reading can be prevented.

The data reading operation can also be performed for each of the pages. First, a low potential (e.g., 0 V) is applied to a word line of a page subjected to reading, and then a positive potential (a potential at which a transistor is turned on, e.g., 3 V) is applied to a word line of a page that is not subjected to reading. As shown in FIG. 35C, a low potential is applied to the word line WL1 first, and then positive potentials are applied to the word line WL2 to the word line WL8. Then, the selection transistor SST and the selection transistor SDT are turned on. A reading potential (e.g., 1 V) is applied to the bit line BL, and a low potential (e.g., 0 V) is applied to the source line SL. At this time, when the data in the memory transistor MT is "1", current flows to the memory string 112, so that the potential of the bit line BL decreases. When the data stored in the memory transistor MT1 is "0", current does not flow to the memory string 112 and the potential of the bit line BL does not change. The sense amplifier 123 detects the potential of the bit line BL and amplifies it. Through the above steps, data in the memory string 112 can be read.

Data in each of the memory strings 112 is read to the bit line BL; thus, data per page can be read.

<Description 2 of Circuit Operation of Memory Device>

Next, an operation method of a circuit of a memory device, which is different from the above, is described.

Specifically, the operation example in which the selection transistor SDT, the selection transistor SST, and the memory transistor MT1 to the memory transistor MT8 have normally-on characteristics is described above, whereas a case where the selection transistor SDT, the selection transistor SST, and the memory transistor MT1 to the memory transistor MT8 have normally-off characteristics is described in this operation example.

Figures 36A, 36B, 36C:
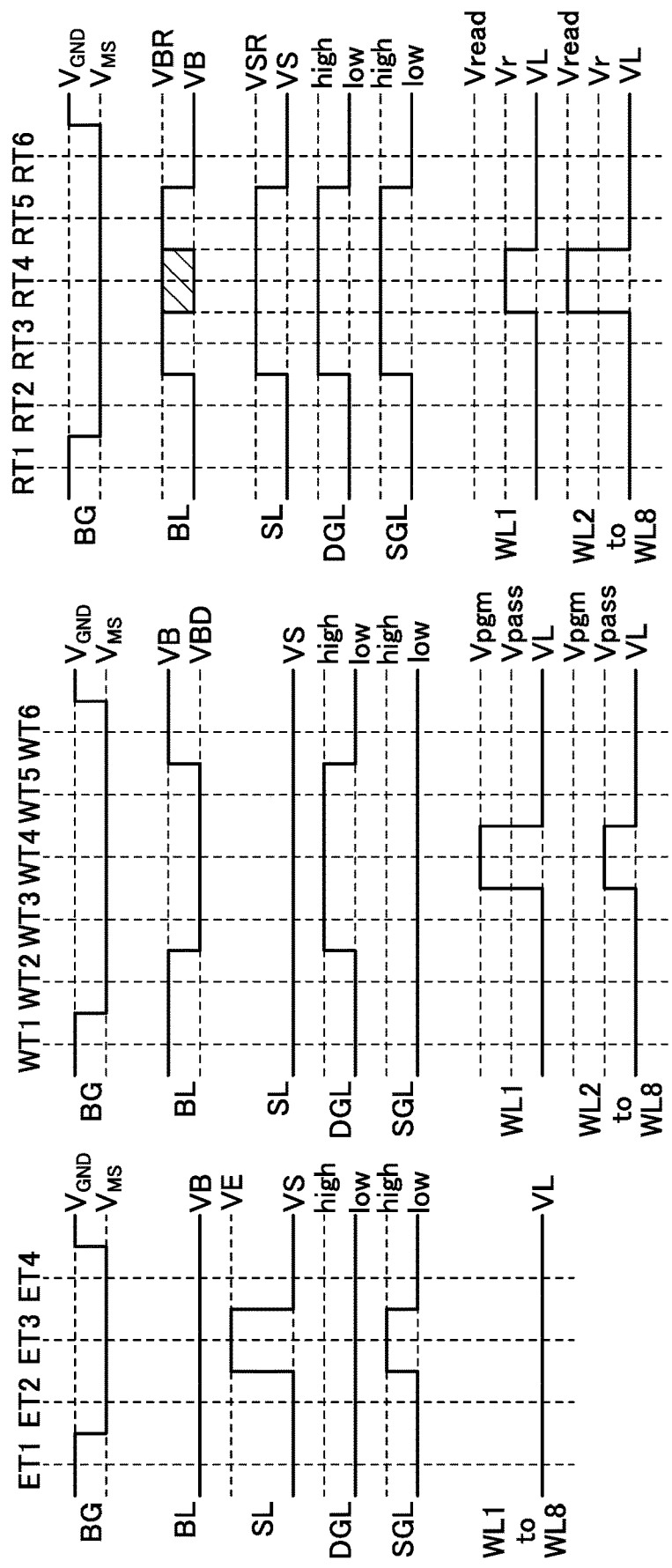
FIG. 36A, FIG. 36B, and FIG. 36C are timing charts for illustrating operation examples of a memory device.

FIG. 36A to FIG. 36C are timing charts showing examples of the erasing operation, the writing operation, and the reading operation, respectively, which are performed on the memory string 112, and the timing charts show a change in the potential of each of the wiring BG, the bit line BL, the source line SL, the selection gate line DGL, the selection gate line SGL, and the word line WL1 to the word line WL8. Note that in FIG. 36A to FIG. 36C, high denotes a high-level potential, and low denotes a low-level potential. Furthermore, in FIG. 36A, potentials that are supplied to the word line WL1 to the word line WL8 are substantially equal to each other, and thus the word line WL1 to the word line WL8 are collectively shown. In FIG. 36B, data is written to the memory transistor MT1, and thus the word line WL1 is separately shown from the word line WL2 to the word line WL8. In FIG. 36C, data is read from the memory transistor MT1, and thus the word line WL1 is separately shown from the word line WL2 to the word line WL8.

<<Erasing Operation>>

Similarly to the above, in the case where data is written to the memory transistor MT, data is preferably erased before the writing operation. FIG. 36A shows an example of the erasing operation of data that is performed between Time ET1 and Time ET4 and at the time around the period.

Before Time ET1, for example, a ground potential is supplied to the wiring BG. Note that in FIG. 36, the ground potential is denoted by VGND. The potential supplied to the wiring BG may be a positive potential or a negative potential.

Before Time ET1, a low-level potential VL at which each of the memory transistor MT1 to the memory transistor MT8 is in an off state (e.g., 0 V) is applied to the word line WL1 to the word line WL8.

Between Time ET1 and Time ET2, a voltage $V_{MS}$ that is a negative potential (e.g., −2 V) is applied to the wiring BG as a potential lower than the potential at Time ET1. Accordingly, each of the selection transistor SDT, the selection transistor SST, and the memory transistor MT1 to the memory transistor MT8 has normally-off characteristics.

Furthermore, between Time ET1 and Time ET2, a low-level potential (e.g., 0 V) is supplied to each of the selection gate line DGL and the selection gate line SGL. Thus, the selection transistor SDT and the selection transistor SST are in an off state.

Since the selection transistor SDT and the selection transistor SST are in an off state, the potentials of the bit line BL and the source line SL between Time ET1 and Time ET2 may be given potentials. Note that in FIG. 36A, the potential of the source line SL is denoted by VS and the potential of the bit line BL is denoted by VB. Moreover, the potential VS and the potential VB may be equal to each other or different from each other.

Furthermore, between Time ET1 and Time ET2, a potential VL at which each of the memory transistor MT1 to the memory transistor MT8 is in an off state (e.g., 0 V) is applied to the word line WL1 to the word line WL8.

Between Time ET2 and Time ET3, a high-level potential is applied to the selection gate line SGL, and the erasing potential VE (e.g., higher than or equal to 10 V) is applied to the wiring SL. At this time, the high-level potential supplied to the selection gate line SGL is preferably a potential at which the selection transistor SST is in an on state (e.g., higher than or equal to 4 V).

The operation between Time ET1 and Time ET3 is performed, so that the erasing potential VE can be supplied to source terminals or drain terminals of the memory transistor M1 to the memory transistor MT8 that are electrically connected in series. Thus, electrons accumulated in each of the charge accumulation layers can be extracted. Accordingly, the memory transistor MT1 to the memory transistor MT8 hold data "1".

Between Time ET3 and Time ET4, a low-level potential is applied to the selection gate line SGL, and the potential VS is applied to the source line SL. Accordingly, the selection transistor SST is in an off state.

After Time ET4, a potential higher than $V_{MS}$, for example, the ground potential VGND is supplied to the wiring BG.

By the operation between Time ET1 and Time ET4 and at the time around the period, the erasing operation of data can be performed on the memory string 112 included in the memory circuit or the semiconductor device.

Note that in this operation example, the selection transistor SDT is always in an off state; however, the operation method of a semiconductor device of one embodiment of the present invention is not limited to this. For example, like the selection transistor SST, the selection transistor SDT may be in an on state between Time ET2 and Time ET3, the selection transistor SDT may be in an off state between Time ET2 and Time ET3, and the potential of the wiring BL may be VE when the selection transistor SDT is in an on state. Accordingly, the erasing operation of data can be performed at a higher speed than the above operation.

Note that in the erasing operation of this operation example, after a potential $V_{MS}$ is applied to the wiring BG, a high-level potential is applied to the selection gate line SGL; however, the operation method of a semiconductor device of one embodiment of the present invention is not limited to this. For example, the application of the potential $V_{MS}$ to the wiring BG may be performed at substantially the same timing as the application of the high-level potential to the selection gate line SGL. Furthermore, for example, in the case where the erasing operation is desired to be performed fast, the application of the potential $V_{MS}$ to the wiring BG is preferably always performed.

<<Writing Operation>>

Next, the writing operation of data is described. FIG. 36B shows an example of the writing operation of data that is performed between Time WT1 and Time WT6 and at the time around the period.

Operations before Time WT1 and between Time WT1 and Time WT2 can be similar to the operations before Time ET1 and between Time ET1 and Time ET2 in the erasing operation. Thus, for the operations before Time WT1 and between Time WT1 and Time WT2, the description on the operations before Time ET1 and between Time ET1 and Time ET2 in the erasing operation can be referred to.

A high-level potential is applied to the selection gate line DGL between Time WT2 and Time WT3, and the potential VBD corresponding to data for writing is applied to the wiring BL. As the potential VBD, for example, a potential lower than Vpgm or Vpass described later, a ground potential, or the like can be used. Note that in the case where the potential VB is sufficiently lower than the potential Vpgm or Vpass, the potential is not necessarily changed from the potential VB. At this time, the high-level potential supplied to the selection gate line DGL is preferably a potential at which the selection transistor SDT is in an on state (e.g., higher than or equal to 4 V).

Between Time WT3 and Time WT4, data writing to the memory transistor MT1 starts. Specifically, Vpgm (e.g., higher than or equal to 15 V) is applied, as a selection potential for writing, to the word line WL1 of a page on which writing is performed, and the positive potential Vpass is applied to the word lines WL2 to WL8 of pages on which writing is not performed. At this time, Vpass supplied to the word lines WL2 to WL8 is preferably a potential at which the memory transistor MT2 to the memory transistor MT8 are in an on state (e.g., higher than or equal to 5 V and lower than or equal to 7 V).

Thus, data corresponding to the potential of the bit line BL is written to the memory transistor MT1. Specifically, in the case where a potential of the bit line BL is a low potential (e.g., 0 V), a potential difference from the writing potential applied to the word line WL1 is large, and thus electrons are injected into the charge accumulation layer of the memory transistor MT1. Furthermore, for example, in the case where the potential of the bit line BL is a positive potential, the potential difference from the writing potential applied to the word line WL1 is small, and thus electrons are not injected into the charge accumulation layer of the memory transistor MT1. That is, when a low potential is applied to the bit line BL, data "0" is written to the memory transistor MT1, and when a positive potential is applied, the data held in the memory transistor MT1 remains "1".

Between Time WT4 and Time WT5, the potential VL is applied to the word lines WL1 to WL8. Accordingly, each of the memory transistor MT1 to the memory transistor MT8 is in an off state.

Between Time WT5 and Time WT6, a low-level potential is applied to the selection gate line DGL, and the potential VB is applied to the bit line BL. Accordingly, the selection transistor SDT is in an off state.

After Time WT6, a potential higher than $V_{MS}$, for example, the ground potential VGND is supplied to the wiring BG.

By the operations between Time WT1 and Time WT6 and at the time around the period, the writing operation of data can be performed on the memory string 112 included in a memory circuit or a semiconductor device.

Note that in the writing operation of this operation example, after a high-level potential is applied to the selection gate line DGL, predetermined potentials are applied to the word lines WL1 to WL8; however, the operation method of a semiconductor device of one embodiment of the present invention is not limited to this. For example, the application of the high-level potential to the selection gate line DGL may be performed at substantially the same timing as the application of predetermined potentials to the word lines WL1 to WL8. Furthermore, for example, after predetermined potentials are applied to the word lines WL1 to WL8, the high-level potential may be applied to the selection gate line DGL. Furthermore, for example, the application of the potential $V_{MS}$ to the wiring BG may be performed at substantially the same timing as the application of the high-level potential to the selection gate line DGL. Furthermore, for example, in the case where the writing operation is desired to be performed fast, the application of the potential $V_{MS}$ to the wiring BG is preferably always performed.

<<Reading Operation>>

Next, the reading operation of data is described. FIG. 36C shows an example of the reading operation of data performed between Time RT1 and Time RT6 and at the time around the period.

Operations before Time RT1 and between Time RT1 and Time RT2 can be similar to the operations before Time ET1 and between Time ET1 and Time ET2 in the erasing operation. Thus, for the operations before Time RT1 and between Time RT1 and Time RT2, the description on the operations before Time ET1 and between Time ET1 and Time ET2 in the erasing operation can be referred to.

Between Time RT2 and Time RT3, a high-level potential is applied to the selection gate line DGL, a high-level potential is applied to the selection gate line SGL, VBR (e.g., 1 V) is precharged to the wiring BL as a potential for the reading operation, and VSR (e.g., a ground potential or 0V) is applied to the wiring SL as a potential lower than VBR. At this time, the high-level potential supplied to the selection gate line DGL is preferably a potential at which the selection transistor SDT is in an on state (e.g., higher than or equal to 4 V), and the high-level potential supplied to the selection gate line SGL is preferably a potential at which the selection transistor SST is in an on state (e.g., higher than or equal to 4 V).

Between Time RT3 and Time RT4, data reading from the memory transistor MT1 starts. Specifically, Vr (e.g., 3 V) is applied to the word line WL1 of a page on which reading is performed as a selection potential for reading, and Vread is applied to the word line WL2 to the word line WL8 of pages on which reading is not performed. At this time, Vread supplied to the word line WL2 to the word line WL8 is preferably a potential which is higher than Vr and at which the memory transistor MT2 to transistor MT8 are in an on state (e.g., higher than or equal to 5 V and lower than or equal to 7 V).

Accordingly, data held in the memory transistor MT1 can be read. Specifically, for example, when 1 V is applied to the bit line BL as VBR and 0 V is applied to the source line SL as VSR, if the data of the memory transistor MT is "1", current flows to the memory string 112 (between the bit line BL and the source line SL), and the potential of the bit line BL decreases. If the data stored in the memory transistor MT1 is "0", current does not flow to the memory string 112 and the potential of the bit line BL does not change. The sense amplifier 123 detects the potential of the bit line BL and amplifies it. Note that in FIG. 36C, the period during which the potential of the bit line BL may be changed due to the reading operation is shown by hatching.

Between Time RT4 and Time RT5, the potential VL is applied to the word line WL1 to the word line WL8. Accordingly, each of the memory transistor MT1 to the memory transistor MT8 is in an off state.

Between Time RT5 and Time RT6, a low-level potential is applied to the selection gate line DGL, a low-level potential is applied to the selection gate line SGL, the potential VB is applied to the bit line BL, and the potential VS is applied to the source line SL. Accordingly, the selection transistor SDT and the selection transistor SST are in an off state.

After Time RT6, a potential higher than $V_{MS}$, for example, the ground potential VGND is supplied to the wiring BG.

By the operations between Time RT1 and Time RT6 and at the time around the period, the reading operation of data can be performed on the memory string 112 included in a memory circuit or a semiconductor device.

Note that in the reading operation of this operation example, after a high-level potential is applied to each of the selection gate line DGL and the selection gate line SGL, predetermined potentials are applied to the word line WL1 to the word line WL8; however, the operation method of a semiconductor device of one embodiment of the present invention is not limited to this. For example, the application of the high-level potential to each of the selection gate line DGL and the selection gate line SGL may be performed at substantially the same timing as the application of predetermined potentials to the word line WL1 to the word line WL8. Furthermore, for example, after the application of predetermined potentials to the word line WL1 to the word line WL8, the high-level potential may be to applied to each of the selection gate line DGL and the selection gate line SGL. Furthermore, for example, the application of the potential $V_{MS}$ to the wiring BG may be performed at substantially the same timing as the application of the high-level potential to each of the selection gate line DGL and the selection gate line SGL. Furthermore, for example, in the case where the reading operation is desired to be performed fast, the application of the potential $V_{MS}$ to the wiring BG is preferably always performed.

Note that the writing, reading, and erasing of two-level data, where data "0" is a state where electrons are injected to the charge accumulation layer of each of the memory transistor MT1 to the memory transistor MT8 and data "1" is a state where electrons are extracted from the charge accumulation layer, are described in this operation example; however, one embodiment of the present invention is not limited to this. For example, data stored in the charge accumulation layer of each of the memory transistor MT1 to the memory transistor MT8 in the memory string 112 may be multi-level data or analog data.

Note that in this specification and the like, in the operation of a memory device or a semiconductor device, the state where electrons are injected to the charge accumulation layer of each of the memory transistor MT1 to the memory transistor MT8 is data "0" and the state where electrons are extracted from the charge accumulation layer is data "1"; however, one embodiment of the present invention is not limited to this. For example, the state where electrons are injected to the charge accumulation layer of each of the memory transistor MT1 to the memory transistor MT8 may be data "1" and the state where electrons are extracted from the charge accumulation layer may be data "0".

The structure described in this embodiment can be used in an appropriate combination with the structures described in the other embodiments.

Embodiment 2

In this embodiment, examples of a semiconductor wafer where the semiconductor device or the like described in the above embodiment is formed and electronic components incorporating the semiconductor device are described.

<Semiconductor Wafer>

First, an example of a semiconductor wafer where a semiconductor device or the like is formed is described with reference to FIG. 37A.

Figure 37A:
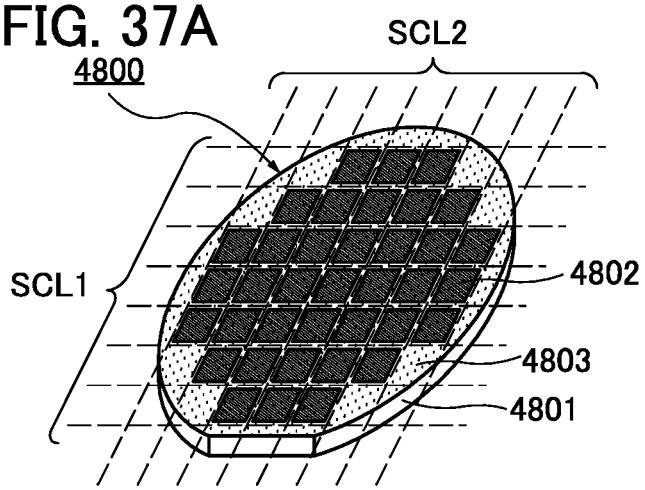
FIG. 37A is a perspective view illustrating an example of a semiconductor wafer.

A semiconductor wafer 4800 illustrated in FIG. 37A includes a wafer 4801 and a plurality of circuit portions 4802 provided on the top surface of the wafer 4801. A portion without the circuit portion 4802 on the top surface of the wafer 4801 is a spacing 4803 that is a region for dicing.

The semiconductor wafer 4800 can be fabricated by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as the next step. The dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe line SCL2.

Figure 37B:
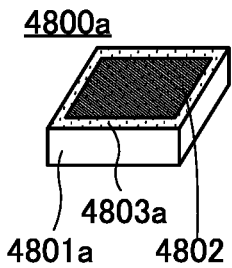
FIG. 37B is a perspective view illustrating an example of a chip.

With the dicing step, a chip 4800*a* as illustrated in FIG. 37B can be cut out from the semiconductor wafer 4800. The chip 4800*a* includes a wafer 4801*a*, the circuit portion 4802, and a spacing 4803*a*. Note that it is preferable to make the spacing 4803*a* small as much as possible. To achieve this, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 37A. The element substrate may be a rectangular semiconductor wafer, for example. The shape of the element substrate can be changed as appropriate, depending on a manufacturing process of an element and an apparatus for manufacturing the element.

<Electronic Component>

Figure 37C:
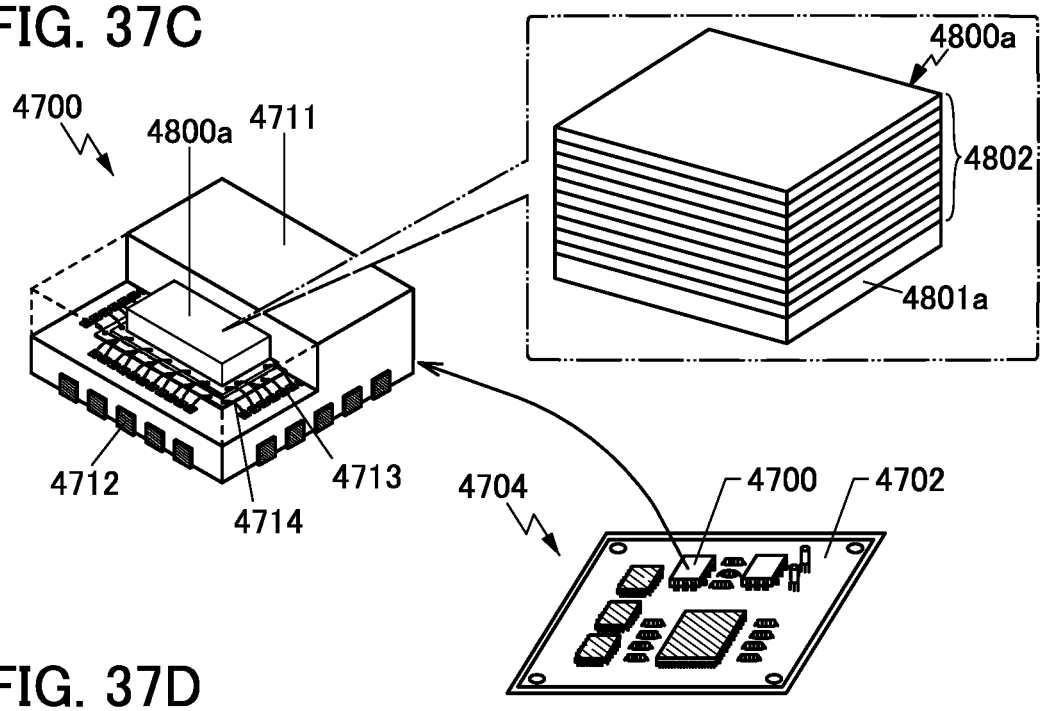
FIG. 37C and FIG. 37D are perspective views illustrating examples of an electronic component.

FIG. 37C is a perspective view of an electronic component 4700 and a substrate (a mounting board 4704) on which the electronic component 4700 is mounted. The electronic component 4700 illustrated in FIG. 37C includes a chip 4800*a* in a mold 4711. Note that a chip 4800*a* illustrated in FIG. 37C has a structure in which the circuit portions 4802 are stacked. For the circuit portion 4802, a semiconductor device described in the above embodiment can be used. To illustrate the inside of the electronic component 4700, some components are omitted in FIG. 37C. The electronic component 4700 includes a land 4712 outside the mold 4711. The land 4712 is electrically connected to an electrode pad 4713, and the electrode pad 4713 is electrically connected to the chip 4800*a* via a wire 4714. The electronic component 4700 is mounted on a printed circuit board 4702, for example. A plurality of such electronic components are combined and electrically connected to each other on the printed circuit board 4702, whereby the mounting board 4704 is completed.

Figure 37D:
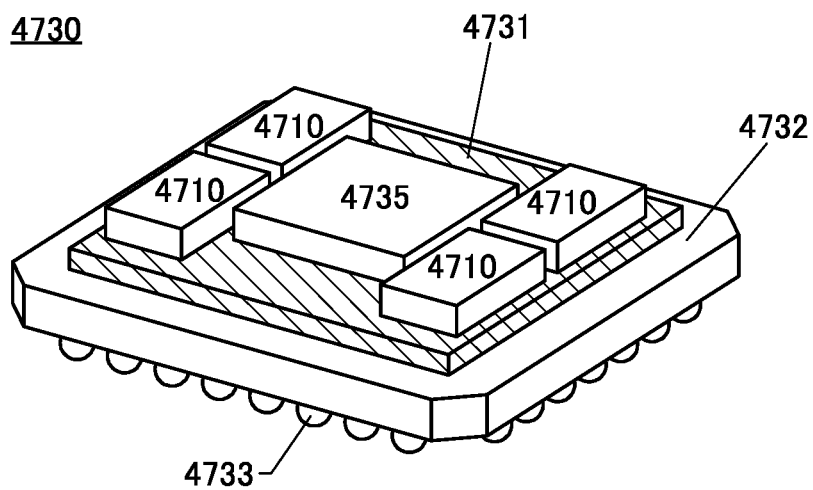

FIG. 37D is a perspective view of an electronic component 4730. The electronic component 4730 is an example of a SiP (System in package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

The electronic component 4730 includes the semiconductor devices 4710. As the semiconductor devices 4710, for example, the semiconductor device described in the above embodiment, a high bandwidth memory (HBM), or the like can be used. An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. Moreover, the interposer 4731 has a function of electrically connecting an integrated circuit provided on the interposer 4731 to an electrode provided on the package substrate 4732. Accordingly, the interposer is referred to as a "redistribution substrate" or an "intermediate substrate" in some cases. A through electrode is provided in the interposer 4731 and the through electrode is used to electrically connect an integrated circuit and the package substrate 4732 in some cases. For a silicon interposer, a TSV (Through Silicon Via) can also be used as the through electrode.

A silicon interposer is preferably used as the interposer 4731. A silicon interposer can be manufactured at lower cost than an integrated circuit because it is not necessary to provide an active element. Furthermore, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, the decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on the bottom portion of the package substrate 4732. FIG. 37D illustrates an example in which the electrode 4733 is formed of a solder ball. Solder balls are provided in a matrix on the bottom portion of the package substrate 4732, whereby BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

Note that this embodiment can be combined with any of the other embodiments in this specification as appropriate.

Embodiment 3

In this embodiment, application examples of the memory device using the semiconductor device or the electronic component described in the above embodiment are described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desk-top computers, but also to large computers such as server systems. Alternatively, the semiconductor device described in the above embodiment is applied to removable memory devices such as memory cards (e.g., SD cards), USB memories, and SSDs (solid state drives). FIG. 38A to FIG. 38E schematically illustrate some structural examples of removable memory devices. A packaged memory chip including the semiconductor device described in the above embodiment is used in a variety of storage devices and removable memories, for example.

Figure 38A:
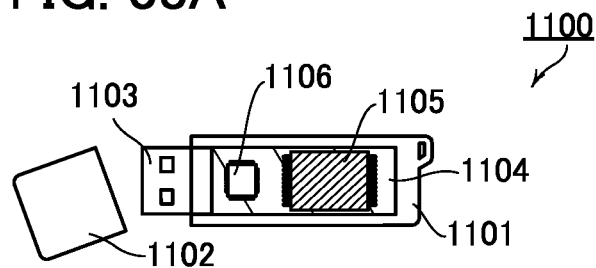
FIG. 38A, FIG. 38B, FIG. 38C, FIG. 38D, and FIG. 38E are schematic views of examples of a memory device.

FIG. 38A is a schematic diagram of a USB memory. A USB memory 1100 includes a housing 1101, a cap 1102, a USB connector 1103, and a substrate 1104. The substrate 1104 is stored in the housing 1101. The substrate 1104 is provided with a memory chip 1105 and a controller chip 1106, for example. The semiconductor device described in the above embodiment can be incorporated in the memory chip 1105 or the like on the substrate 1104.

Figure 38B:
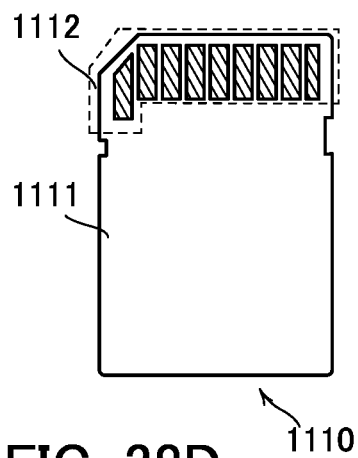
Figure 38C:
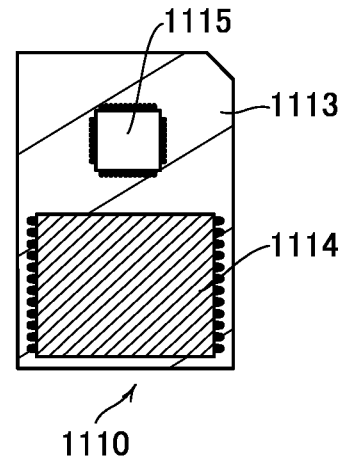

FIG. 38B is an external schematic diagram of an SD card, and FIG. 38C is a schematic diagram illustrating the internal structure of the SD card. An SD card 1110 includes a housing 1111, a connector 1112, and a substrate 1113. The substrate 1113 is stored in the housing 1111. The substrate 1113 is provided with a memory chip 1114 and a controller chip 1115, for example. When the memory chip 1114 is also provided on a back side of the substrate 1113, the capacity of the SD card 1110 can be increased. A wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like on the substrate 1113.

Figure 38D:
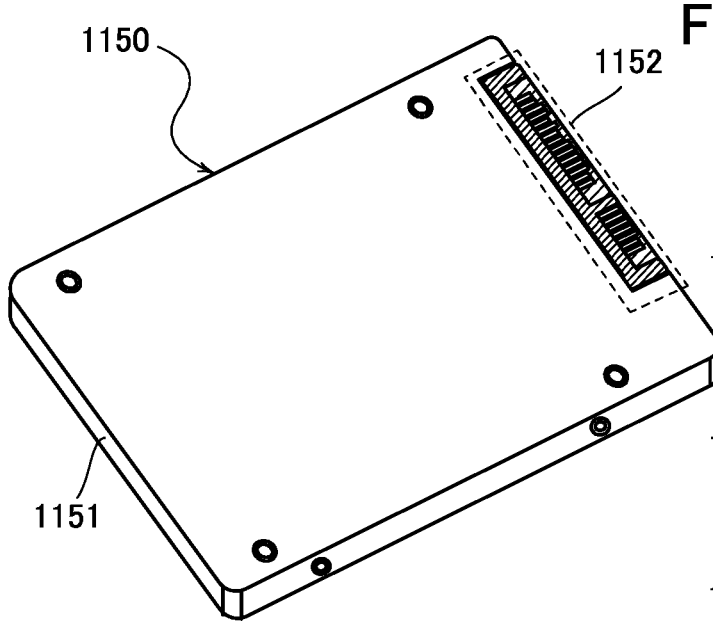
Figure 38E:
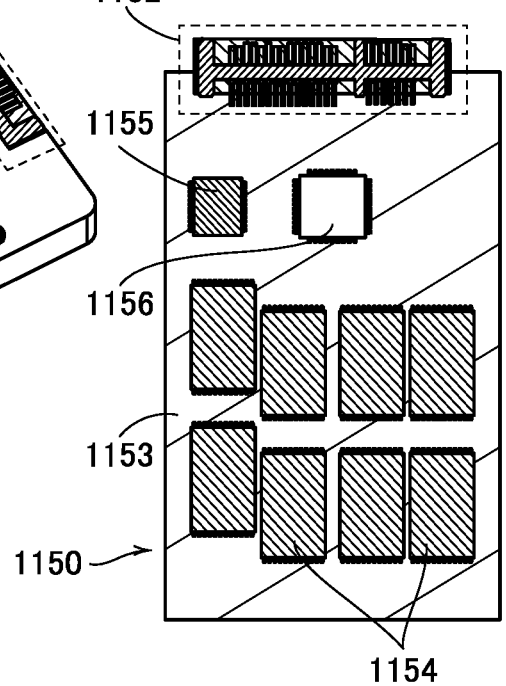

FIG. 38D is an external schematic diagram of an SSD, and FIG. 38E is a schematic diagram illustrating the internal structure of the SSD. An SSD 1150 includes a housing 1151, a connector 1152, and a substrate 1153. The substrate 1153 is stored in the housing 1151. The substrate 1153 is provided with a memory chip 1154, a memory chip 1155, and a controller chip 1156, for example. The memory chip 1155 is a work memory of the controller chip 1156, and a DRAM chip is used, for example. When the memory chip 1154 is also provided on a back side of the substrate 1153, the capacity of the SSD 1150 can be increased. The semiconductor device described in the above embodiment can be incorporated in the memory chip 1154 or the like on the substrate 1153.

The structure described in this embodiment can be used in appropriate combination with the structures described in the other embodiments.

Embodiment 4

In this embodiment, an AI system in which the semiconductor device or the electronic component described in the above embodiments is used is described with reference to FIG. 39.

Figure 39:
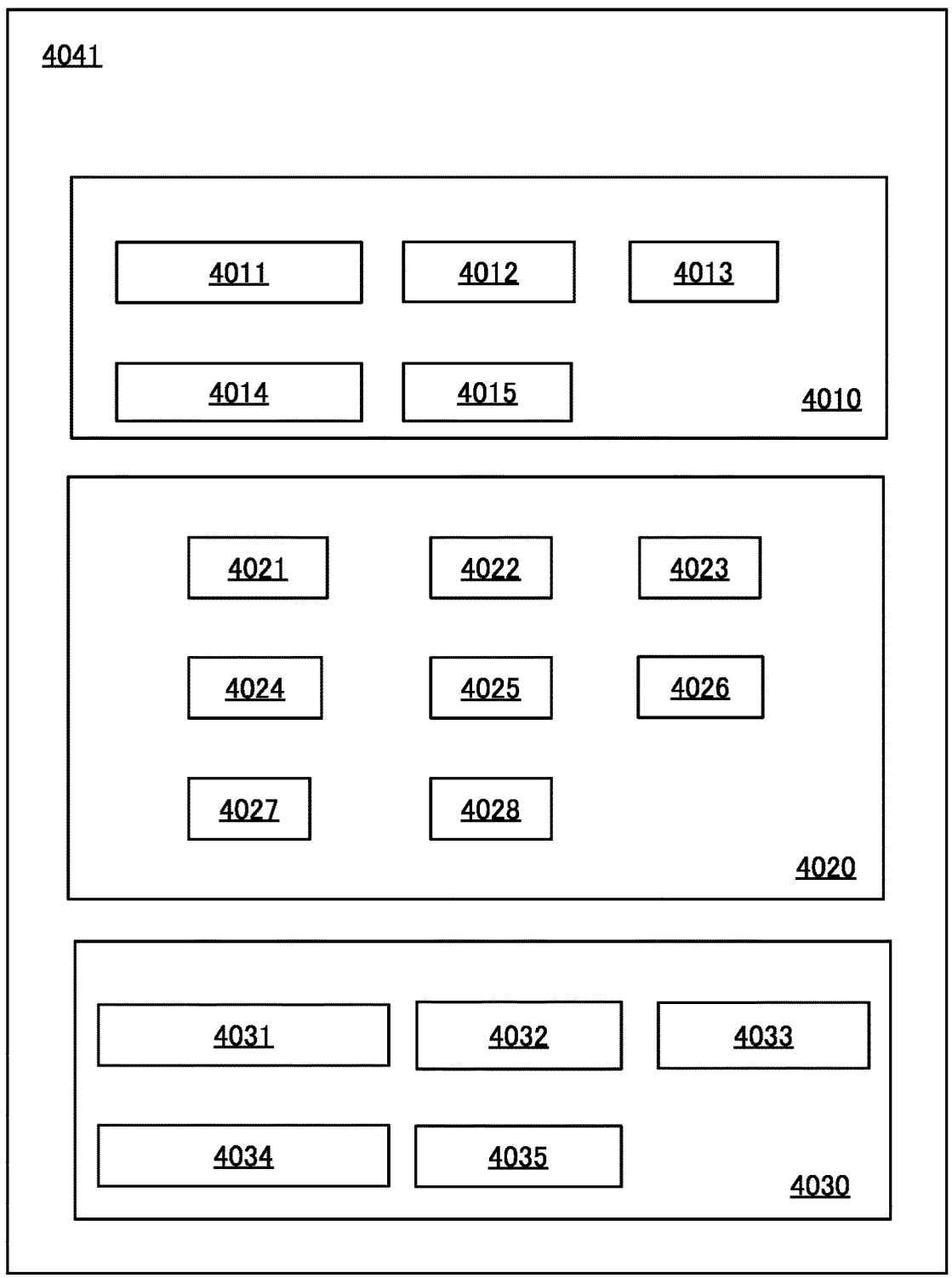
FIG. 39 is a block diagram illustrating a structure example of an AI system.

FIG. 39 is a block diagram illustrating a structure example of an AI system 4041. The AI system 4041 includes an arithmetic portion 4010, a control portion 4020, and an input/output portion 4030.

The arithmetic portion 4010 includes an analog arithmetic circuit 4011, a DOSRAM 4012, a NOSRAM 4013, an FPGA 4014, and a 3D-NAND 4015.

The term DOSRAM (registered trademark) is an abbreviation of "Dynamic Oxide Semiconductor RAM", which indicates a RAM including a 1T (transistor) and 1C (capacitor) memory cell.

NOSRAM (registered trademark) is an abbreviation of "nonvolatile oxide semiconductor RAM", which is RAM including a gain cell (2T or 3T) memory cell. DOSRAM and NOSRAM are memories utilizing a low off-state current of a transistor using an oxide in a semiconductor (hereinafter, referred to as an OS transistor). Note that hereinafter, a memory device using an OS transistor, such as the NOSRAM, is referred to as an OS memory in some cases.

The control portion 4020 includes a CPU (Central Processing Unit) 4021, a GPU (Graphics Processing Unit) 4022, a PLL (Phase Locked Loop) 4023, an SRAM (Static Random Access Memory) 4024, a PROM (Programmable Read Only Memory) 4025, a memory controller 4026, a power supply circuit 4027, and a PMU (Power Management Unit) 4028.

The input/output portion 4030 includes an external memory control circuit 4031, an audio codec 4032, a video codec 4033, a general-purpose input/output module 4034, and a communication module 4035.

The arithmetic portion 4010 can perform learning or inference by a neural network.

The analog arithmetic circuit 4011 includes an A/D (analog/digital) converter circuit, a D/A (digital/analog) converter circuit, and a product-sum operation circuit.

The analog arithmetic circuit 4011 is preferably formed using an OS transistor. The analog arithmetic circuit 4011 formed using an OS transistor includes an analog memory and can execute a product-sum operation necessary for the learning and the inference with low power consumption.

The DOSRAM 4012 is a DRAM formed using an OS transistor, and the DOSRAM 4012 is a memory that temporarily stores digital data sent from the CPU 4021. The DOSRAM 4012 includes a memory cell including an OS transistor and a read circuit portion including a Si transistor. Because the memory cell and the read circuit portion can be provided in different layers that are stacked, the entire circuit area of the DOSRAM 4012 can be small.

In the calculation with the neural network, input data exceeds 1000 in some cases. In the case where the input data are stored in the SRAM, the input data has to be stored piece by piece because of the circuit area limitation and small storage capacity of the SRAM. The DOSRAM 4012 has a larger storage capacity than the SRAM because memory cells can be highly integrated even in a limited circuit area. Therefore, the DOSRAM 4012 can efficiently store the input data.

The NOSRAM 4013 is a nonvolatile memory including an OS transistor. The NOSRAM 4013 consumes less power in writing data than the other nonvolatile memories such as a flash memory, a ReRAM (Resistive Random Access Memory), and an MRAM (Magnetoresistive Random Access Memory). Furthermore, unlike a flash memory and a ReRAM which deteriorate by data writing, the NOSRAM does not have a limit on the number of times of data writing.

Furthermore, the NOSRAM 4013 can store multilevel data of two or more bits as well as one-bit binary data. The multilevel data storage in the NOSRAM 4013 leads to a reduction of the memory cell area per bit.

Furthermore, the NOSRAM 4013 can store analog data as well as digital data. Thus, the analog arithmetic circuit 4011 can use the NOSRAM 4013 as an analog memory. The NOSRAM 4013 can store analog data as it is, and thus a D/A converter circuit and an A/D converter circuit are unnecessary. Therefore, the area of a peripheral circuit for the NOSRAM 4013 can be reduced. In this specification, analog data refers to data having a resolution of three bits (eight levels) or more. The above-described multilevel data might be included in the analog data.

Data and parameters used in the neural network calculation can be once stored in the NOSRAM 4013. The data and parameters may be stored in a memory provided outside the AI system 4041 via the CPU 4021. However, the NOSRAM 4013 provided inside the AI system 4041 can store the data and parameters more quickly with lower power consumption.

Furthermore, the NOSRAM 4013 enables a longer bit line than the DOSRAM 4012 and thus can have an increased storage capacity.

The FPGA 4014 is an FPGA using an OS transistor. By including the FPGA 4014, the AI system 4041 can establish a connection of a neural network such as a deep neural network (DNN), a convolutional neural network (CNN), a recurrent neural network (RNN), an autoencoder, a deep Boltzmann machine (DBM), a deep belief network (DBN), or the like described later, with hardware. The connection of the neural network with hardware enables higher speed performance.

The FPGA 4014 is an FPGA including an OS transistor (OS-FPGA). An OS-FPGA can have a smaller memory area than an FPGA formed of an SRAM. Thus, adding a context switching function only causes a small increase in area. Moreover, an OS-FPGA can transmit data and parameters at high speed by boosting.

The 3D-NAND 4015 is a nonvolatile memory using an oxide semiconductor. The 3D-NAND 4015 is a highly integrated memory in which the storage capacity per unit area is large.

The 3D-NAND 4015 can store multilevel data of two or more bits as well as one-bit binary data. The multilevel data storage in the 3D-NAND 4015 can further reduce the memory cell area per bit.

As the 3D-NAND 4015, for example, the semiconductor device described in the above embodiment can be used. This can reduce the area occupied by the memory cell, and accordingly the 3D-NAND 4015 can be more highly integrated. Thus, the storage capacity per unit area of the 3D-NAND 4015 can be increased.

In the AI system 4041, the analog arithmetic circuit 4011, the DOSRAM 4012, the NOSRAM 4013, and the FPGA 4014 can be provided on one die (chip). Thus, the AI system 4041 can perform calculation of the neural network quickly with low power consumption. The analog arithmetic circuit 4011, the DOSRAM 4012, the NOSRAM 4013, and the FPGA 4014 can be manufactured through the same manufacturing process. This enables the AI system 4041 to be manufactured at low cost.

Note that the arithmetic portion 4010 does not need to include all of the following: the DOSRAM 4012, the NOSRAM 4013, and the FPGA 4014. One or more memories are selected from the DOSRAM 4012, the NOSRAM 4013, and the FPGA 4014 in accordance with a problem that is desired to be solved in the AI system 4041.

The AI system 4041 can execute a method such as a deep neural network (DNN), a convolutional neural network (CNN), a recurrent neural network (RNN), an autoencoder, a deep Boltzmann machine (DBM), or a deep belief network (DBN) in accordance with the problem that is desired to be solved. The PROM 4025 can store a program for executing at least one of these methods. Furthermore, part or the whole of the program may be stored in the NOSRAM 4013 or the 3D-NAND 4015. The 3D-NAND 4015, which is a highly integrated memory in which the storage capacity per unit area is large, can store a high-capacity program.

Most of the existing programs used as libraries are designed on the premise that the programs are processed by a GPU. Therefore, the AI system 4041 preferably includes the GPU 4022. The AI system 4041 can execute the bottleneck product-sum operation among all the product-sum operations used for learning and inference in the arithmetic portion 4010, and execute the other product-sum operations in the GPU 4022. In this manner, the learning and inference can be performed at high speed.

The power supply circuit 4027 generates not only a low power supply potential for a logic circuit but also a potential for an analog operation. The power supply circuit 4027 may use an OS memory. Storing a reference potential in the OS memory can reduce the power consumption of the power supply circuit 4027.

The PMU 4028 has a function of temporarily stopping the power supply to the AI system 4041.

As a register in each of the CPU 4021 and the GPU 4022, an OS memory is preferably included. By including the OS memory, each of the CPU 4021 and the GPU 4022 can retain data (logic value) in the OS memory even when power supply is stopped. As a result, the AI system 4041 can save the electric power.

The PLL 4023 has a function of generating a clock. The AI system 4041 performs an operation on the basis of the clock generated by the PLL 4023. The PLL 4023 preferably includes an OS memory. When an OS memory is included in the PLL 4023, an analog potential with which the clock oscillation cycle is controlled can be held.

The AI system 4041 may store data in an external memory such as a DRAM. For this reason, the AI system 4041 preferably includes the memory controller 4026 functioning as an interface with the external DRAM. Furthermore, the memory controller 4026 is preferably provided near the CPU 4021 or the GPU 4022. Thus, data transmission can be performed at high speed.

Some or all of the circuits illustrated in the control portion 4020 can be formed on the same die as the arithmetic portion 4010. Thus, the AI system 4041 can execute neural network calculation at high speed with low power consumption.

Data used for neural network calculation is stored in an external memory device (an HDD (Hard Disk Drive), an SSD (Solid State Drive), or the like) in many cases. Therefore, the AI system 4041 preferably includes the external memory control circuit 4031 functioning as an interface with the external memory device.

Because the neural network often deal with audio and video for learning and inference, the AI system 4041 includes the audio codec 4032 and the video codec 4033. The audio codec 4032 encodes and decodes audio data, and the video codec 4033 encodes and decodes video data.

The AI system 4041 can perform learning or make an inference using data obtained from an external sensor. For this reason, the AI system 4041 includes the general-purpose input/output module 4034. The general-purpose input/output module 4034 includes a USB (Universal Serial Bus), an I2C (Inter-Integrated Circuit), or the like, for example.

The AI system 4041 can perform learning or make an inference using data obtained via the Internet. For this reason, the AI system 4041 preferably includes the communication module 4035.

The analog arithmetic circuit 4011 may include a multilevel flash memory as an analog memory. However, the flash memory has a limit on the number of rewriting times. In addition, it is extremely difficult to embed the multilevel flash memory (to form the arithmetic circuit and the memory on the same die).

Alternatively, the analog arithmetic circuit 4011 may use a ReRAM as an analog memory. However, the ReRAM has a limit on the number of rewriting times and also has a problem in storage accuracy. Moreover, the ReRAM is a two-terminal element, and thus has a complicated circuit design for separating data writing and data reading.

Further alternatively, the analog arithmetic circuit 4011 may include an MRAM as an analog memory. However, the MRAM has a problem in storage accuracy because of its low magnetoresistive ratio.

In consideration of the above, an OS memory is preferably used as an analog memory in the analog arithmetic circuit 4011.

The structure described in this embodiment can be used in appropriate combination with the structures described in the other embodiments.

Embodiment 5

<Application Examples of AI System>

In this embodiment, application examples of the AI system described in the above embodiment are described with reference to FIG. 40A and FIG. 40B.

Figure 40A:
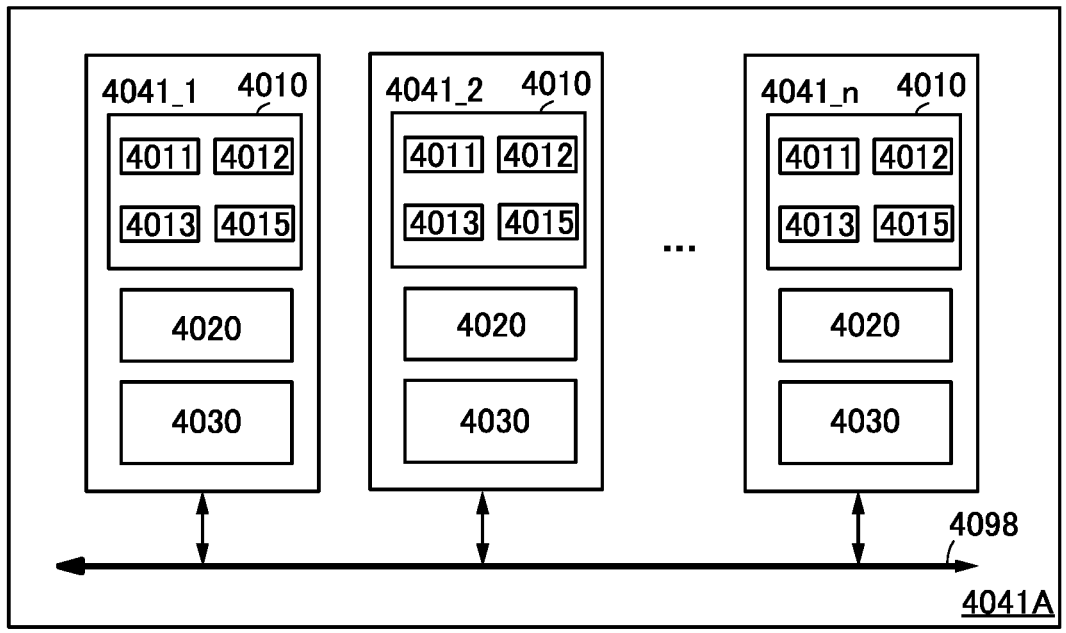
FIG. 40A and FIG. 40B are block diagrams illustrating application examples of an AI system.

FIG. 40A is an AI system 4041A in which the AI systems 4041 described with FIG. 39 are arranged in parallel and a signal can be transmitted between the systems via a bus line.

The AI system 4041A illustrated in FIG. 40A includes a plurality of AI systems 4041_1 to 4041_n (n is a natural number). The AI system 4041_1 to the AI system 4041_n are connected to each other via a bus line 4098. Note that in FIG. 40A, the AI system 4041_1, the AI system 4041_2, and the AI system 4041_n are illustrated and other AI systems are not illustrated.

Figure 40B:
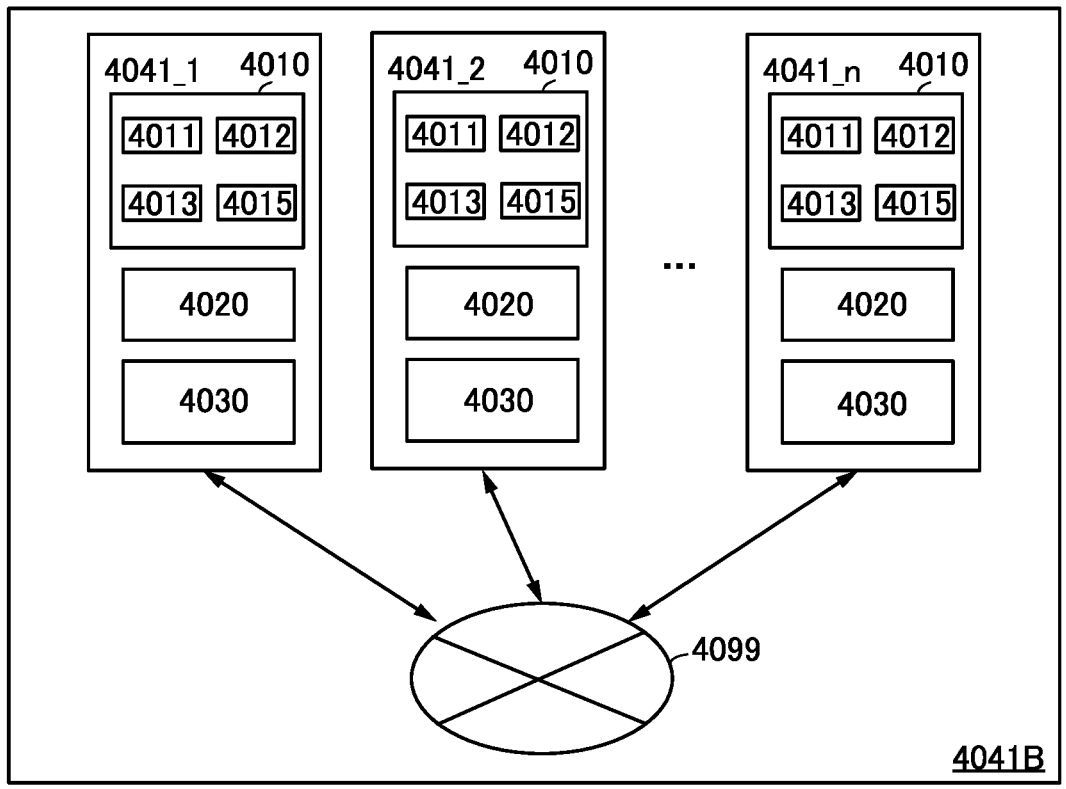

FIG. 40B is an AI system 4041B in which the AI systems 4041 described with FIG. 39 are arranged in parallel as in FIG. 40A and a signal can be transmitted between the systems via a network.

The AI system 4041B illustrated in FIG. 40B includes the plurality of AI systems 4041_1 to 4041_n. The AI system 4041_1 to the AI system 4041_n are connected to each other via a network 4099. Note that in FIG. 40B, the AI system 4041_1, the AI system 4041_2, and the AI system 4041_n are illustrated and other AI systems are not illustrated.

A structure may be employed in which a communication module is provided in each of the AI system 4041_1 to the AI system 4041_n so that the network 4099 can perform wireless or wired communication. The communication module can perform communication via an antenna. For example, the communication can be performed in such a manner that each electronic device is connected to a computer network such as the Internet, which is the infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), or a GAN (Global Area Network). In the case of performing wireless communication, it is possible to use, as a communication protocol or a communication technology, a communications standard such as LTE (Long Term Evolution), GSM (Global System for Mobile Communication: registered trademark), EDGE (Enhanced Data Rates for GSM Evolution), CDMA 2000 (Code Division Multiple Access 2000), or W-CDMA (registered trademark), or a specification that is communication standardized by IEEE such as Wi-Fi (registered trademark), Bluetooth (registered trademark), or ZigBee (registered trademark).

With the structure in FIG. 40A and FIG. 40B, analog signals obtained with external sensors or the like can be processed by different AI systems. For example, analog signals containing biological information such as brain waves, a pulse, blood pressure, and body temperature obtained with a variety of sensors such as a brain wave sensor, a pulse wave sensor, a blood pressure sensor, and a temperature sensor can be processed by different AI systems. When the signal processing or learning is performed by different AI systems, the amount of information processed by each AI system can be reduced. Accordingly, the signal processing or learning can be performed with a smaller amount of arithmetic processing. As a result, recognition accuracy can be increased. The information obtained with each AI system is expected to enable instant and unified understanding of biological information that changes in a complex way.

The structure described in this embodiment can be used in an appropriate combination with the structures described in the other embodiments.

Embodiment 6

<Electronic Device>

The semiconductor device according to one embodiment of the present invention can be used for a variety of electronic devices. FIG. 41A, FIG. 41B, and FIG. 42A to FIG. 42F illustrate specific examples of electronic devices using the semiconductor device according to one embodiment of the present invention.

Figure 41A:
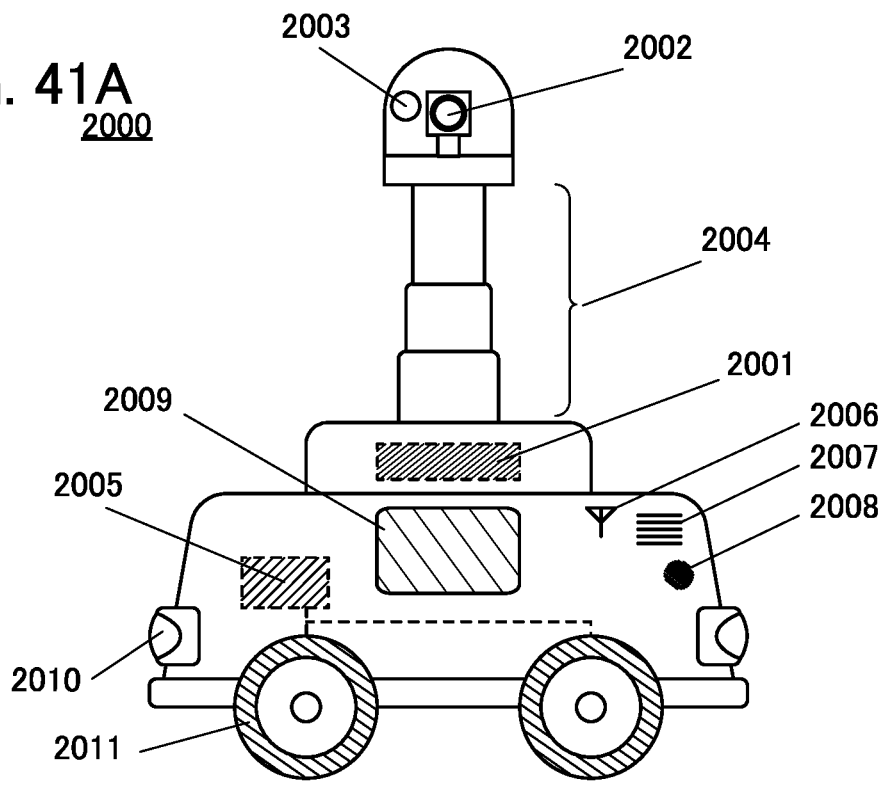
FIG. 41A is a view illustrating an example of an electronic device.

A robot 2000 illustrated in FIG. 41A includes an arithmetic device 2001, a sensor 2002, a light 2003, a lift 2004, a driver portion 2005, and a moving mechanism 2011, and can take a still image and a moving image while being moved. Such a robot can be used for a security system or a monitoring system.

The robot 2000 may further include a communication means 2006, a speaker 2007, a microphone 2008, a display portion 2009, a light-emitting portion 2010, and the like.

For the arithmetic device 2001, the semiconductor device according to one embodiment of the present invention can be used. In the arithmetic device 2001, an IC in which the AI system according to one embodiment of the present invention is incorporated can be used. The sensor 2002 has a function of a camera which takes images of surroundings of the robot 2000. The light 2003 can be used as a light when the images of the surroundings of the robot 2000 are taken by the sensor 2002. When a still image is taken by the sensor 2002, the light 2003 preferably functions as a flashlight. The sensor 2002 is connected to a main body of the robot via the lift 2004. The height of the sensor 2002 can be adjusted by the lift 2004. The lift 2004 is preferably telescopic. Alternatively, the lift 2004 may be a foldable lift composed of a plurality of booms. The robot 2000 is provided with the driver portion 2005 and the moving mechanism 2011 connected to the driver portion 2005 and thus an imaging range of the sensor 2002, that is, a monitoring range, is expanded, which is preferred.

The communication means 2006 can send information whose image is taken by the sensor 2002 to a manager or the server owned by the manager. When the arithmetic device 2001 analyzes the information whose image is taken by the sensor 2002 and judges that there is an emergency such as such as a crime, an accident, or a fire, the communication means 2006 can report to a security company, the police, fire fighting, a medical institution, or the owner of the land or the building. The speaker 2007 can transmit information such as an alert to a criminal, a call to an injured person or an emergency patient, and evacuation guidance, to the surroundings of the robot. The microphone 2008 can be used to obtain sounds around the robot 2000. When used together with the communication means 2006 and the speaker 2007, the robot 2000 can have a function as a telephone. A person around the robot 2000 can have a conversation with the manager or a given person. The display portion 2009 can display given information. In emergency, the disaster information and the evacuation route can be displayed. When used together with the communication means 2006, the speaker 2007, and the microphone 2008, the robot 2000 can have a function as a videophone. A person around the robot 2000 can have a conversation with the manager or a given person while seeing the display portion 2009.

The light-emitting portion 2010 can show the direction of movement and the stopped state of the robot 2000 with characters or light. In addition, emergency may also be shown.

Figure 41B:
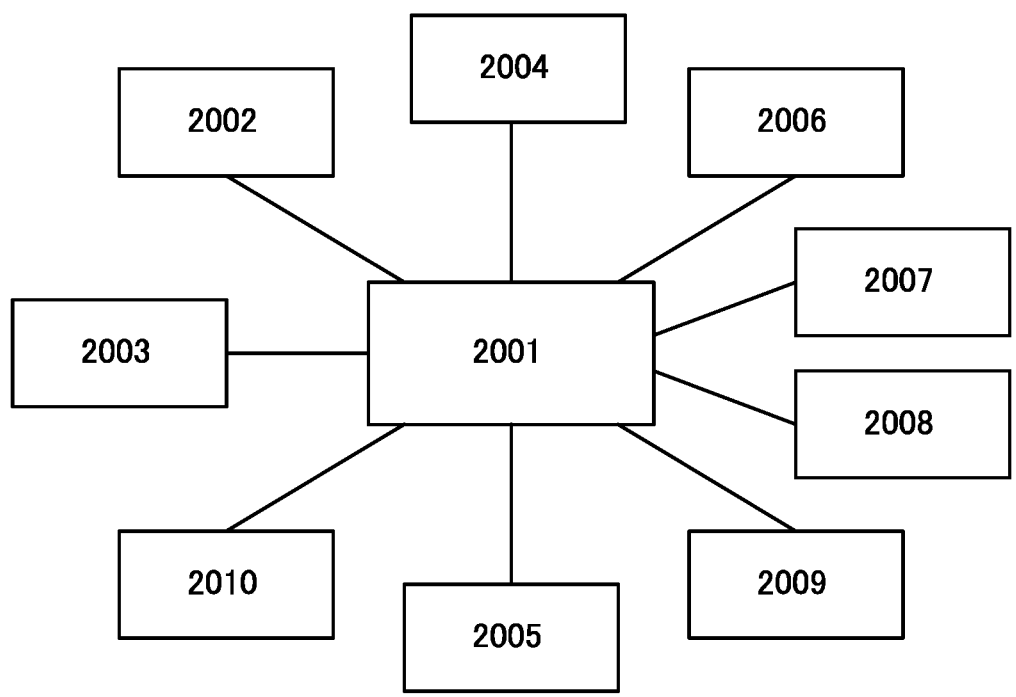
FIG. 41B is a block diagram illustrating a structure example of an electronic device.

FIG. 41B is a block diagram illustrating a configuration of the robot 2000. The arithmetic device 2001 adjusts turning on or off and the brightness of the light 2003 from information such as an image obtained by the sensor 2002. In addition, the height of the lift 2004 is adjusted or the driver portion 2005 is controlled to align the positions of the robot 2000 and the sensor 2002. The operating condition of the driver portion 2005 can be shown by using the light-emitting portion 2010. With the communication means 2006, information around the robot 2000 obtained from the sensor 2002 and the microphone 2008 can be transmitted to the manager or the server owned by the manager. Depending on the judgement of the arithmetic device 2001 or the manager, information can be sent to the surroundings of the robot 2000 with the speaker 2007 and the display portion 2009.

In the case where a sensor that can take an image even in dark surroundings is used as a sensor used as the sensor 2002, the light 2003 is not necessarily provided. As such a sensor, an image sensor using selenium (Se) in the light receiving portion can be used.

The robot 2000 as described above can be used in commercial facilities and for security of offices. Information obtained from the sensor 2002 and the microphone 2008 is stored in the arithmetic device 2001 or the server. The stored information is analyzed by the AI system to check whether there is an abnormality such as a loss or a damage of an object, entry of a suspicious individual, or a disaster such as a fire. For the information analysis, deep learning may be used. When the occurrence of an abnormality is judged, the robot 2000 performs report to the manager and transmits information to the surroundings, and records the conditions of the surroundings.

The robot 2000 may be used to monitor the growing conditions of crops. The robot 2000 placed in a rice field or a field monitors the shapes, the sizes, or the colors of leaves or fruit with the sensor 2002 to check whether the crops are damaged by disease or not or whether the crops are harmed by pests or not. Since the moving mechanism 2011 is provided for the robot 2000, the growing conditions of the crops can be monitored in a wide range. Since the robot 2000 is provided with the lift 2004, the leaves and fruit at any height can be monitored regardless of the kind of crops and the growing conditions. The monitoring results are sent to a producer using the communication means 2006, and the producer can determine the kind, the amount, and the spraying timing of fertilizer and agricultural chemicals necessary for the crops. The monitoring results may be analyzed with the AI system using the arithmetic device 2001, and the kind, the amount, and the spraying timing of fertilizer and agricultural chemicals necessary for the crops may be determined and reported to the producer. Deep learning may be used for analysis of the monitoring results.

Figure 42A:
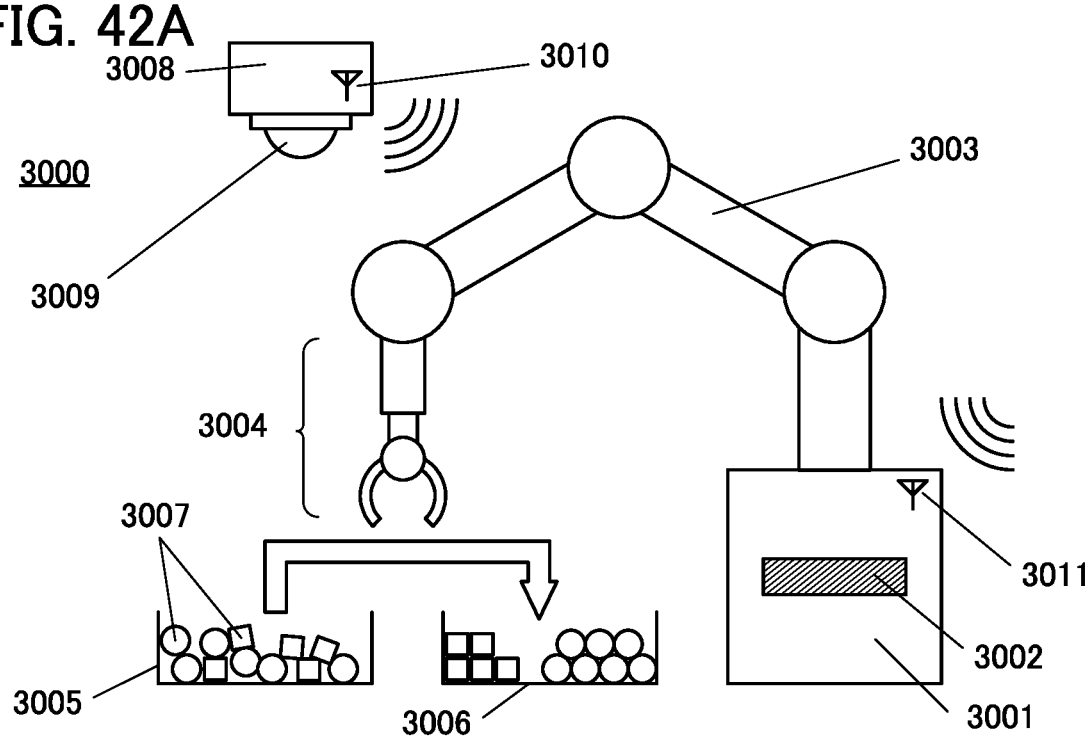
FIG. 42A, FIG. 42B, FIG. 42C, FIG. 42D, FIG. 42E, and FIG. 42F are perspective views illustrating examples of an electronic device.

FIG. 42A illustrates a sorting system 3000 using a robot 3001. The robot 3001 includes an arithmetic device 3002, a boom 3003, and an arm 3004. The robot 3001 may further include a wired or wireless communication means 3011. In addition, the sorting system 3000 includes a housing 3008 including a sensor 3009. The housing 3008 includes a communication means 3010. The housing 3008 is provided for a ceiling, a wall, or a beam (not illustrated) of the sorting system 3000 or a sorting operation area. The housing 3008 may be provided in the robot 3001. For example, the housing 3008 may be provided for the boom 3003 or the arm 3004. In the case where the housing 3008 is provided in the robot 3001, information obtained by the sensor 3009 may be sent to the arithmetic device 3002 without passing through the communication means 3010 and the communication means 3011, and processed.

The boom 3003 is movable, whereby the arm 3004 can be placed at a desired position. The arm 3004 may be telescopic. The arm 3004 placed over a desired object 3007 may be stretched to grab the desired object 3007, shortened, and then moved by the boom 3003.

The sorting system 3000 can transfer the object 3007 in a receptacle 3005 to a receptacle 3006. The receptacle 3005 and the receptacle 3006 may have the same shape or different shapes. Furthermore, a plurality of objects 3007 put in one receptacle 3005 may be moved separately to a plurality of receptacles 3006.

As the receptacle 3005 and the receptacle 3006, a container, a cardboard box, a box for packing a product, a case, a film, a bag, a tray for storing foods, a lunch box, or the like is used. At least one of the receptacle 3005 and the receptacle 3006 may be cooking utensils such as a pot or a frying pan.

For the arithmetic device 3002, the semiconductor device according to one embodiment of the present invention can be used. In the arithmetic device 3002, an IC in which the AI system according to one embodiment of the present invention is incorporated can be used.

The sensor 3009 reads out the position and the number of the receptacle 3005, the position and the number of the receptacle 3006, the state of the inside of the receptacle 3005, and the state of the object 3007 in the receptacle 3005 and transmits the information to the arithmetic device 3002 using the communication means 3010. The information is transmitted with or without a wire. The information may be transmitted through a wire without the communication means 3010. The arithmetic device 3002 analyzes the transmitted information. Here, the state of the object 3007 indicates the shape or the number of the objects 3007, the overlap between the objects 3007, or the like. The arithmetic device 3002 performs analyzation on the basis of information from the sensor 3009 and derives detailed information on the object 3007. The three-dimensional shape and hardness (or softness) of the object 3007 are derived by comparison with the data stored in the arithmetic device 3002 or the server that can be communicated with the robot 3001. Depending on the three-dimensional shape and hardness (or softness) of the object 3007, the shape of the arm 3004 can be changed. Furthermore, depending on the shape or the size of the object 3007, the position in the receptacle 3006 may be changed or a plurality of receptacles 3006 may be provided to sort the objects 3007.

To derive the detailed information on the object 3007, analysis using the AI system can be utilized. For the information analysis, deep learning may be used.

Figure 42B:
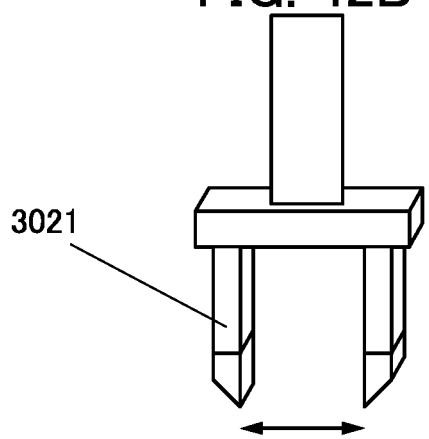
Figure 42C:
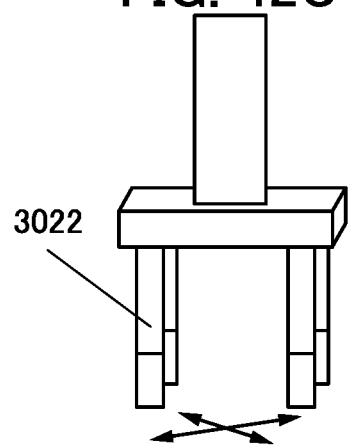
Figure 42D:
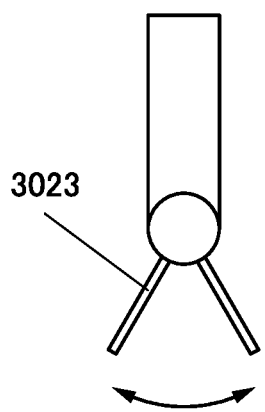
Figure 42E:
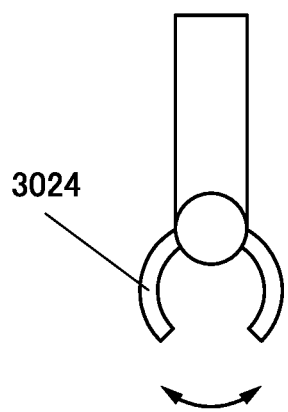
Figure 42F:
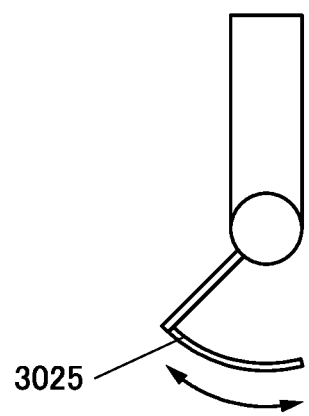

FIG. 42B is an arm in which a pair of plates 3021 can move in the horizontal direction to pinch the object 3007. The pair of plates 3021 moves toward the center horizontally, whereby the object 3007 can be pinched. Such an arm can hold the object 3007 by the surfaces, and is suitable for picking up the object 3007 with a columnar shape, such as a cube or a rectangular solid. FIG. 42C is an arm in which a plurality of bars 3022 can move in the horizontal direction to pinch the object 3007. The plurality of bars 3022 move toward the center horizontally, whereby the object 3007 can be pinched. Such an arm can pinch the object 3007 by the points, and is suitable for picking up the object 3007 in a spherical shape or in a non-fixed shape, that is, the object 3007 in an irregular shape. Although the number of the bars 3022 is four in FIG. 42C, this embodiment is not limited to this. The number of the bars 3022 may be three or five or more. FIG. 42D is an arm in which a pair of plates 3023 rotates around the common axis to be closer to each other to pinch the object 3007. Such an arm can hold the object 3007 by the surfaces, and is suitable for picking up the object 3007 with a thin-film shape, such as paper or films. FIG. 42E is an arm in which a pair of crook-shaped plates 3024 rotates around the common axis such that the ends of them are closer to each other to pick up the object 3007. Such an arm can pinch the object 3007 by the points or the sides, and is suitable for picking up the object 3007 with a thin-film shape, such as paper or films, or the object 3007 with a finer-grained shape. As illustrated in FIG. 42F, a spatula 3025 may be attached to the tip of the arm, and the object 3007 with a smaller particulate shape may be scooped.

The arms illustrated in FIG. 42A to FIG. 42F are just examples and one embodiment of the present invention is not limited to these shapes. In addition, the application of the arms is just an example and one embodiment of the present invention is not limited thereto.

The robot 3001 moves the boom 3003 to move the arm 3004 to a position over the desired object 3007 in the receptacle 3005 on the basis of signals from the arithmetic device 3002. In the case of the telescopic arm 3004, the arm 3004 is stretched, and the tip of the arm 3004 is brought down to a position on the same level as the object 3007. The tip of the arm is moved to catch the desired object 3007. The arm is shortened while catching the object 3007. The boom 3003 is moved again to transfer the arm 3004 to the desired position in the receptacle 3006. At this time, the arm 3004 may be rotated to adjust the angle of the object 3007 to the receptacle 3006. The arm 3004 is stretched to place the object 3007 in the receptacle 3006, and the arm 3004 releases the object 3007. The above operation is repeated, so that the robot 3001 can move the objects 3007 from the receptacle 3005 to the receptacle 3006.

Since the positional information on the receptacle 3005 and the receptacle 3006 and the state of the object 3007 are analyzed using the AI system, the object 3007 can be moved surely regardless of the shape or hardness of the object 3007. Examples of the object 3007 include not only an object packed in a box with a shape of a cube or a rectangular solid or a box or a case with a given shape but also eggs, shaped processed foods such as a hamburger steak and a croquette, foods such as vegetables with an irregular shape such as a potato and a tomato, machine parts such as a screw and a nut, a thin film of a paper or a film, and the like. Since in the sorting system 3000 described in this embodiment, the shape of the arm can be changed in consideration of the shape and the hardness of the object 3007, the objects 3007 given above as examples can be transferred from the receptacle 3005 to the receptacle 3006 regardless of the shape and the hardness.

For example, a memory device using the semiconductor device of one embodiment of the present invention can retain control data, a control program, or the like of the above-described electronic device for a long time. With the use of the semiconductor device according to one embodiment of the present invention, a highly reliable electronic device can be achieved.

An IC in which the above AI system is incorporated can be used for the arithmetic device or the like of the above-described electronic device, for example. Accordingly, the electronic device described in this embodiment can perform accurate operations depending on circumstances with low power consumption by utilizing the AI system.

This embodiment can be implemented in an appropriate combination with the configurations described in the other embodiments.

REFERENCE NUMERALS

100: memory device, 105: control circuit, 110: memory cell array, 112: memory string, 121: row decoder, 122: row driver, 123: sense amplifier, 124: source line driver, 125: input/output circuit, 300: circuit, 301: transistor, 302: transistor, 303: transistor, 304: sense amplifier, 311: substrate, 313: semiconductor region, 314a: low-resistance region, 314b: low-resistance region, 315: insulator, 316: conductor, 317: insulator, 318: insulator, 320: insulator, 322: insulator, 324: insulator, 326: insulator, 327: insulator, 328: conductor, 329: conductor, 330: conductor, 350: insulator, 352: insulator, 354: insulator, 356: conductor, 360: insulator, 362: insulator, 364: insulator, 366: conductor, 700: memory cell array, 700A: memory cell array, 701: conductor, 701a: conductor, 701A: conductive film, 701b: conductor, 701B: conductive film, 701c: conductor, 702: conductor, 702A: conductive film, 702b: insulator, 702B: conductive film, 703: insulator, 703a: insulator, 703A: insulating film, 703b: insulator, 703c: insulator, 704: oxide, 704a: oxide, 704A: oxide film, 704b: oxide, 704c: oxide, 705: conductor, 705B: conductor, 705S: conductor, 706: conductor, 707: conductor, 708: conductor, 709: conductor, 710: conductor, 711: insulator, 711A: insulating film, 712: conductor, 712A: conductive film, 713: insulator, 714: conductor, 715: conductor, 717: insulator, 718: film, 720: base, 721: insulator, 722: insulator, 722A: insulating film, 722B: insulating film, 723: mask, 723A: mask, 724: insulator, 725: mask, 726: insulator, 727: material, 729: mask, 731a: region, 731b: region, 732: region, 732a: region, 732b: region, 734: region, 750: memory device, 752: conductor, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 2000: robot, 2001: arithmetic device, 2002: sensor, 2003: light, 2004: lift, 2005: driver portion, 2006: communication means, 2007: speaker, 2008: microphone, 2009: display portion, 2010: light-emitting portion, 2011: moving mechanism, 3000: system, 3001: robot, 3002: arithmetic device, 3003: boom, 3004: arm, 3005: receptacle, 3006: receptacle, 3007: object, 3008: housing, 3009: sensor, 3010: communication means, 3011: communication means, 3021: plate, 3022: bar, 3023: plate, 3024: plate, 3025: spatula, 4010: arithmetic portion, 4011: arithmetic circuit, 4012: DOSRAM, 4013: NOSRAM, 4014: FPGA, 4020: control portion, 4021: CPU, 4022: GPU, 4023: PLL, 4025: PROM, 4026: memory controller, 4027: power supply circuit, 4028: PMU, 4030: input/output portion, 4031: external memory control circuit, 4032: audio codec, 4033: video codec, 4034: general-purpose input/output module, 4035: communication module, 4041: AI system, 4041A: AI system, 4041B: AI system, 4098: bus line, 4099: network, 4700: electronic component, 4702: printed circuit board, 4704: mounting board, 4710: semiconductor device, 4730: electronic component, 4731: interposer, 4732: package substrate, 4733: electrode, 4735: semiconductor device, 4800: semiconductor wafer, 4800a: chip, 4801: wafer, 4801a: wafer, 4802: circuit portion, 4803: spacing, 4803a: spacing

The invention claimed is:
1. A semiconductor device comprising a stack,
wherein the stack comprises
a first insulator,
a first conductor over the first insulator,
a second insulator over the first conductor,
an oxide positioned on an inner side of a first opening provided in the first insulator, the first conductor, and the second insulator,
a third insulator positioned on an outer side of the oxide in the first opening,
a second conductor positioned on an inner side of the oxide in the first opening, and
a fourth insulator positioned between the oxide and the second conductor in the first opening, and
wherein the third insulator comprises
a gate insulating layer positioned at a side surface of the first opening,
a tunnel insulating layer positioned on the outer side of the oxide, and
a charge accumulation layer positioned between the gate insulating layer and the tunnel insulating layer.
2. The semiconductor device according to claim 1,
wherein the stack comprises
a third conductor positioned above the first insulator,
a fifth insulator over the third conductor,
the oxide positioned on an inner side of a second opening provided in the third conductor and the fifth insulator,
the gate insulating layer positioned between a side surface of the second opening and the oxide,
the second conductor positioned on the inner side of the oxide in the second opening, and
the fourth insulator positioned between the oxide and the second conductor in the first opening, and
wherein the second opening is positioned in a region overlapping with the first opening.
3. The semiconductor device according to claim 1,
wherein the oxide comprises
a first layer,
a second layer provided in contact with an inner side of the first layer, and
a third layer provided in contact with an inner side of the second layer,
wherein an energy gap of the second layer is narrower than an energy gap of the first layer, and
wherein the energy gap of the second layer is narrower than an energy gap of the third layer.
4. The semiconductor device according to claim 3, wherein the oxide contains at least indium.
5. The semiconductor device according to claim 3,
wherein the oxide contains In, an element M, and Zn, and
wherein the element M is Al, Ga, Y, or Sn.
6. The semiconductor device according to claim 5,
wherein the element M is Ga, and
wherein an atomic ratio of In to Ga and Zn contained in the second layer is In:Ga:Zn=5:1:3 or a neighborhood thereof.
7. The semiconductor device according to claim 5,
wherein the element M is Ga, and
wherein an atomic ratio of In to Ga and Zn contained in the second layer is In:Ga:Zn=10:1:3 or a neighborhood thereof.
8. The semiconductor device according to claim 1, comprising:
a control circuit,
wherein the control circuit is positioned below the stack.
9. A manufacturing method of a semiconductor device, the manufacturing method comprising:
forming a first insulator;
forming a first conductor over the first insulator;
forming a second insulator over the first conductor;
processing the second insulator, the first conductor, and the first insulator to form a first stack including a first opening;
forming a third insulator in contact with the first insulator, the first conductor, and the second insulator in the first opening;
forming an oxide in contact with the third insulator;
forming a fourth insulator in contact with the oxide; and
forming a second conductor in contact with the fourth insulator.
10. The manufacturing method of a semiconductor device according to claim 9, the manufacturing method comprising:
forming a third conductor above the first insulator;
forming a fifth insulator over the third conductor;
processing the third conductor and the fifth insulator to form a second stack in which a second opening is positioned in a region overlapping with the first opening;
forming the third insulator in contact with the third conductor and the fifth insulator in the second opening;
forming the oxide in contact with the third insulator;
forming the fourth insulator in contact with the oxide; and
forming the second conductor in contact with the fourth insulator.

11. The manufacturing method of a semiconductor device according to claim 9,
wherein formation of the oxide comprises
forming a first layer in contact with the third insulator,
forming a second layer in contact with an inner side of the first layer, and
forming a third layer in contact with an inner side of the second layer,
wherein an energy gap of the second layer is narrower than an energy gap of the first layer, and
wherein the energy gap of the second layer is narrower than an energy gap of the third layer.

12. The manufacturing method of a semiconductor device according to claim 11,
wherein the oxide contains at least indium.

13. The manufacturing method of a semiconductor device according to claim 11,
wherein the oxide contains In, an element M (M is Al, Ga, Y, or Sn), and Zn.

14. The manufacturing method of a semiconductor device according to claim 13,
wherein the element M is Ga, and
wherein an atomic ratio of In to Ga and Zn contained in the second layer is In:Ga:Zn=5:1:3 or a neighborhood thereof.

15. The manufacturing method of a semiconductor device according to claim 13,
wherein the element M is Ga, and
wherein an atomic ratio of In to Ga and Zn contained in the second layer is In:Ga:Zn=10:1:3 or a neighborhood thereof.

16. An operation method of a semiconductor device, the semiconductor device comprising:
a first transistor including a back gate;
a second transistor including a back gate and a charge accumulation layer; and
a third transistor including a back gate,
wherein a channel formation region of each of the first to third transistors contains a metal oxide,
wherein one of a source and a drain of the first transistor is electrically connected to one of a source and a drain of the second transistor, and
wherein the other of the source and the drain of the second transistor is electrically connected to one of a source and a drain of the third transistor,
the operation method comprising a writing operation and a reading operation,
the writing operation comprising:
an operation of applying first potential to a back gate of each of the first to third transistors;
an operation of applying a high-level potential with which the first transistor is in an on state to a gate of the first transistor; and
an operation of applying a third potential to a gate of the second transistor and an operation of applying a fourth potential to the other of the source and the drain of the first transistor for injecting an electron into the charge accumulation layer,
the reading operation comprising:
an operation of applying the first potential to the back gate of each of the first to third transistors;
an operation of applying the high level potential at which the first transistor is in an on state to the gate of the first transistor;
an operation of applying a high level potential at which the third transistor is in an on state to a gate of the third transistor;
an operation of applying a fifth potential to the gate of the second transistor;
an operation of applying a sixth potential to the other of the source and the drain of the first transistor; and
an operation of applying a seventh potential to the other of the source and the drain of the third transistor,
wherein the first potential is a negative potential.

17. The operation method of a semiconductor device according to claim 16, the operation method comprising an erasing operation,
wherein the erasing operation comprises
an operation of applying the first potential to the back gate of each of the first to third transistors,
an operation of applying the high-level potential at which the third transistor is in an on state to the gate of the third transistor, and
an operation of applying an eighth potential with which an electron is drawn from the charge accumulation layer of the second transistor to the other of the source and the drain of the third transistor.

18. The operation method of a semiconductor device according to claim 16,
wherein the metal oxide contains at least In.

19. The operation method of a semiconductor device according to claim 16,
wherein the metal oxide contains In and Zn.

20. The operation method of a semiconductor device according to claim 19,
wherein the metal oxide contains In at a higher proportion than Zn.

21. The operation method of a semiconductor device according to claim 19,
wherein an atomic ratio of In to Zn contained in the metal oxide is In:Zn=2:1 or a neighborhood thereof.

22. The operation method of a semiconductor device according to claim 19,
wherein an atomic ratio of In to Zn contained in the metal oxide is In:Zn=5:1 or a neighborhood thereof.

23. The operation method of a semiconductor device according to claim 19,
wherein an atomic ratio of In to Zn contained in the metal oxide is In:Zn=10:1 or a neighborhood thereof.

24. The operation method of a semiconductor device according to claim 16,
wherein the metal oxide contains In, an element M (M is Al, Ga, Y, or Sn), and Zn.

25. The operation method of a semiconductor device according to claim 24,
wherein the element M is Ga, and
wherein an atomic ratio of In to Ga and Zn contained in the metal oxide is In:Ga:Zn=5:1:3 or a neighborhood thereof.

26. The operation method of a semiconductor device according to claim 24,
wherein the element M is Ga, and
wherein an atomic ratio of In to Ga and Zn contained in the metal oxide is In:Ga:Zn=10:1:3 or a neighborhood thereof.

* * * * *